(12) United States Patent
Lee et al.

(10) Patent No.: US 11,729,974 B2
(45) Date of Patent: Aug. 15, 2023

(54) SEMICONDUCTOR MEMORY DEVICES

(71) Applicant: SAMSUNG ELECTRONICS CO., LTD., Suwon-si (KR)

(72) Inventors: Kyunghwan Lee, Seoul (KR); Yongseok Kim, Suwon-si (KR); Hyuncheol Kim, Seoul (KR); Hyeoungwon Seo, Yongin-si (KR); Sungwon Yoo, Hwaseong-si (KR); Jaeho Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 244 days.

(21) Appl. No.: 17/182,479

(22) Filed: Feb. 23, 2021

(65) Prior Publication Data
US 2022/0045094 A1   Feb. 10, 2022

(30) Foreign Application Priority Data

Aug. 4, 2020   (KR) .................. 10-2020-0097541

(51) Int. Cl.
*H10B 43/27*   (2023.01)
*G11C 7/18*   (2006.01)
(Continued)

(52) U.S. Cl.
CPC .............. *H10B 43/27* (2023.02); *G11C 7/18* (2013.01); *G11C 8/14* (2013.01); *H10B 41/10* (2023.02);
(Continued)

(58) Field of Classification Search
CPC ........ H10B 43/27; H10B 41/10; H10B 41/27; H10B 41/35; H10B 43/10; H10B 43/35; G11C 7/18; G11C 8/14
See application file for complete search history.

(56) References Cited

U.S. PATENT DOCUMENTS 10,008,265 B2   6/2018   Hsu
10,535,659 B2   1/2020   Kim et al.
(Continued)

FOREIGN PATENT DOCUMENTS

TW   202006926 A   2/2020

OTHER PUBLICATIONS

Communication dated Nov. 3, 2022 issued by the Taiwan Patent Office in counterpart Taiwanese Patent Application No. 110122855.

*Primary Examiner* — Thao X Le
*Assistant Examiner* — Daniel Hyun Suh
(74) *Attorney, Agent, or Firm* — Sughrue Mion, PLLC

(57) ABSTRACT

A semiconductor memory device includes a word line extending in a vertical direction on a substrate, a channel layer surrounding the word line to configure a cell transistor and having a horizontal ring shape with a predetermined horizontal width, a bit line disposed at one end of the channel layer in a first horizontal direction and extending in a second horizontal direction perpendicular to the first horizontal direction, and a cell capacitor disposed at other end of the channel layer in the first horizontal direction, the cell capacitor including an upper electrode layer extending in the vertical direction, a lower electrode layer surrounding the upper electrode layer, and a capacitor dielectric layer disposed between the upper electrode layer and the lower electrode layer.

20 Claims, 78 Drawing Sheets

(51) Int. Cl.
  *G11C 8/14* (2006.01)
  *H10B 41/10* (2023.01)
  *H10B 41/27* (2023.01)
  *H10B 41/35* (2023.01)
  *H10B 43/10* (2023.01)
  *H10B 43/35* (2023.01)

(52) U.S. Cl.
  CPC ............ *H10B 41/27* (2023.02); *H10B 41/35* (2023.02); *H10B 43/10* (2023.02); *H10B 43/35* (2023.02)

(56) References Cited

U.S. PATENT DOCUMENTS

| | | |
|---|---|---|
| 10,580,778 B2 | 3/2020 | Chuang et al. |
| 2008/0079055 A1* | 4/2008 | Park .................. G11C 16/3418 257/314 |
| 2015/0031180 A1 | 1/2015 | Cho et al. |
| 2016/0197082 A1 | 7/2016 | Park et al. |
| 2018/0323199 A1 | 11/2018 | Roberts et al. |
| 2018/0323200 A1 | 11/2018 | Tang et al. |
| 2019/0006376 A1 | 1/2019 | Ramaswamy |
| 2019/0074277 A1 | 3/2019 | Ramaswamy |
| 2019/0164985 A1 | 5/2019 | Lee et al. |
| 2019/0378836 A1 | 12/2019 | Wang et al. |
| 2020/0027734 A1 | 1/2020 | Kim et al. |
| 2020/0083225 A1 | 3/2020 | Ma et al. |

* cited by examiner

SEMICONDUCTOR MEMORY DEVICES

CROSS-REFERENCE TO THE RELATED APPLICATION

This application is based on and claims priority under 35 U.S.C. § 119 to Korean Patent Application No. 10-2020-0097541, filed on Aug. 4, 2020, in the Korean Intellectual Property Office, the disclosure of which is incorporated by reference herein in its entirety.

BACKGROUND

Embodiments of the disclosure relate to a semiconductor memory device, and particularly, to a three-dimensional (3D) semiconductor memory device.

To meet the need for miniaturized, multifunctional, and high-performance electronic products, high-capacity semiconductor memory devices are needed, and in order to provide high-capacity semiconductor memory devices, an increased degree of integration is needed. Because the degree of integration of two-dimensional (2D) semiconductor memory devices of the related art is mainly determined based on an area occupied by a unit memory cell, the degree of integration of 2D semiconductor memory devices increases, but the degree of integration is still limited. Therefore, 3D semiconductor memory devices have been proposed where a memory capacity increases by stacking a plurality of memory cells on a substrate in a vertical direction.

SUMMARY

One or more embodiments of the disclosure provide a three-dimensional (3D) semiconductor memory device having an enhanced degree of integration.

In accordance with an exemplary embodiment, there is provided a semiconductor memory device including: a word line extending in a vertical direction on a substrate; a channel layer surrounding the word line to configure a cell transistor and having a horizontal ring shape with a predetermined horizontal width; a bit line disposed at one end of the channel layer in a first horizontal direction and extending in a second horizontal direction perpendicular to the first horizontal direction; and a cell capacitor disposed at other end of the channel layer in the first horizontal direction, the cell capacitor including an upper electrode layer extending in the vertical direction, a lower electrode layer surrounding the upper electrode layer, and a capacitor dielectric layer disposed between the upper electrode layer and the lower electrode layer.

In accordance with an exemplary embodiment, there is provided a semiconductor memory device including: a plurality of word lines disposed apart from one another in a first horizontal direction on a substrate and extending in a vertical direction, each of the plurality of word lines including a horizontal cross-sectional surface having a circular shape or an oval shape; a plurality of channel layers disposed apart from one another in the vertical direction to respectively surround the plurality of word lines and having a donut shape, the plurality of channel layers configuring a plurality of cell transistors; a plurality of bit lines respectively disposed at one end of each of the plurality of channel layers in a second horizontal direction perpendicular to the first horizontal direction to form the plurality of cell transistors, and disposed apart from one another in the vertical direction and extending in the first horizontal direction; and a plurality of cell capacitors respectively disposed at the other ends of the plurality of channel layers in the second horizontal direction, each of the plurality of cell capacitors including an upper electrode layer extending in the vertical direction, a lower electrode layer surrounding the upper electrode layer, and a capacitor dielectric layer disposed between the upper electrode layer and the lower electrode layer.

In accordance with an exemplary embodiment, there is provided a semiconductor memory device including: a plurality of word lines disposed apart from one another in a first horizontal direction on a substrate and extending in a vertical direction, each of the plurality of word lines including a horizontal cross-sectional surface having a circular shape or an oval shape; a plurality of channel layers disposed apart from one another in the vertical direction to respectively surround the plurality of word lines and having a horizontal ring shape having a predetermined horizontal width, the plurality of channel layers configuring a plurality of cell transistors and including an oxide semiconductor material; a plurality of bit lines disposed apart from one another in the vertical direction and extending in the first horizontal direction, and respectively contacting one end of each of the plurality of channel layers in a second horizontal direction perpendicular to the first horizontal direction to configure the plurality of cell transistors; and a plurality of cell capacitors, each including an upper electrode layer extending in the vertical direction, a lower electrode layer surrounding the upper electrode layer and contacting the other ends of the plurality of channel layers in the second horizontal direction, and a capacitor dielectric layer disposed between the upper electrode layer and the lower electrode layer, the lower electrode layer including a U-shaped vertical cross-sectional surface facing the upper electrode layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

FIGS. 1A to 20C are diagrams illustrating in a method of manufacturing a semiconductor memory device according to embodiments. In detail, FIGS. 1A, 2A, 3A, 4A, 5A, 6A, 7A, 8A, 9A, 10A, 11A, 12A, 13A, 14A, 15A, 16A, 17A, 18A, 19A, and 20A are diagrams illustrating cross-sectional surfaces taken along lines A-A' of FIGS. 1B and 1C, FIGS. 2B and 2C, FIGS. 3B and 3C, FIGS. 4B and 4C, FIGS. 5B and 5C, FIGS. 6B and 6C, FIGS. 7B and 7C, FIGS. 8B and 8C, FIGS. 9B and 9C, FIGS. 10B and 10C, FIGS. 11B and 11C, FIGS. 12B and 12C, FIGS. 13B and 13C, FIGS. 14B and 14C, FIGS. 15B and 15C, FIGS. 16B and 16C, FIGS. 17B and 17C, FIGS. 18B and 18C, FIGS. 19B and 19C, and FIGS. 20B and 20C, respectively. FIGS. 1B and 1C, FIGS. 2B and 2C, FIGS. 3B and 3C, FIGS. 4B and 4C, FIGS. 5B and 5C, FIGS. 6B and 6C, FIGS. 7B and 7C, FIGS. 8B and 8C, FIGS. 9B and 9C, FIGS. 10B and 10C, FIGS. 11B and 11C, FIGS. 12B and 12C, FIGS. 13B and 13C, FIGS. 14B and 14C, FIGS. 15B and 15C, FIGS. 16B and 16C, FIGS. 17B and 17C, FIGS. 18B and 18C, FIGS. 19B and 19C, and FIGS. 20B and 20C are diagrams illustrating cross-sectional surfaces taken along lines B-B' and lines C-C' of FIGS. 1A, 2A, 3A, 4A, 5A, 6A, 7A, 8A, 9A, 10A, 11A, 12A, 13A, 14A, 15A, 16A, 17A, 18A, 19A, and 20A, respectively.

Herein, the drawings illustrating a cross-sectional surface may not necessarily illustrate a shape behind the illustrated cross-sectional surface, that is, an unseen shape behind the illustrated cross-sectional surface may not be the same as the illustrated cross-sectional surface, and a portion needed for description is illustrated by a dotted line.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

For the sake of brevity, conventional elements to semiconductor memory devices may or may not be described in detail herein. However, even if a certain element is described or illustrated in a semiconductor device in this disclosure, the element may not be included in a claimed semiconductor memory device unless the element is recited as being included in the claimed semiconductor device.

Figure 1A:
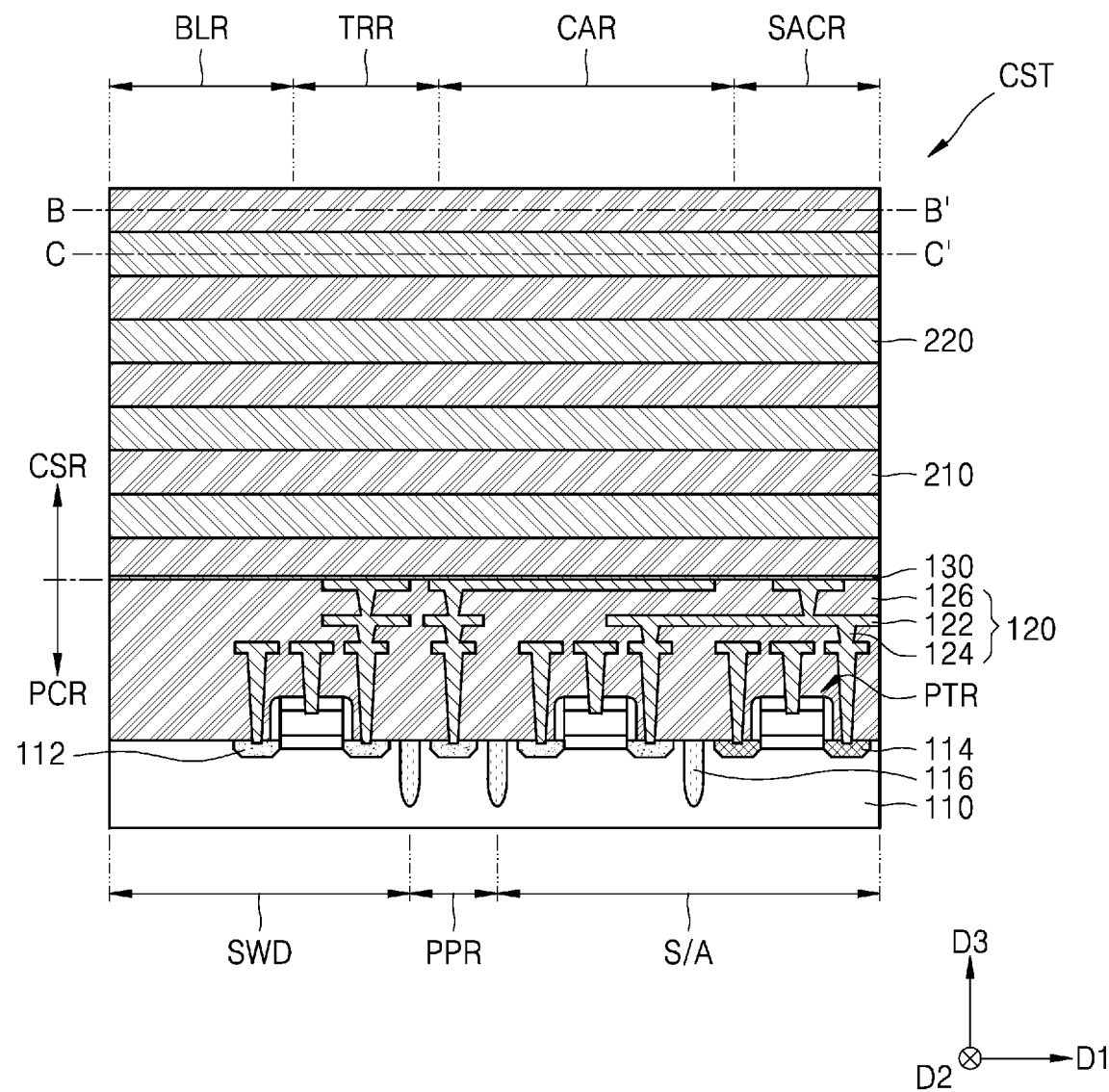
FIGS. 1A to 20C are diagrams illustrating a method of manufacturing a semiconductor memory device, according to embodiments.
Figure 1B:
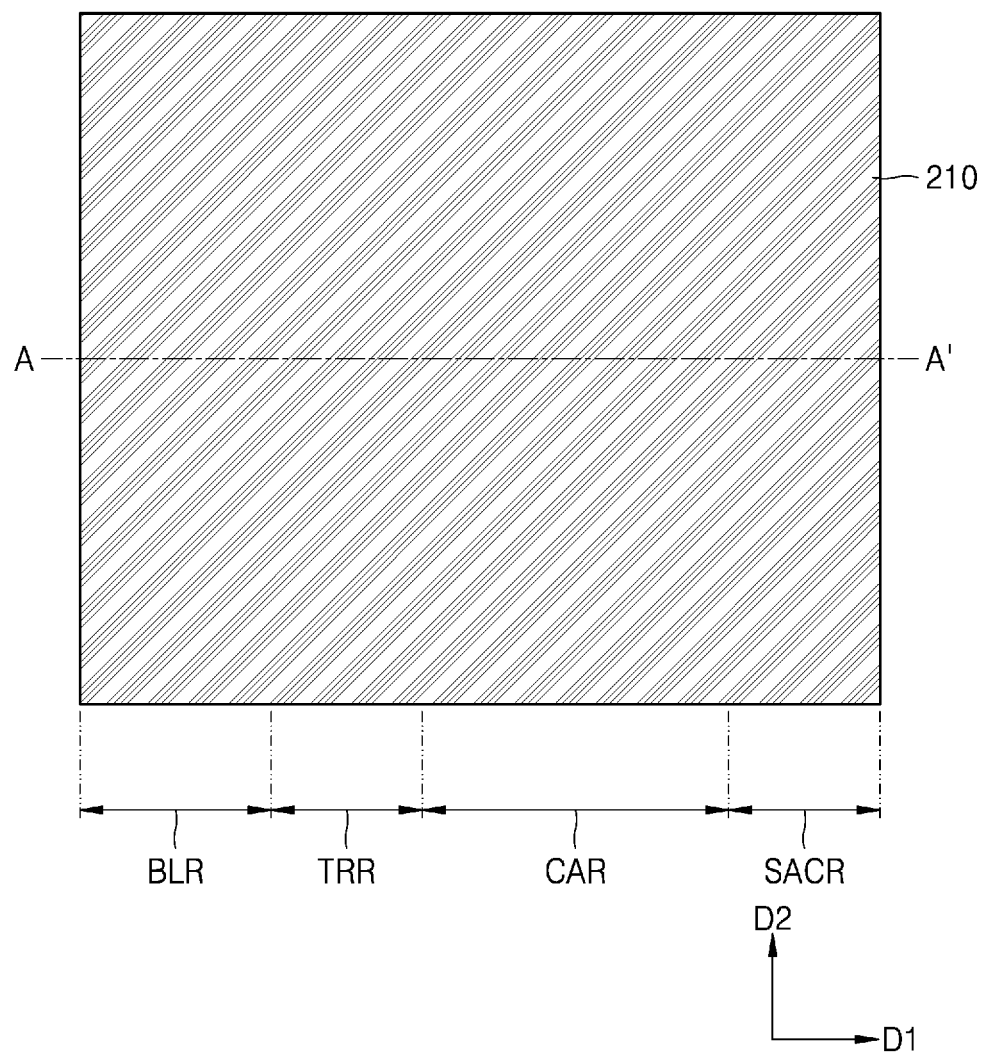
Figure 1C:
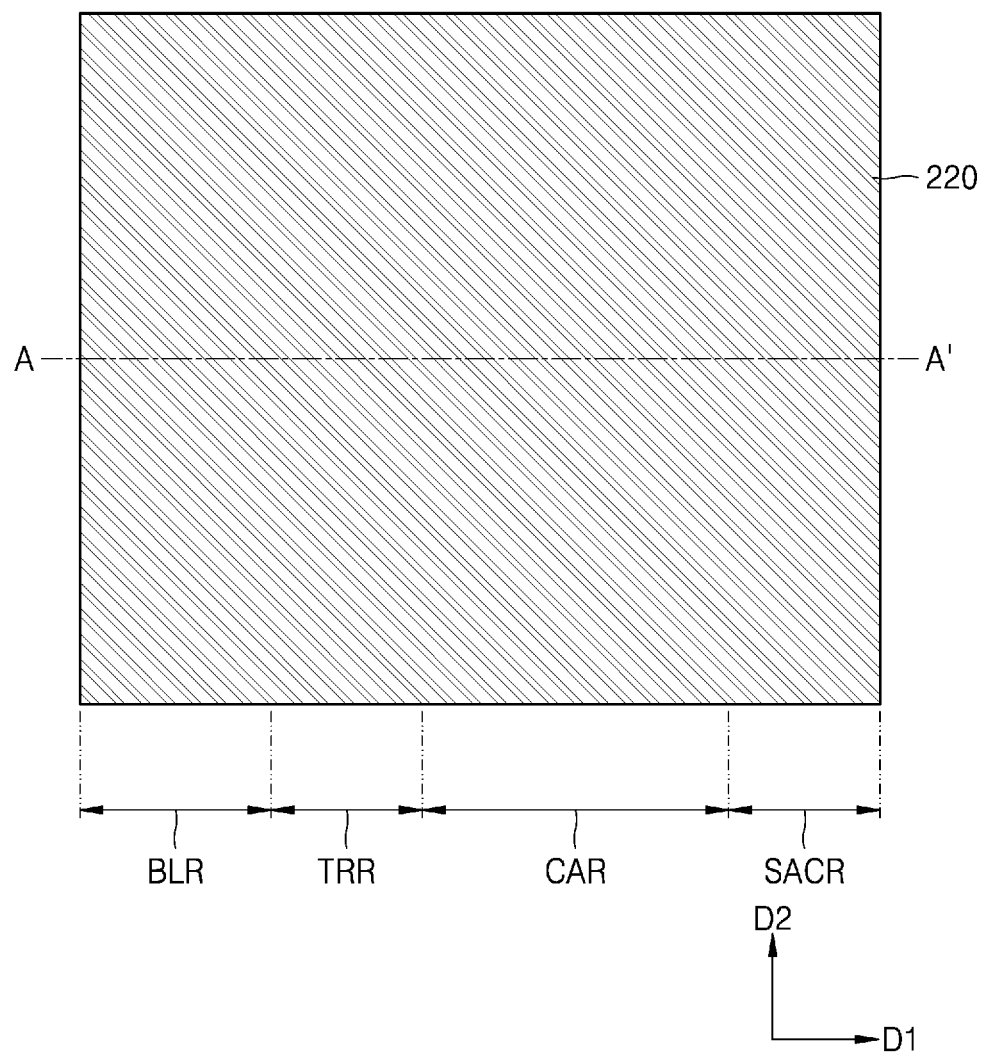

Referring to FIGS. 1A to 1C, a cell stack structure (CST) where a plurality of cell insulation layers 210 and a plurality of cell sacrificial layers 220 are alternately stacked one by one may be formed on a substrate 110.

For example, the substrate 110 may include silicon (Si), germanium (Ge), or silicon germanium (SiGe). Alternatively, for example, the substrate 110 may include a silicon-on-insulator (SOI) substrate or a germanium-on-insulator (GeOI) substrate.

The plurality of cell insulation layers 210 and the plurality of cell sacrificial layers 220 may be formed by a chemical vapor deposition (CVD) process, a plasma enhanced CVD (PECVD) process, or an atomic layer deposition (ALD) process. In some embodiments, the plurality of cell insulation layers 210 may include silicon oxide (e.g., SiO or $SiO_2$), and the plurality of cell sacrificial layers 220 may include silicon nitride (e.g., $Si_3N_4$). For example, each of the plurality of cell insulation layers 210 and the plurality of cell sacrificial layers 220 may have a thickness of tens of nanometers (nm).

In some embodiments, before forming the cell stack structure CST, a plurality of peripheral circuit transistors (PTR) and a circuit wiring structure 120 may be formed on the substrate 110. Some of the plurality of peripheral circuit transistors PTR may configure a sub word line driver, and some other peripheral circuit transistors PTR may configure an amplifier. In FIG. 1A, each of the plurality of peripheral circuit transistors PTR is illustrated as a planar type metal-oxide-semiconductor field effect transistor (MOSFET), but this is only an example, and the one or more embodiments are not limited thereto. For example, at least some of the plurality of peripheral circuit transistors PTR may be non-planar type transistors, such as a FinFET.

A first impurity region 112, a second impurity region 114, and an isolation structure 116 may be formed in the substrate 110. The first impurity region 112 and the second impurity region 114 may be formed by implanting impurities of a first conductive type and impurities of a second conductive type into respective portions of the substrate 110, where the respective portions may be adjacent to a surface of the substrate 110. For example, the first conductive type may be an n type, and the second conductive type may be a p type. The isolation structure 116 may include, for example, a material including at least one of silicon oxide, silicon nitride, and silicon oxynitride (e.g., $SiO_xN_y$, where x and y refer to a number greater than or equal to 1).

The circuit wiring structure 120 may include a peripheral circuit wiring 122, a peripheral circuit via 124, and an interlayer insulation layer 126 surrounding the peripheral circuit wiring 122 and the peripheral circuit via 124. A portion of the peripheral circuit via 124 may electrically connect peripheral circuit wirings 122 disposed at different vertical levels, and the other portion of the peripheral circuit via 124 may electrically connect the peripheral circuit wiring 122 to the first impurity region 112 or the peripheral circuit wiring 122 to the second impurity region 114. In some embodiments, the peripheral circuit wiring 122 and the peripheral circuit via 124 may include doped polysilicon metal, conductive metal nitride, conductive metal silicide, conductive metal oxide, or a combination thereof. In some embodiments, the interlayer insulation layer 126 may include silicon oxide.

In a case where the plurality of peripheral circuit transistors PTR and the circuit wiring structure 120 are formed on the substrate 110, an etch stop layer 130 may be formed on the circuit wiring structure 120. In this case, with respect to the etch stop layer 130, a portion close to the substrate 110 may be referred to as a peripheral circuit region (PCR), and a portion far away from the substrate 110 may be referred to as a cell stack region CSR. For example, a portion below the etch stop layer 130 may be referred to as the PCR and a portion above the etch stop layer 130 may be referred to as the CSR. The etch stop layer 130 may include silicon nitride or silicon oxynitride.

The peripheral circuit region PCR may include a sub word line driver region (SWD) with a sub word line driver provided therein, a ground region (PPR) connected to a ground wiring, and a sense amplifier region (S/A) with a sense amplifier provided therein.

The cell stack region CSR may include a bit line region (BLR) with a bit line provided therein, a transistor region (TRR) with a cell transistor provided therein, and a capacitor region (CAR) with a cell capacitor provided therein. In some embodiments, the cell stack region CSR may further include a contact region (SACR) where a sense amplifier contact is formed.

Figure 2A:
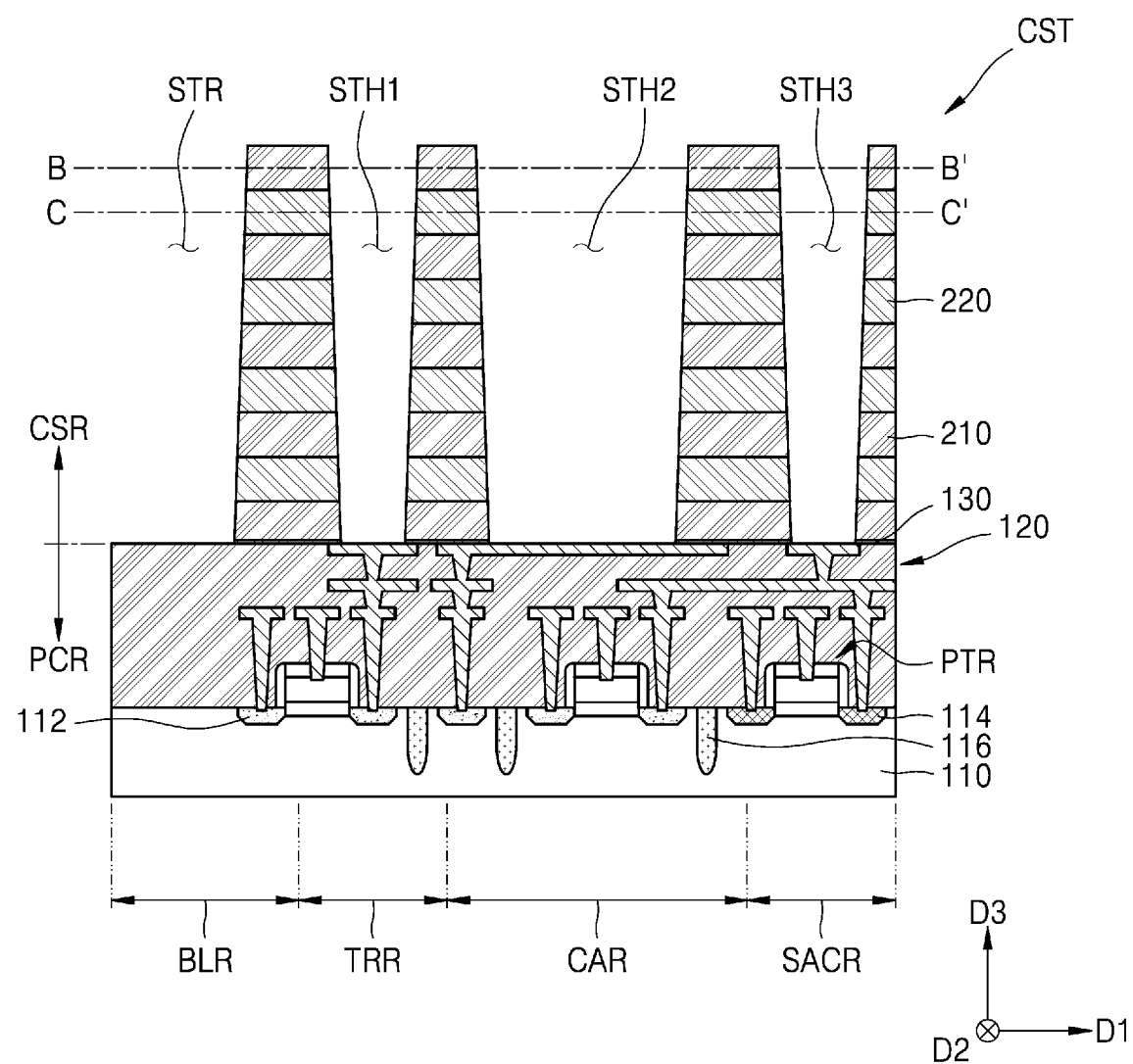
Figure 2B:
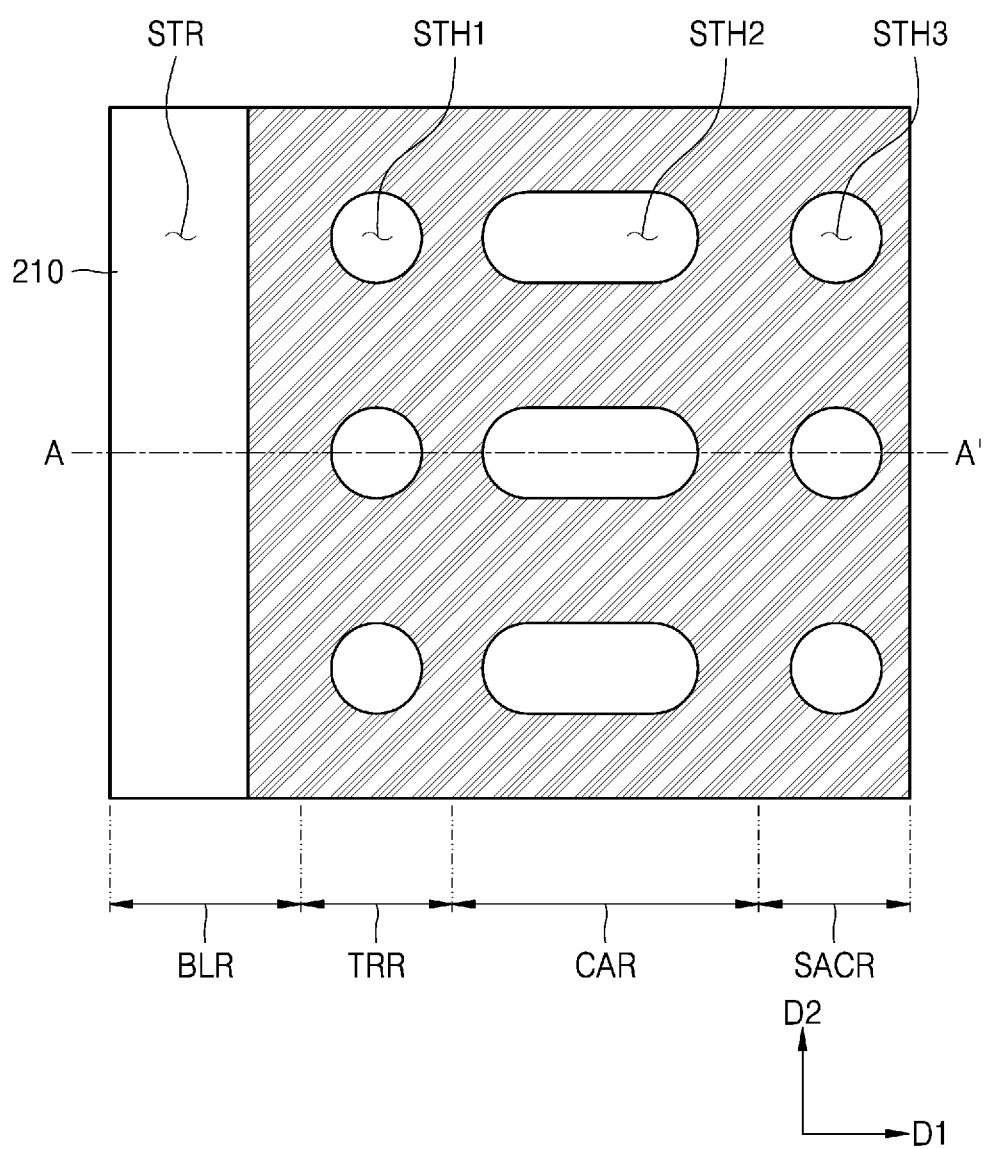
Figure 2C:
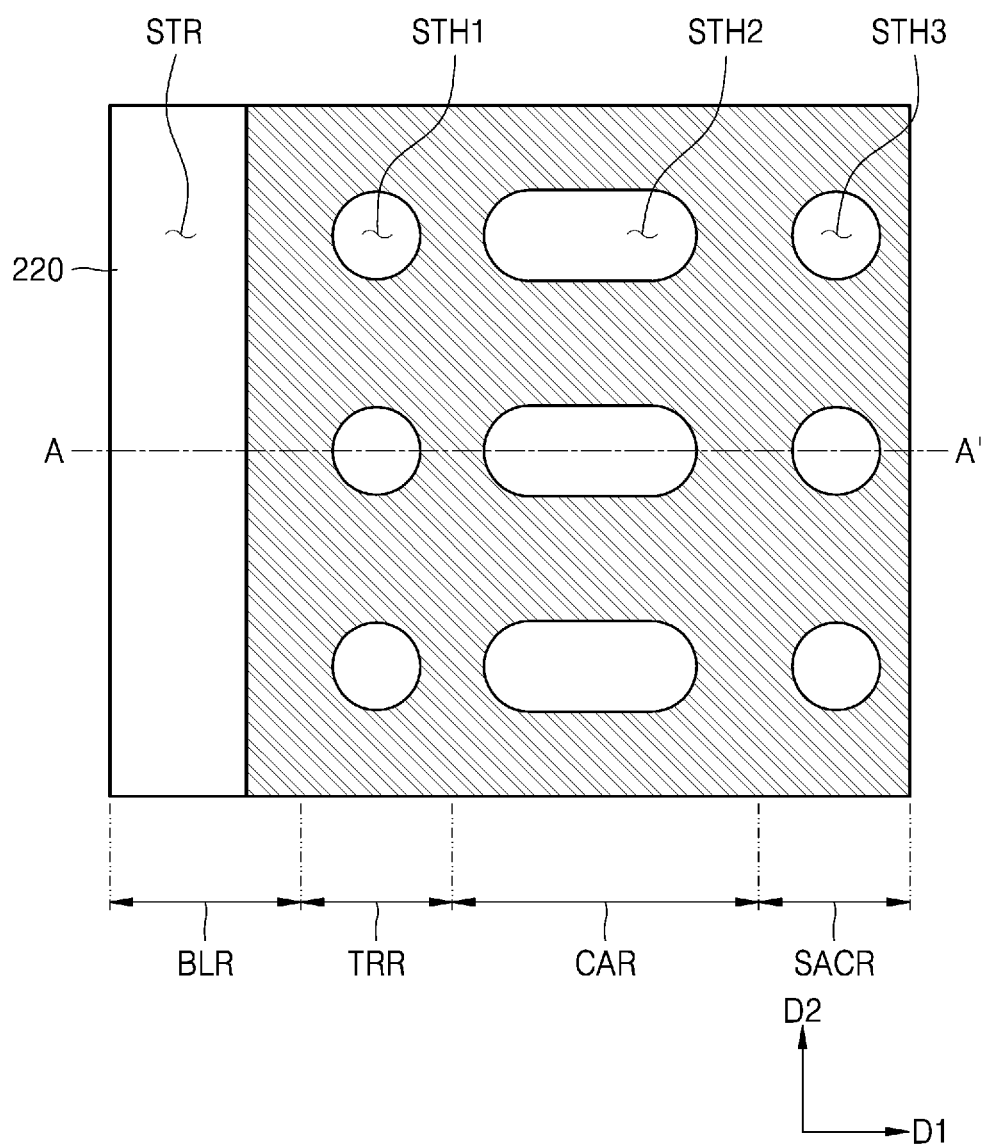

Referring to FIGS. 2A to 2C, by removing a portion of the cell stack structure CST, at least one stack recess STR passing through the cell stack structure CST may be formed in the bit line region BLR, one or more first stack holes STH1 passing through the cell stack structure CST may be formed in the transistor region TRR, and one or more second stack holes STH2 passing through the cell stack structure CST may be formed in the capacitor region CAR. In some embodiments, one or more third stack holes STH3 passing through the cell stack structure CST may be formed in the contact region SACR.

In some embodiments, each of the stack recess STR, the first stack hole STH1, the second stack hole STH2, and the third stack hole STH3 may have a tapered shape where a horizontal width thereof narrows toward the substrate 110. Therefore, each of portions of the cell stack structure CST, where the plurality of cell insulation layers 210 and the plurality of cell sacrificial layers 220 remaining are alternately stacked one by one, may have a tapered shape where a horizontal width thereof narrows in a direction away from the substrate 110.

In some embodiments, the stack recess STR, the first stack hole STH1, the second stack hole STH2, and the third stack hole STH3 may be formed by the same etching process. In some other embodiments, the stack recess STR may be formed by an etching process which differs from an etching process of forming the first stack hole STH1, the second stack hole STH2, and the third stack hole STH3.

The stack recess STR, the first stack hole STH1, and the second stack hole STH2 may be sequentially arranged in a first horizontal direction D1 on the substrate 110. In FIGS. 2A and 2B, the stack recess STR, the first stack hole STH1, the second stack hole STH2, and the third stack hole STH3 are sequentially arranged in the first horizontal direction D1, but a position at which the third stack hole STH3 is disposed is not limited thereto.

The plurality of first stack holes STH1, the plurality of second stack holes STH2, and the plurality of third stack holes STH3 may be disposed apart from one another in a second horizontal direction D2 to configure a column. In some embodiments, the first horizontal direction D1 may be perpendicular to the second horizontal direction D2.

The stack recess STR may have a shape which extends in the second horizontal direction D2. A horizontal cross-sectional surface of each of the first stack holes STH1 may have a circular shape, an oval shape substantially similar to a circular shape, or an oval shape. A horizontal cross-sectional surface of each of the second stack holes STH2 may have an oval shape having a major axis extending in the first horizontal direction D1, or a corner-rounded rectangular shape having a major axis extending in the first horizontal direction D1. A horizontal cross-sectional surface of each of the third stack holes STH3 may have a circular shape, an oval shape substantially similar to a circular shape, or an oval shape. However, the one or more embodiments of the disclosure are not limited thereto.

The stack recess STR, the first stack holes STH1, the second stack holes STH2, and the third stack holes STH3 may pass through the cell stack structure CST and the etch stop layer 130, and thus, the circuit wiring structure 120 may be exposed at a bottom surface of the CST. The interlayer insulation layer 126 may be exposed at a bottom surface of the stack recess STR. The peripheral circuit wiring 122 may be exposed at a bottom surface of each of the first stack holes STH1, the second stack holes STH2, and the third stack holes STH3. For example, the peripheral circuit wiring 122 exposed at the bottom surface of each of the first stack holes STH1 may be electrically connected to a sub word line driver provided in the sub word line driver region SWD. The peripheral circuit wiring 122 exposed at the bottom surface of each of the second stack holes STH2 may be a ground wiring. The peripheral circuit wiring 122 exposed at the bottom surface of each of the third stack holes STH3 may be electrically connected to the sense amplifier.

Figure 3A:
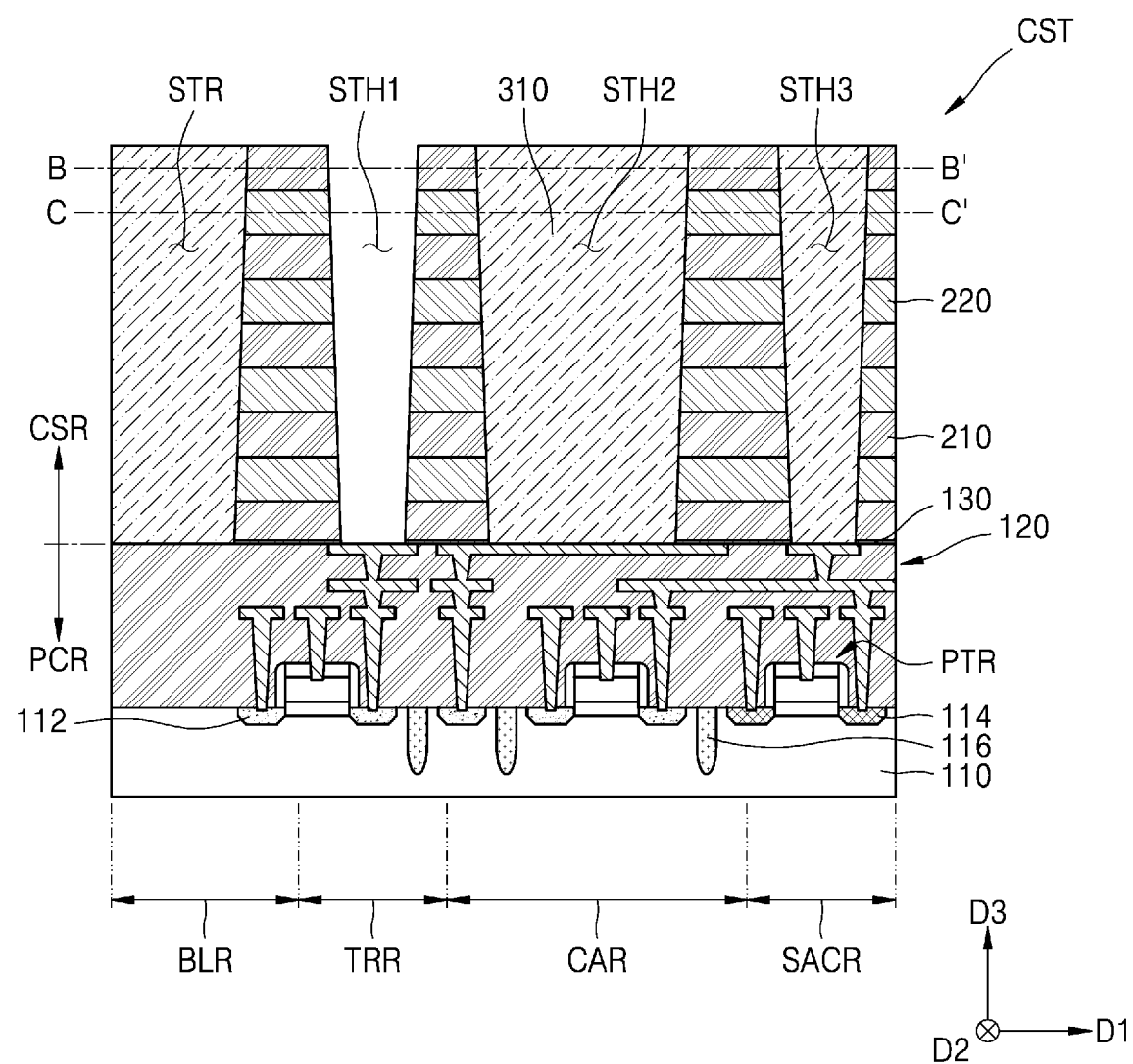
Figure 3B:
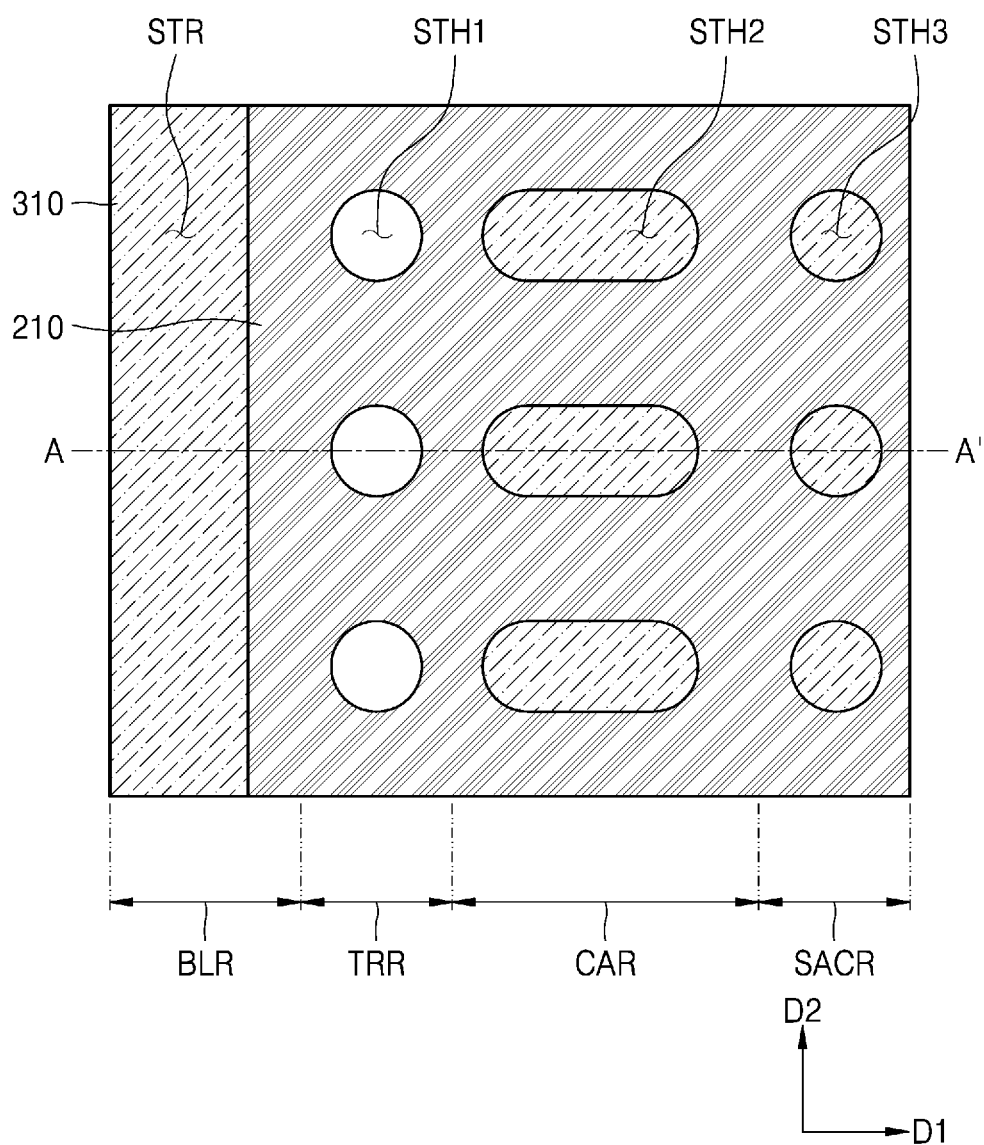
Figure 3C:
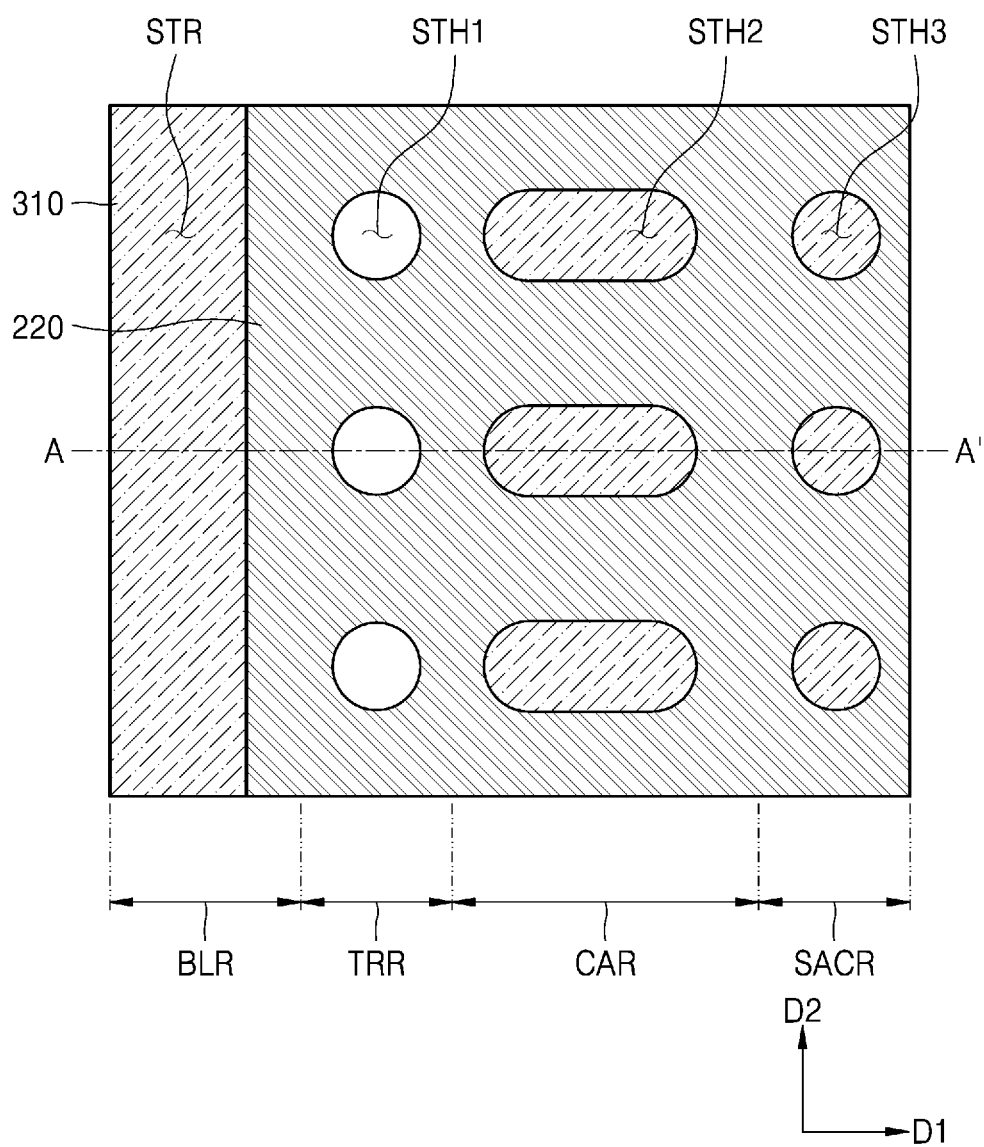

Referring to FIGS. 3A to 3C, a first sacrificial layer 310 may be formed when one of the stack recess STR and the stack holes are filled with a material that can be selectively etched with respect to the cell insulation layer 210 and the cell sacrificial layer 220. For example, referring to FIG. 3A, the first sacrificial layer 310 may be formed at the stack recess STR, the second stack holes STH2, and the third stack holes STH3, but not at the first stack holes STH1. The first sacrificial layer 310 may include a material containing polysilicon or carbon.

Figure 4A:
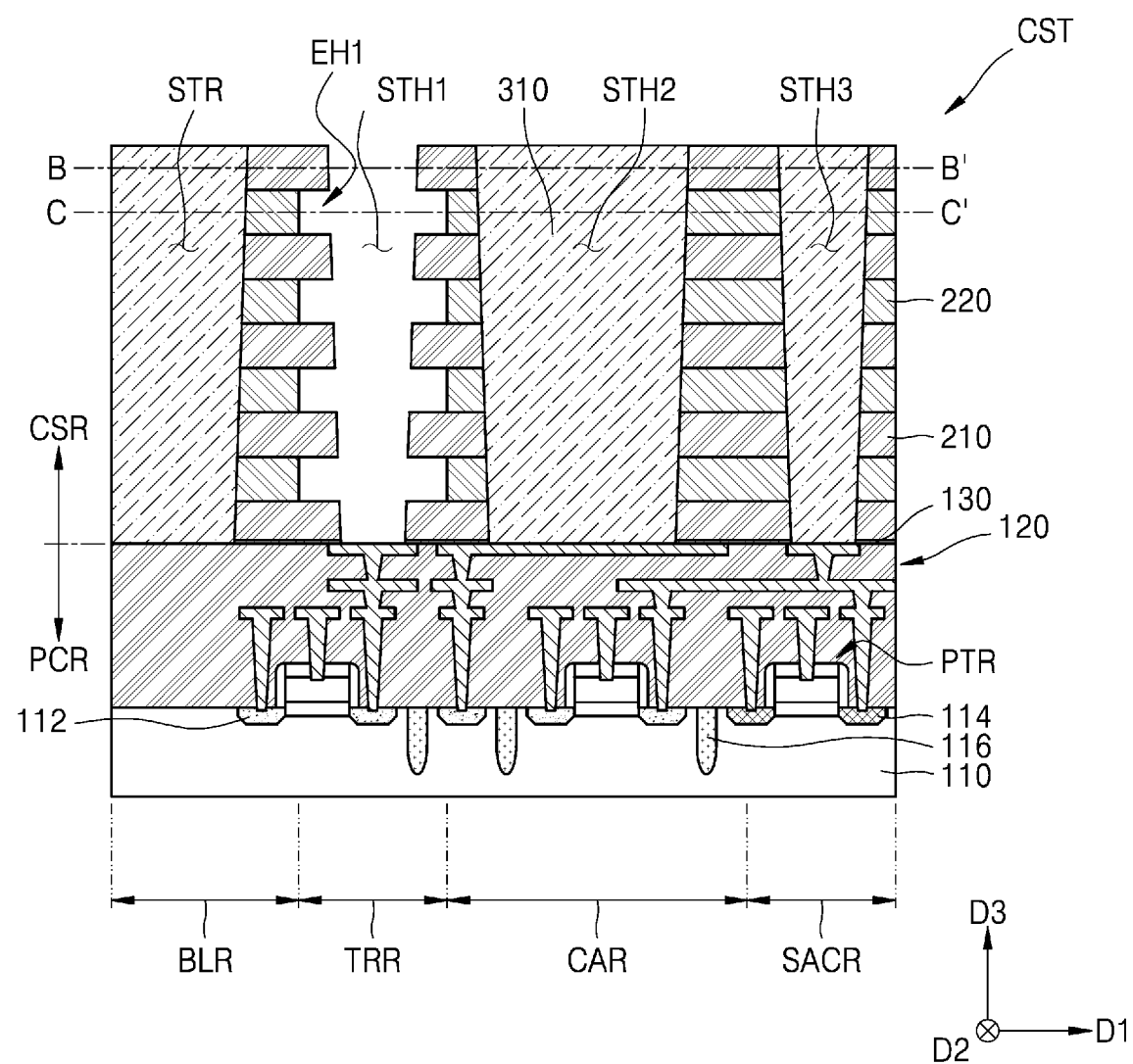
Figure 4B:
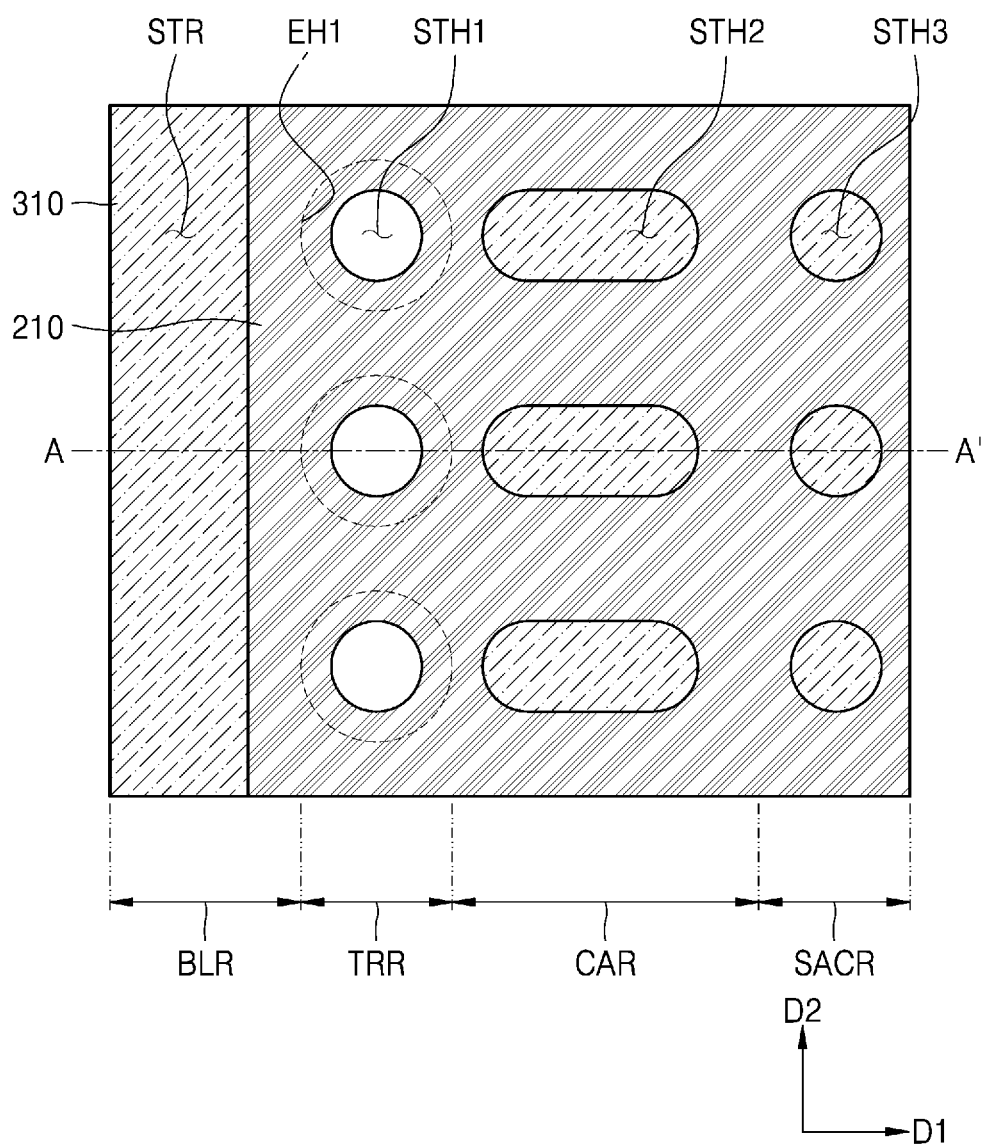
Figure 4C:
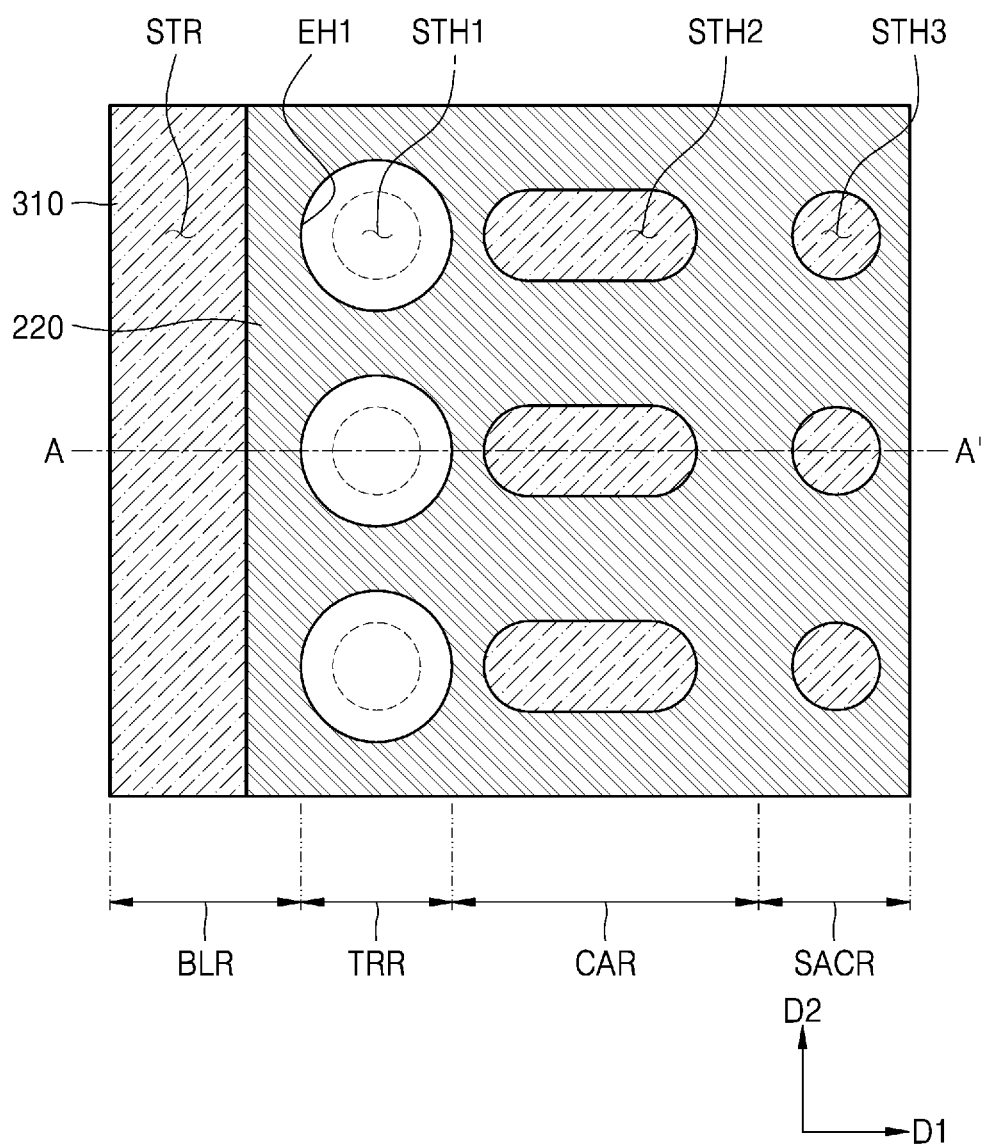

Referring to FIGS. 4A to 4C, a first extension space EH1 in the first stack hole STH1 may be formed by removing a portion of the cell sacrificial layer 220 that is exposed to the first stack hole STH1. Specifically, the first extension layer EH1 may be formed by removing the portion of the cell sacrificial layer 220, which is adjacent to the first stack hole STH1 so that a portion of the first sacrificial layer 310, filled into each of the stack recess STR and the first stack hole STH1, is not exposed. In addition, the first extension layer EH1 may be formed by removing another portion of the cell sacrificial layer 220, which is between the first stack hole STH1 and the second stack hole STH2.

The first extension space EH1 may be formed by removing a portion of the cell sacrificial layer 220 that is exposed through first stack hole STH1 and thus, even in a case where the first extension space EH1 is disposed at a different vertical level with respect to the substrate 110, a width of the first extension space EH1 in a horizontal direction from the first stack hole STH1 may approximately have a constant value.

In some embodiments, the first extension space EH1 may have a width of tens of nm in a horizontal direction from the first stack hole STH1. A height of the first extension space EH1 may be a height of the cell sacrificial layer 220. In some embodiments, the first extension space EH1 may have a height of tens of nm in a vertical direction D3.

Figure 5A:
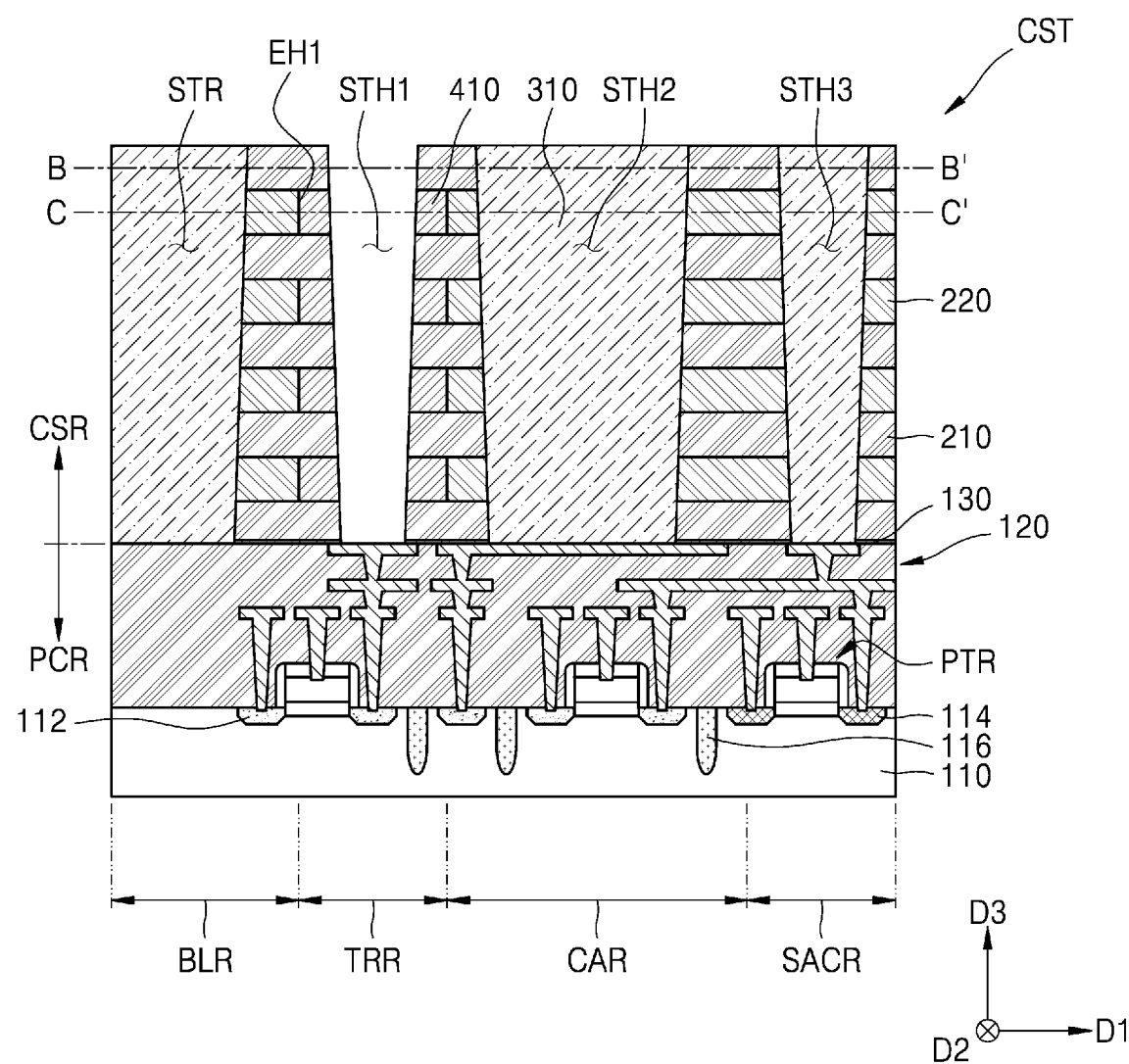
Figure 5B:
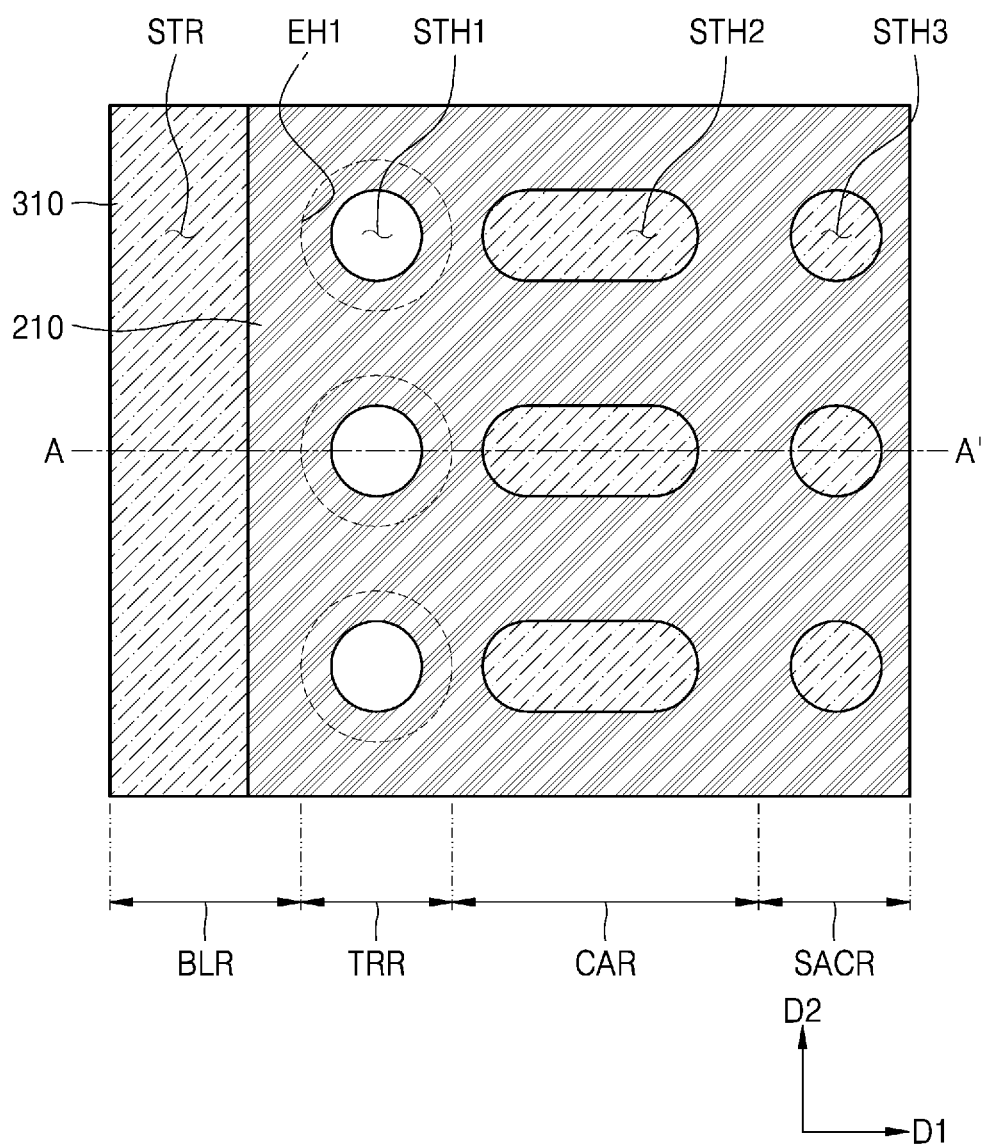
Figure 5C:
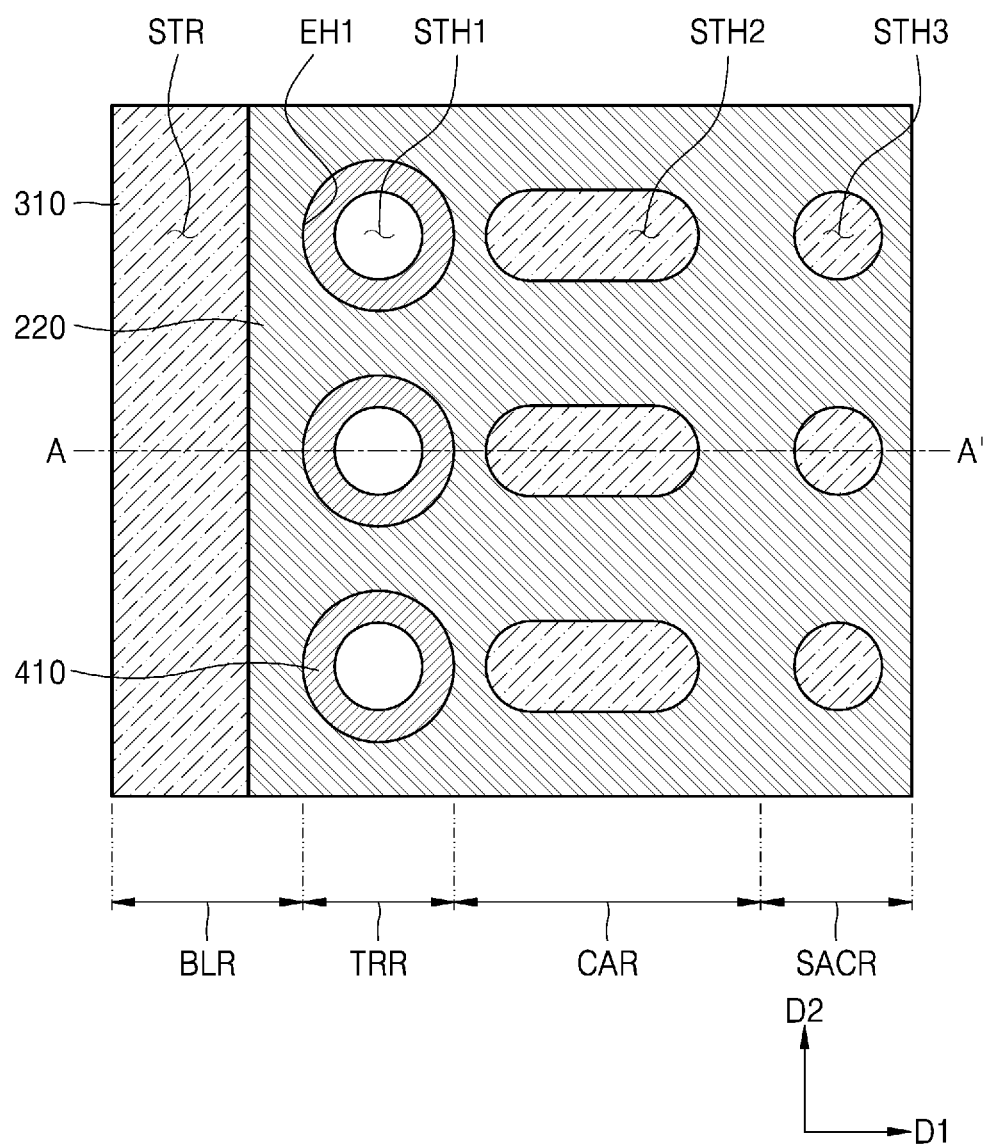

Referring to FIGS. 5A to 5C, a channel layer 410 may be formed by filling an undoped semiconductor material or a doped semiconductor material into the first extension space EH1. The channel layer 410 may include, for example, a Group IV semiconductor material such as Si or Ge or a Group III-V compound semiconductor material such as gallium arsenic (GaAs), indium arsenic (InAs), or indium phosphorus (InP). Alternatively, the channel layer 410 may include, for example, an epitaxial semiconductor material formed by a selective epitaxial growth (EG) process. In some embodiments, the channel layer 410 may include polysilicon. In some other embodiments, the channel layer 410 may include a semiconductor two-dimensional (2D) material, and for example, the semiconductor 2D material may include $MoS_2$, $MoSe_2$, $ReS_2$, $HfSe_2$, InSe, GeSe, $WSe_2$, graphene, carbon nano tube, or a combination thereof. All of the first extension space EH1 may be filled with a corresponding material through the first stack hole STH1, a preliminary channel material may be formed to fill at least a portion of the first stack hole STH1, and a portion filled into the first stack hole STH1 may be removed, thereby forming the channel layer 410.

The channel layer 410 may be formed to fill the first extension space EH1, and thus, even in a case where the channel layer 410 is disposed at a different vertical level with respect to the substrate 110, a width of the channel layer 410 in a horizontal direction from the first stack hole STH1 may approximately have a constant value. That is, even in a case where the first stack hole STH1 has a tapered shape where a horizontal width narrows toward the substrate 110, the width of the channel layer 410 in the horizontal direction from the first stack hole STH1 may approximately have a constant value without being affected by a vertical level with respect to the substrate 110. For example, the channel layer 410 may have a width of tens of nm.

The channel layer 410 may have a horizontal closed-ring shape which has a certain horizontal width and completely surrounds the first stack hole STH1. For example, the channel layer 410 may have a thickness of tens of nm. That is, the channel layer 410 may have a donut shape where a central hole thereof is a portion of the first stack hole STH1 or the first stack hole STH1 itself.

Figure 6A:
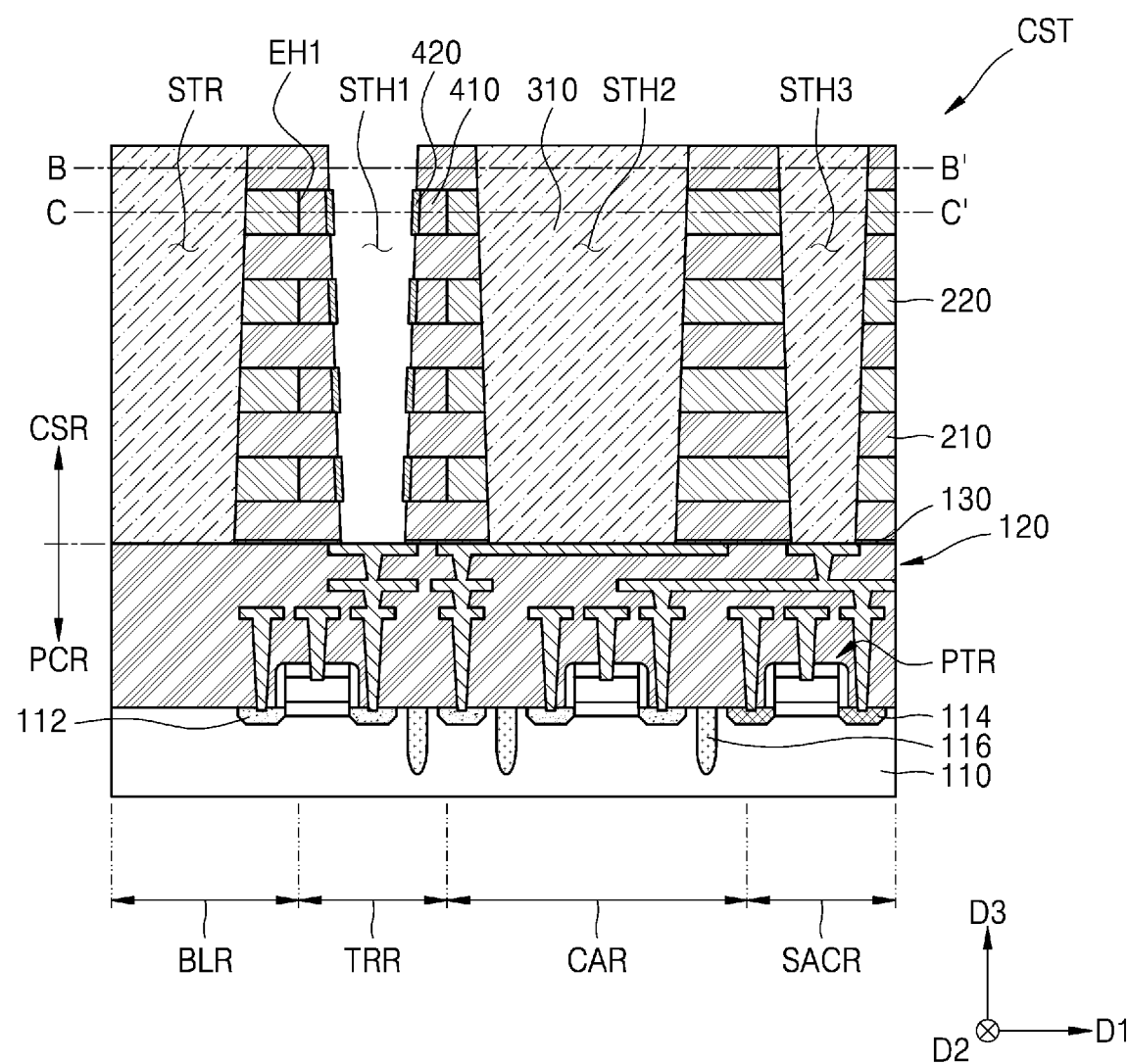
Figure 6B:
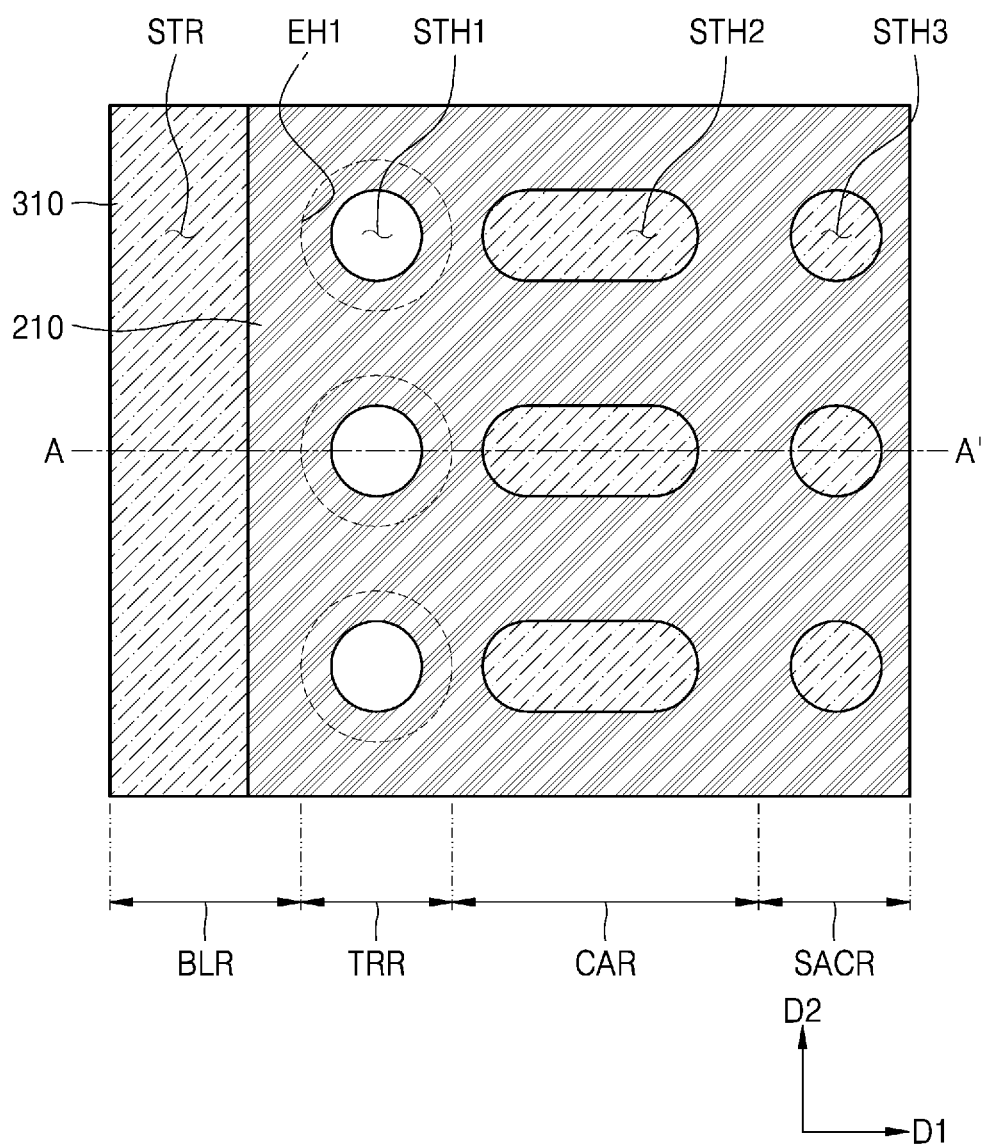
Figure 6C:
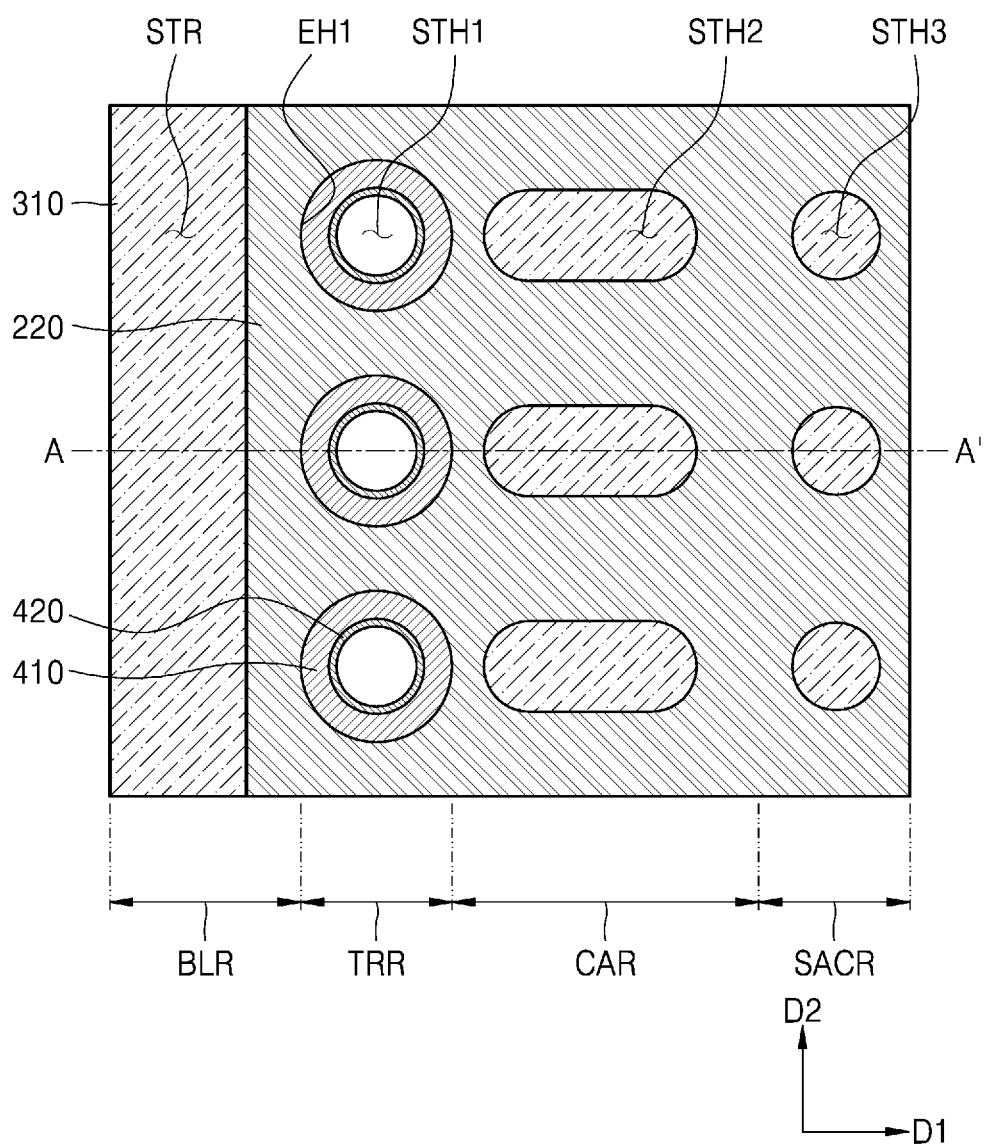

Referring to FIGS. 6A to 6C, a first dielectric layer 420 may be formed on a surface of the channel layer 410 exposed through the first stack hole STH1. For example, the first dielectric layer 420 may cover an inner sidewall of the central hole of the channel layer 410 having a donut shape. The first dielectric layer 420 may include, for example, silicon oxide. In some embodiments, the first dielectric layer 420 may not be disposed on the cell insulation layer 210 and may be disposed on only the surface of the channel layer 410, in the first stack hole STH1. For example, the first dielectric layer 420 may be formed by thermally oxidizing a portion of the channel layer 410 and may be disposed at a boundary portion between the first stack hole STH1 and the first extension space EH1. The first dielectric layer 420 may have a ring shape which has a thickness of tens of nm from the surface of the channel layer 410.

The first dielectric layer 420 may configure at least a portion of a gate dielectric layer of the cell transistor.

Figure 7A:
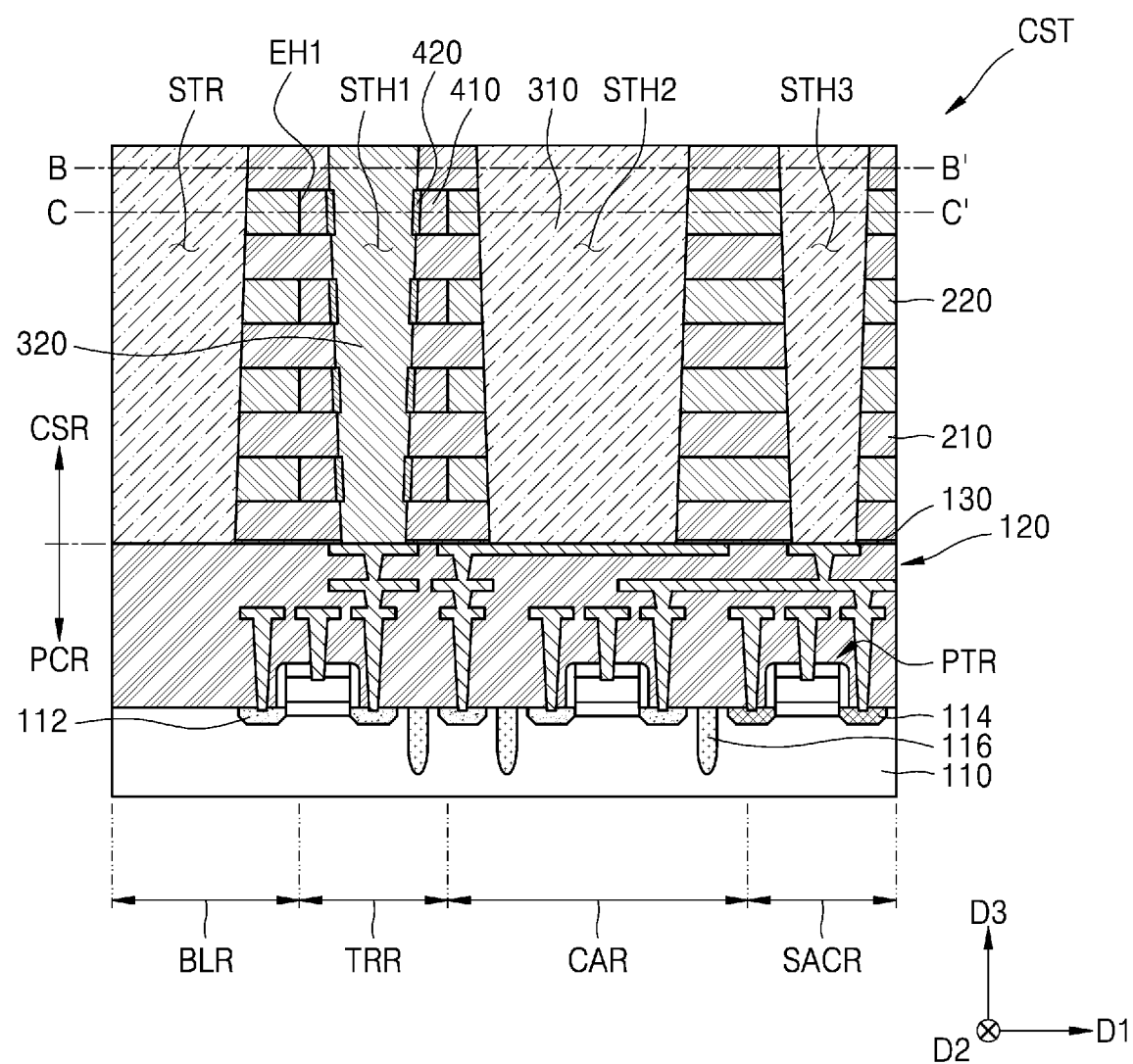
Figure 7B:
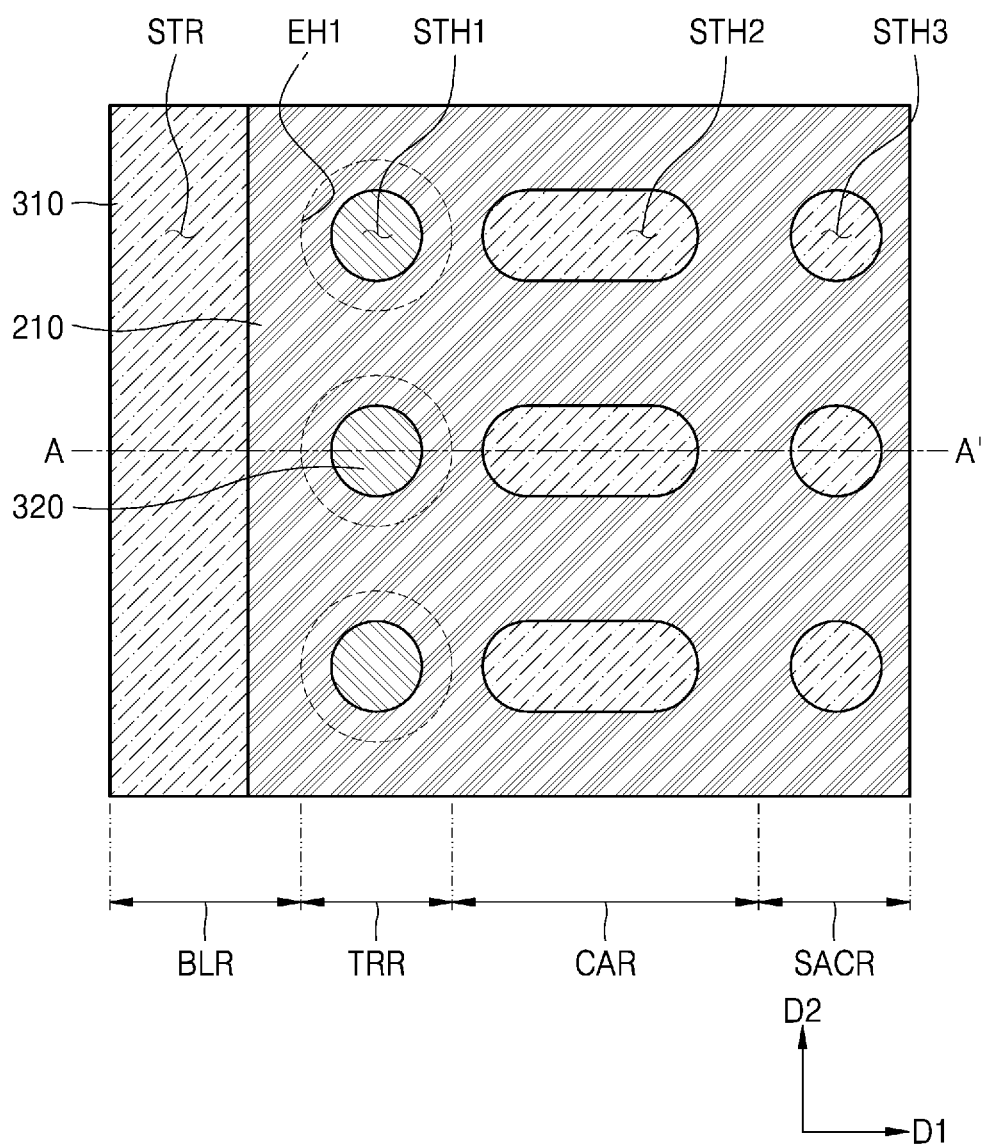
Figure 7C:
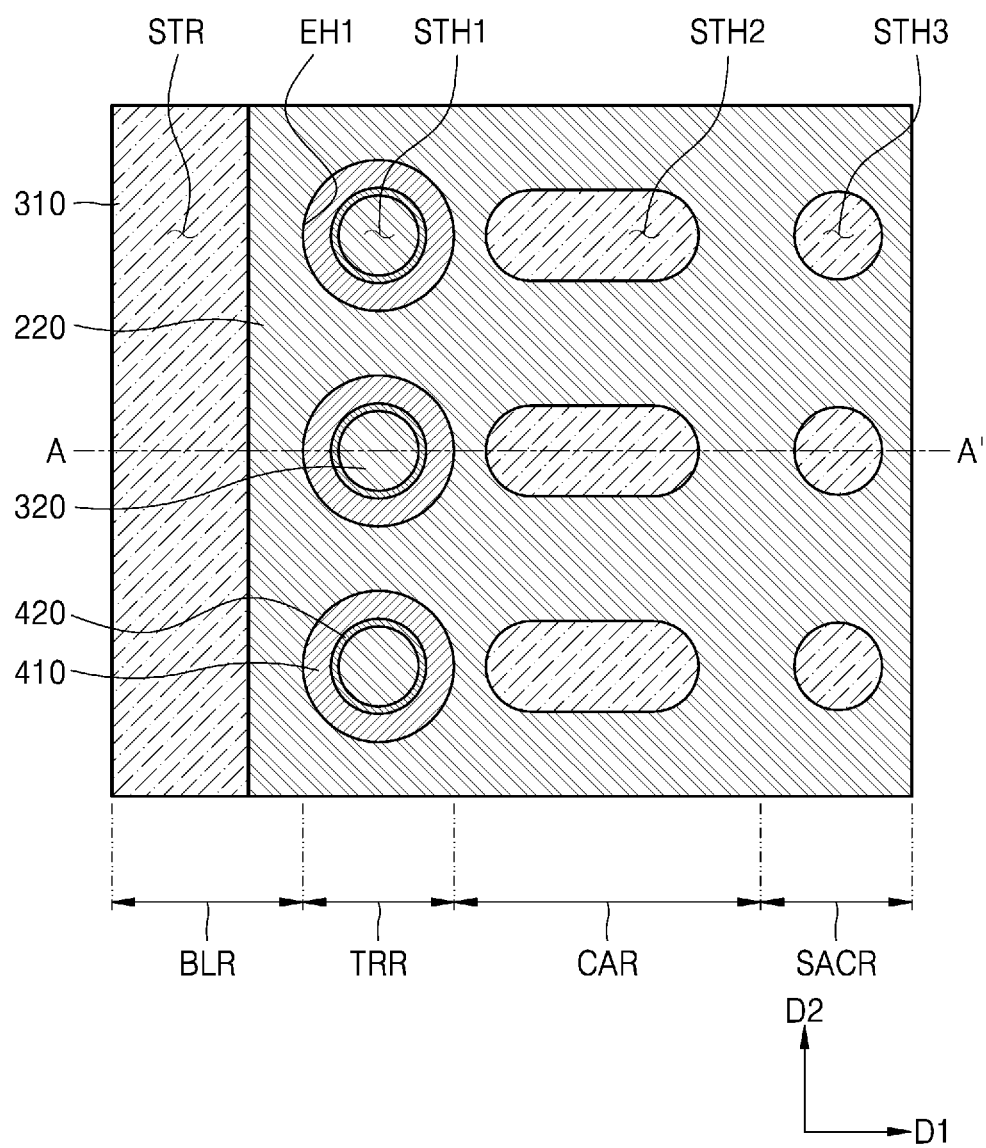

Referring to FIGS. 7A to 7C, a second sacrificial layer 320 may be formed in the first stack hole STH1. The second sacrificial layer 320 may include a material having an etch selectivity with respect to the cell insulation layer 210 and the first sacrificial layer 310. For example, the second sacrificial layer 320 may include silicon nitride.

Figure 8A:
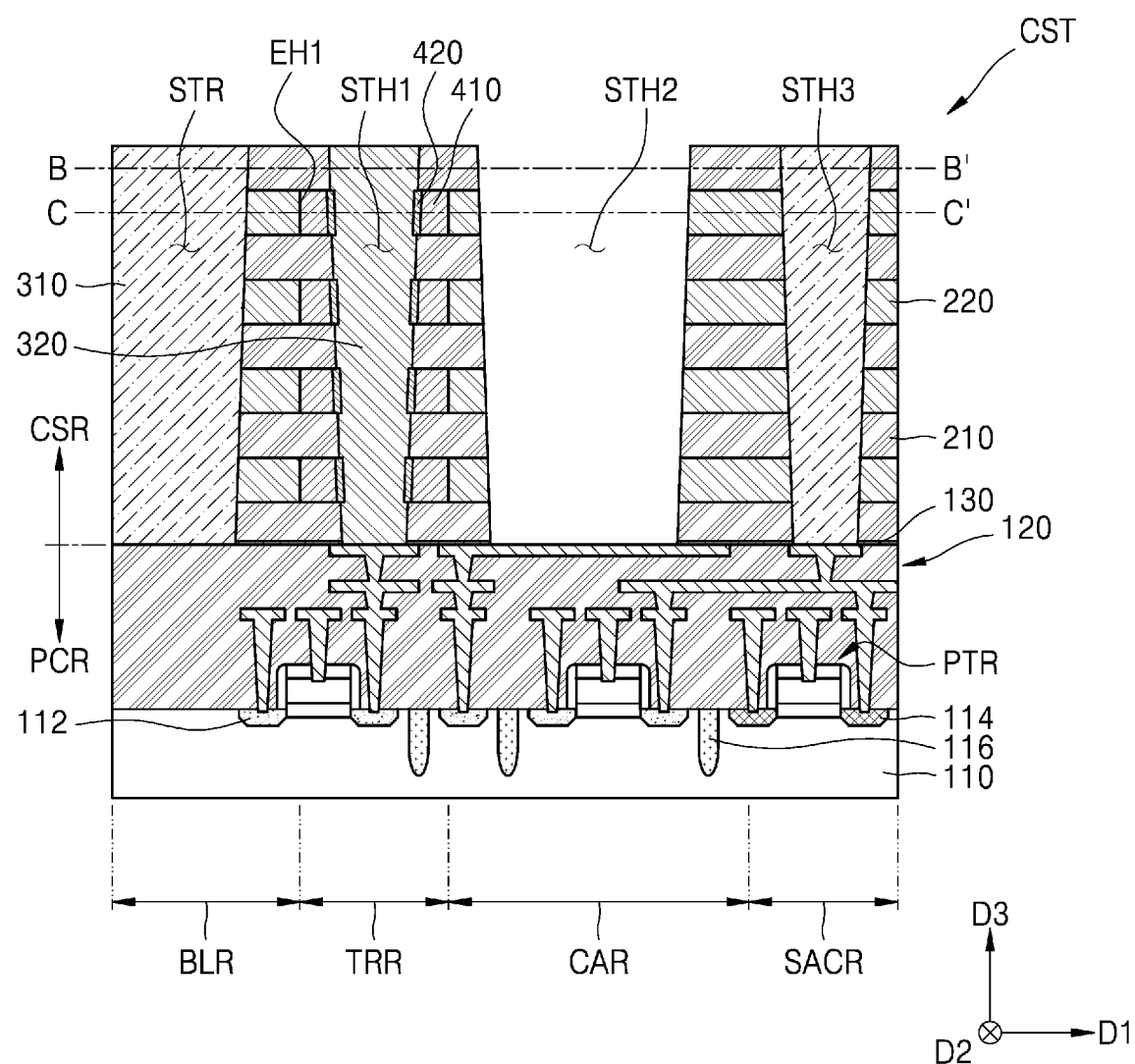
Figure 8B:
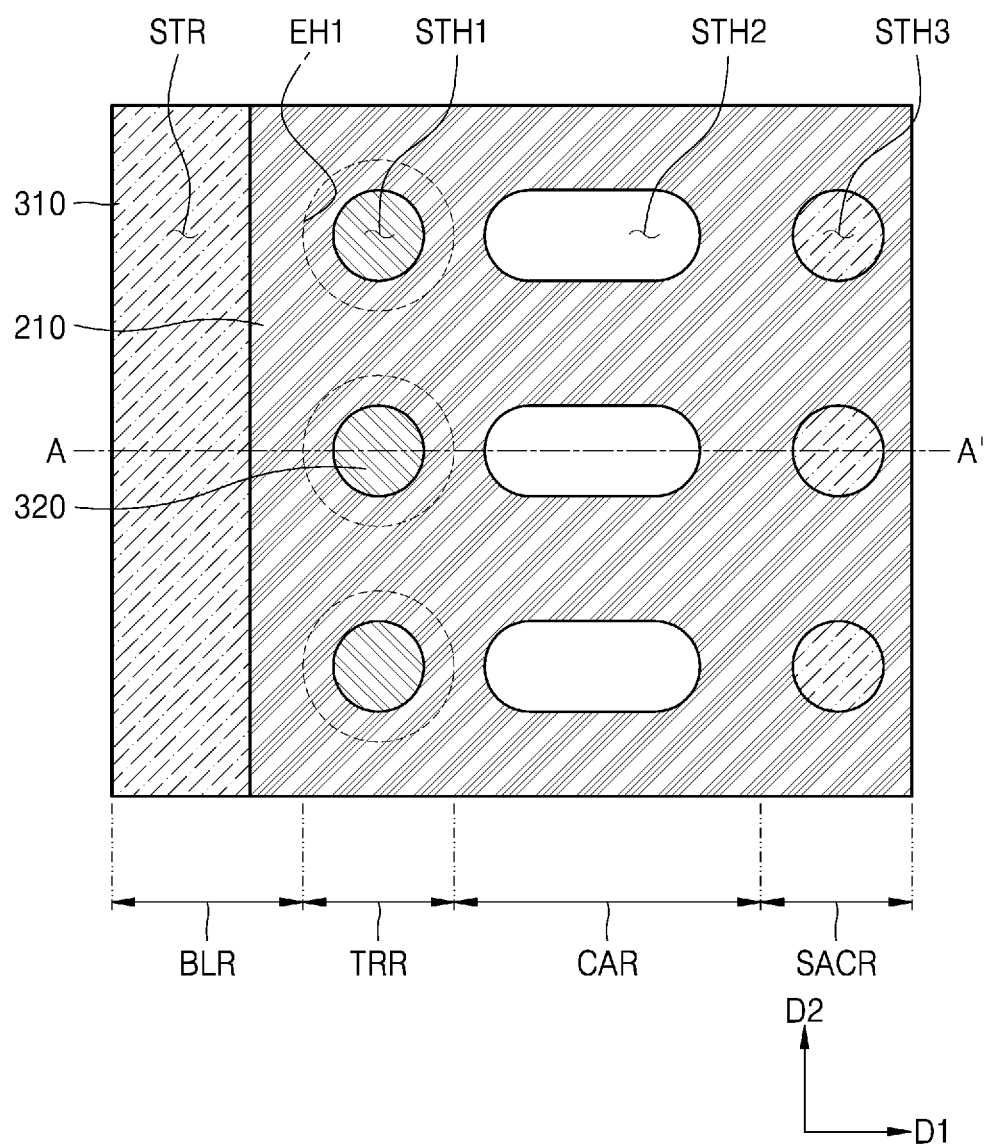
Figure 8C:
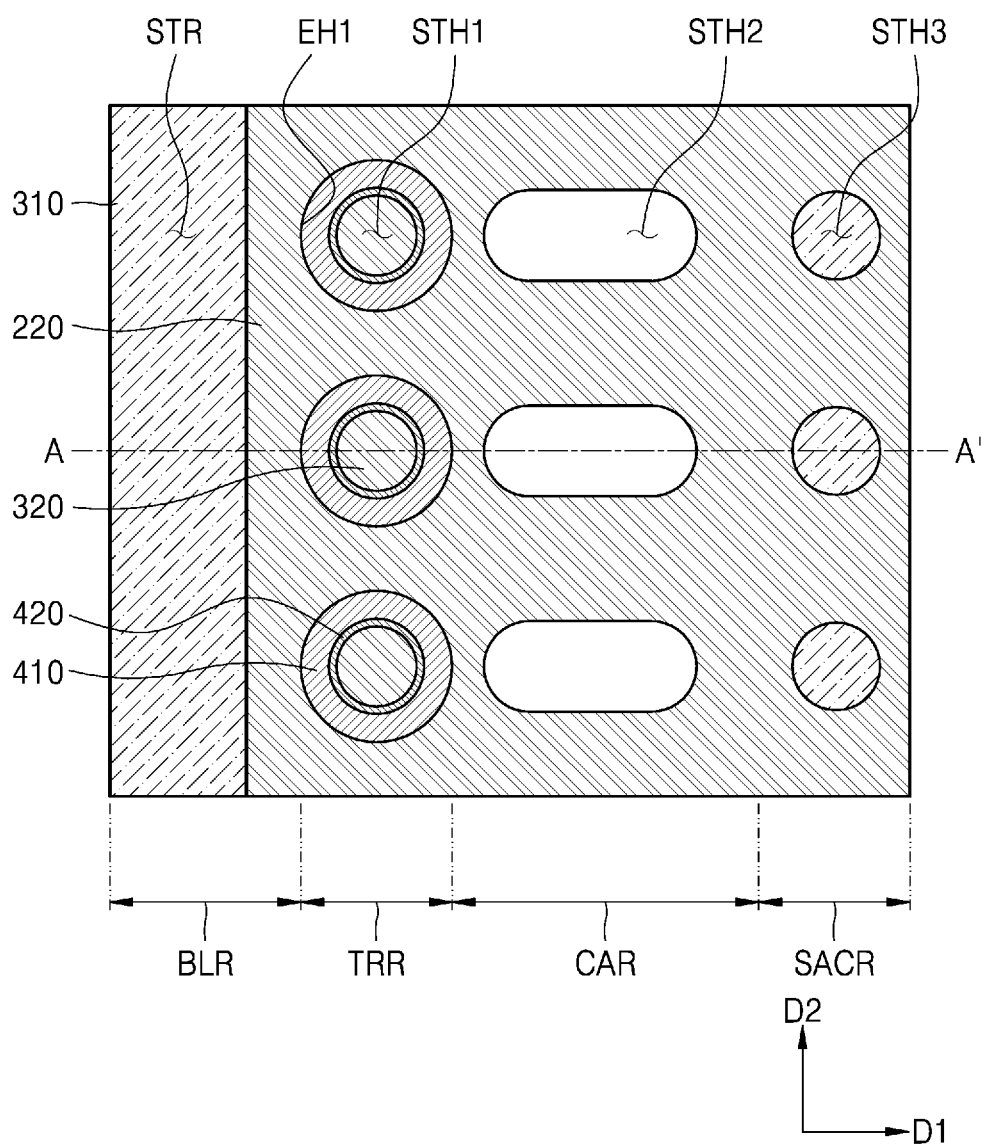

Referring to FIGS. 8A to 8C, the first sacrificial layer 310 filled into the second stack hole STH2 may be removed. While the first sacrificial layer 310 filled into the second stack hole STH2 is being removed, a mask pattern may cover the bit line region BLR and the contact region SACR so that the first sacrificial layers 310 filled into the stack recess STR and the third stack hole STH3 are not removed.

Figure 9A:
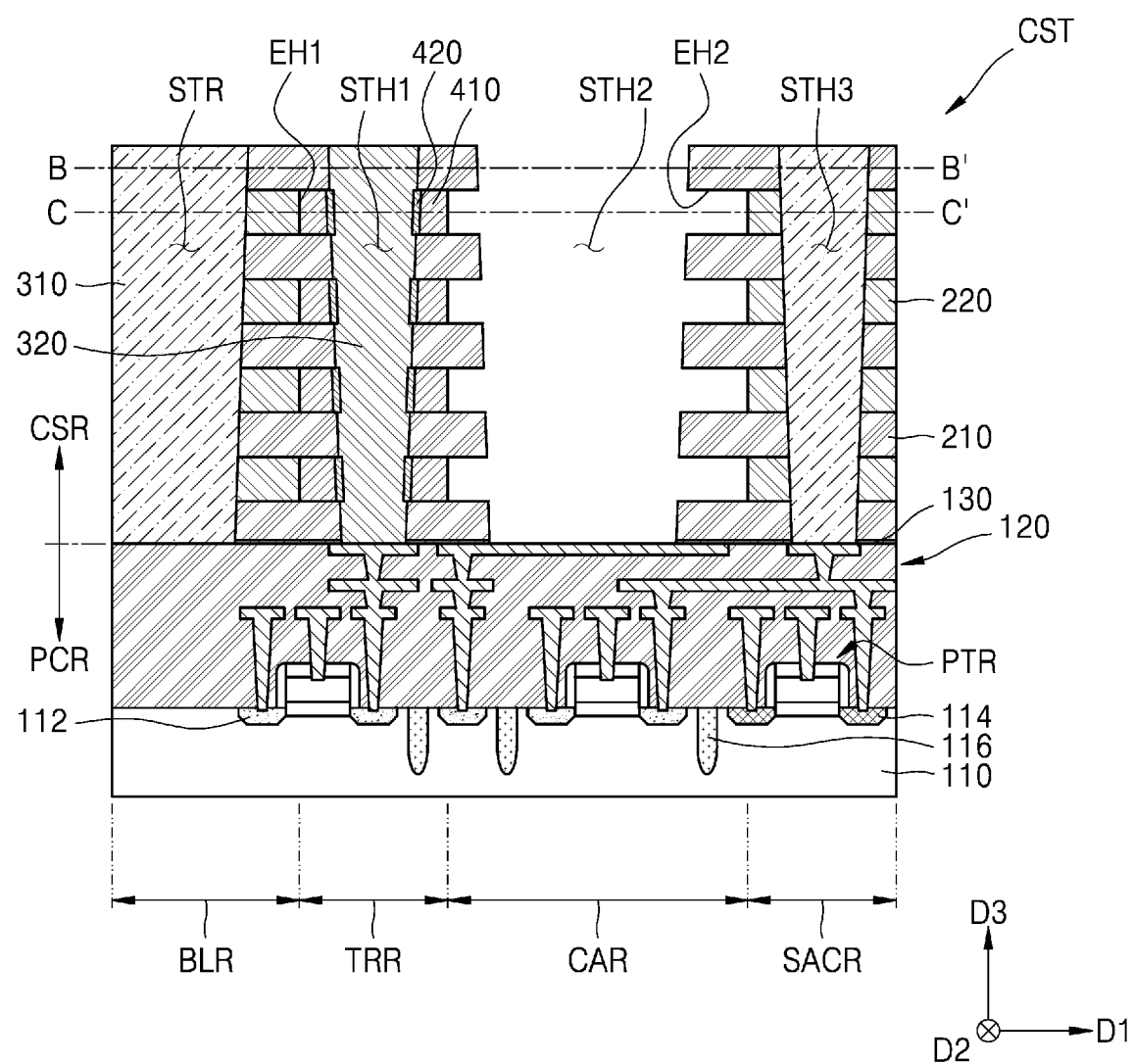
Figure 9B:
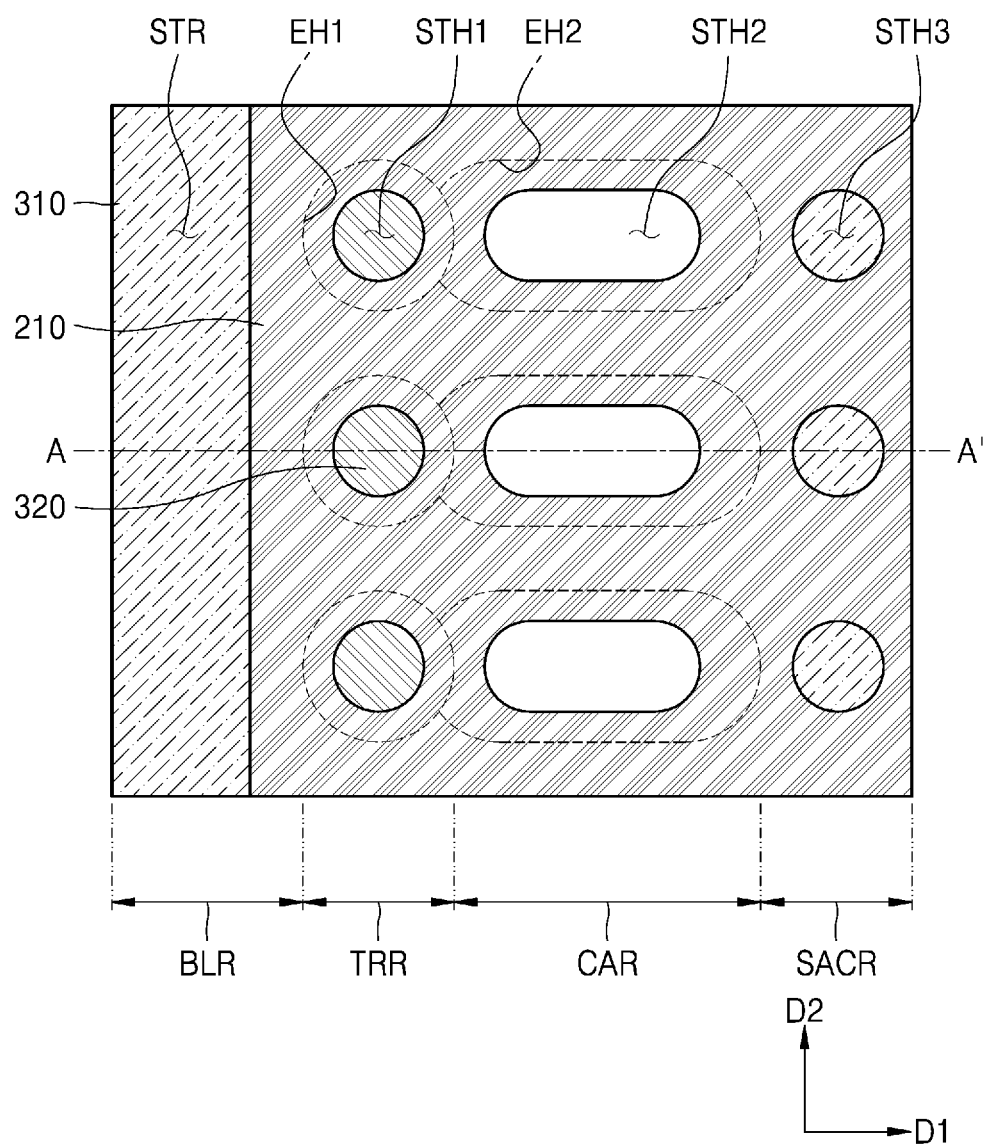
Figure 9C:
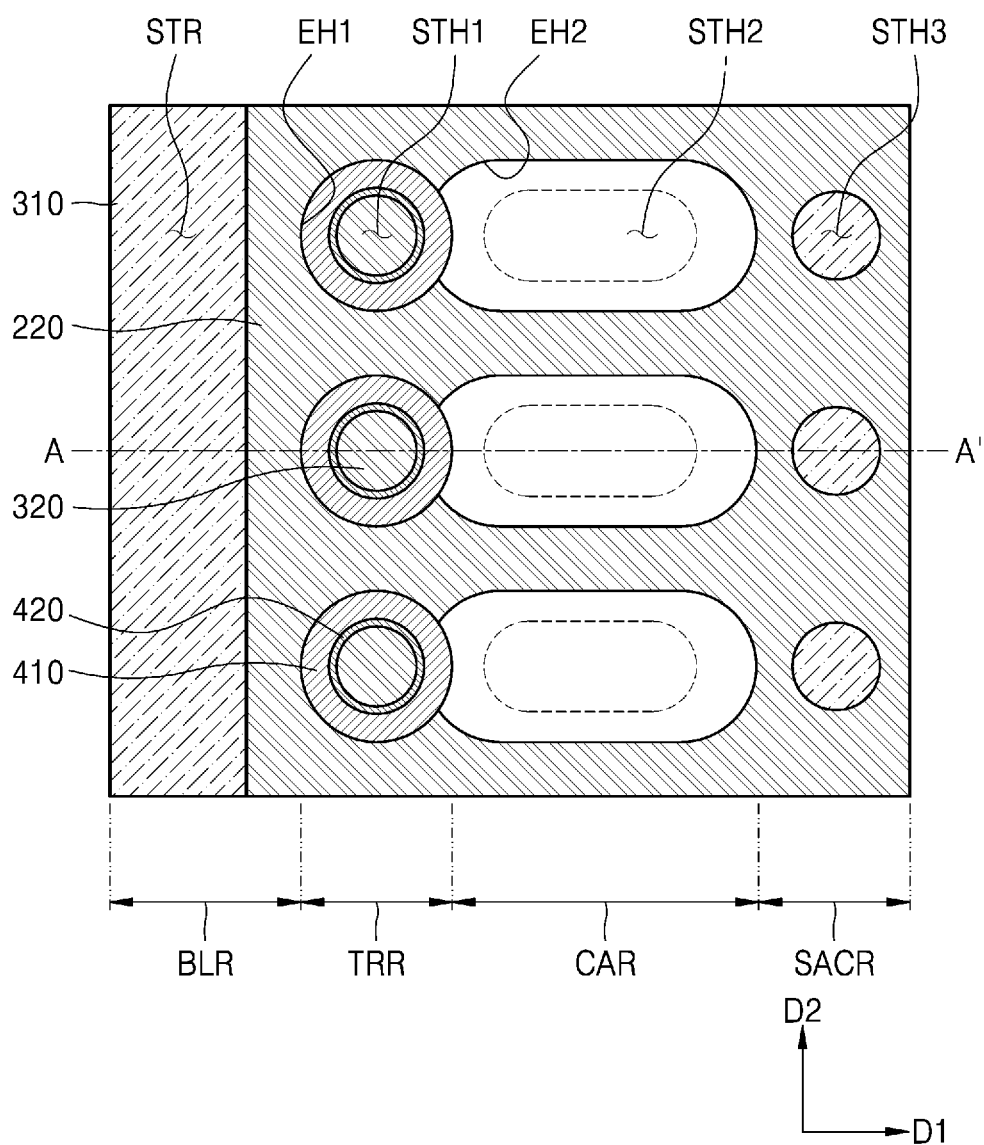

Referring to FIGS. 9A to 9C, a second extension space EH2 in the second stack hole STH2 may be formed by removing a portion of the cell sacrificial layer 220 exposed through the second stack hole STH2. The second extension space EH2 may be formed by removing the portion of the cell sacrificial layer 220 exposed through the second stack hole STH2, so that the channel layer 410 is exposed. The second extension space EH2 may have a width of tens of nm in a horizontal direction from the second stack hole STH2. A height of the second extension space EH2 may be a height of the cell sacrificial layer 220. In some embodiments, the second extension space EH2 may have a height of tens of nm in the vertical direction D3.

Figure 10A:
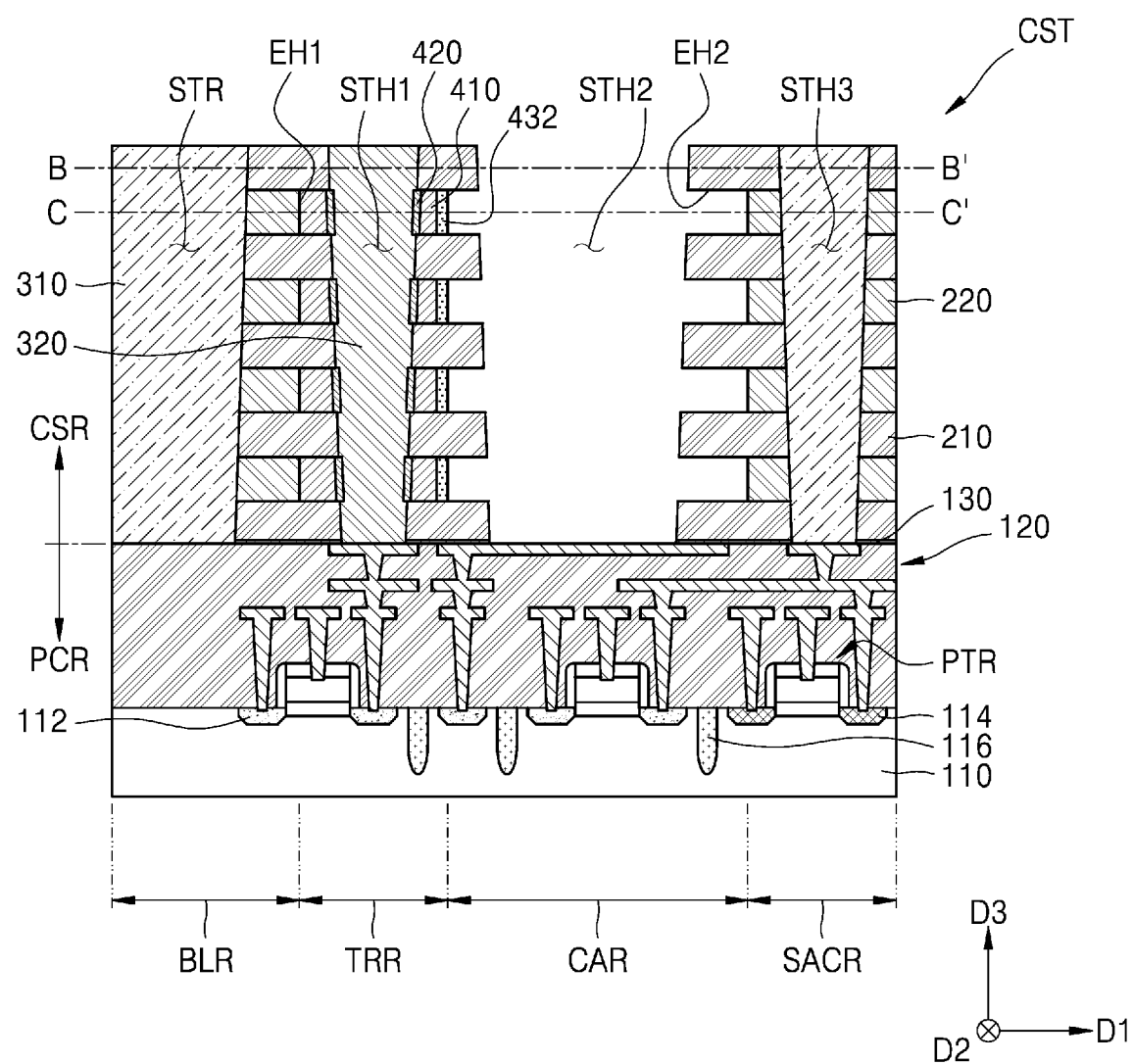
Figure 10B:
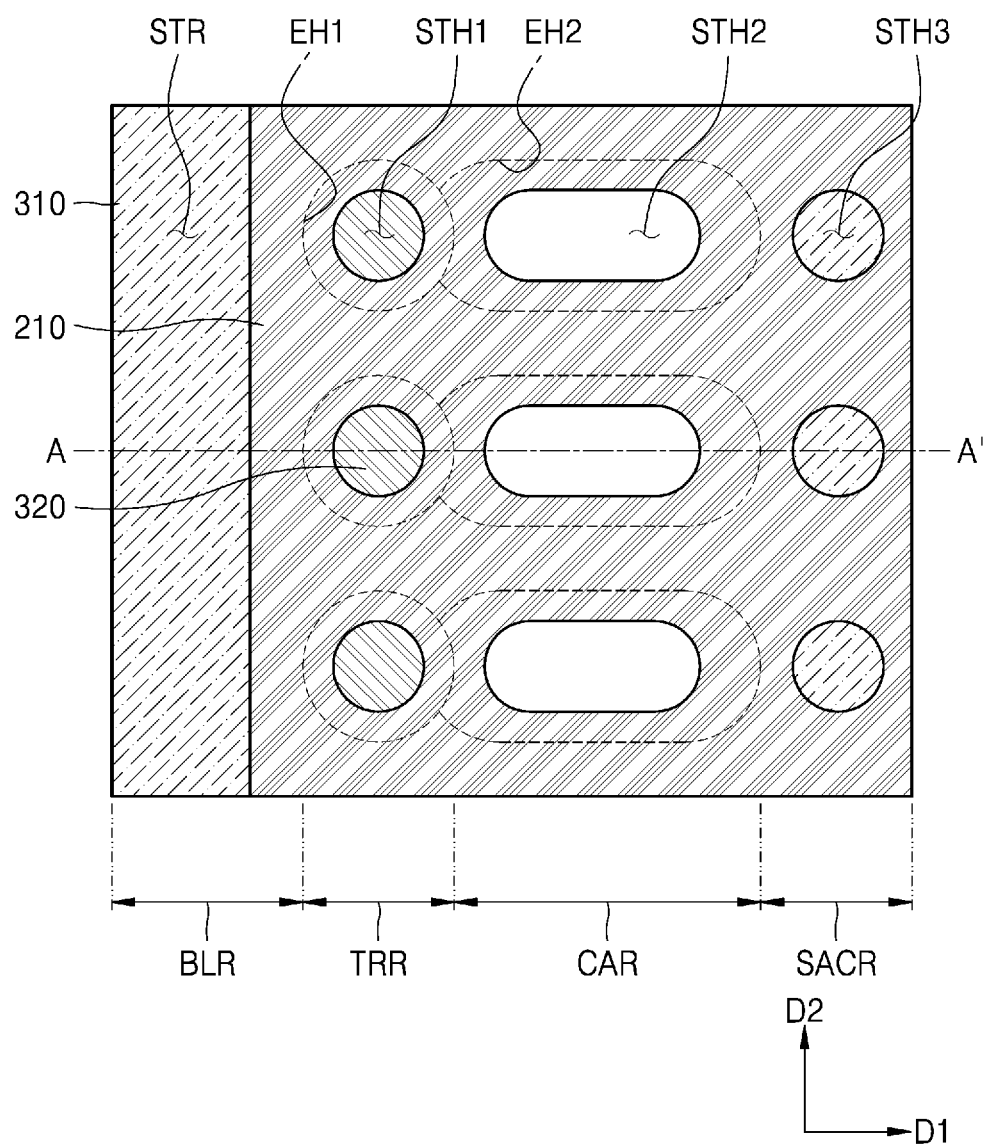
Figure 10C:
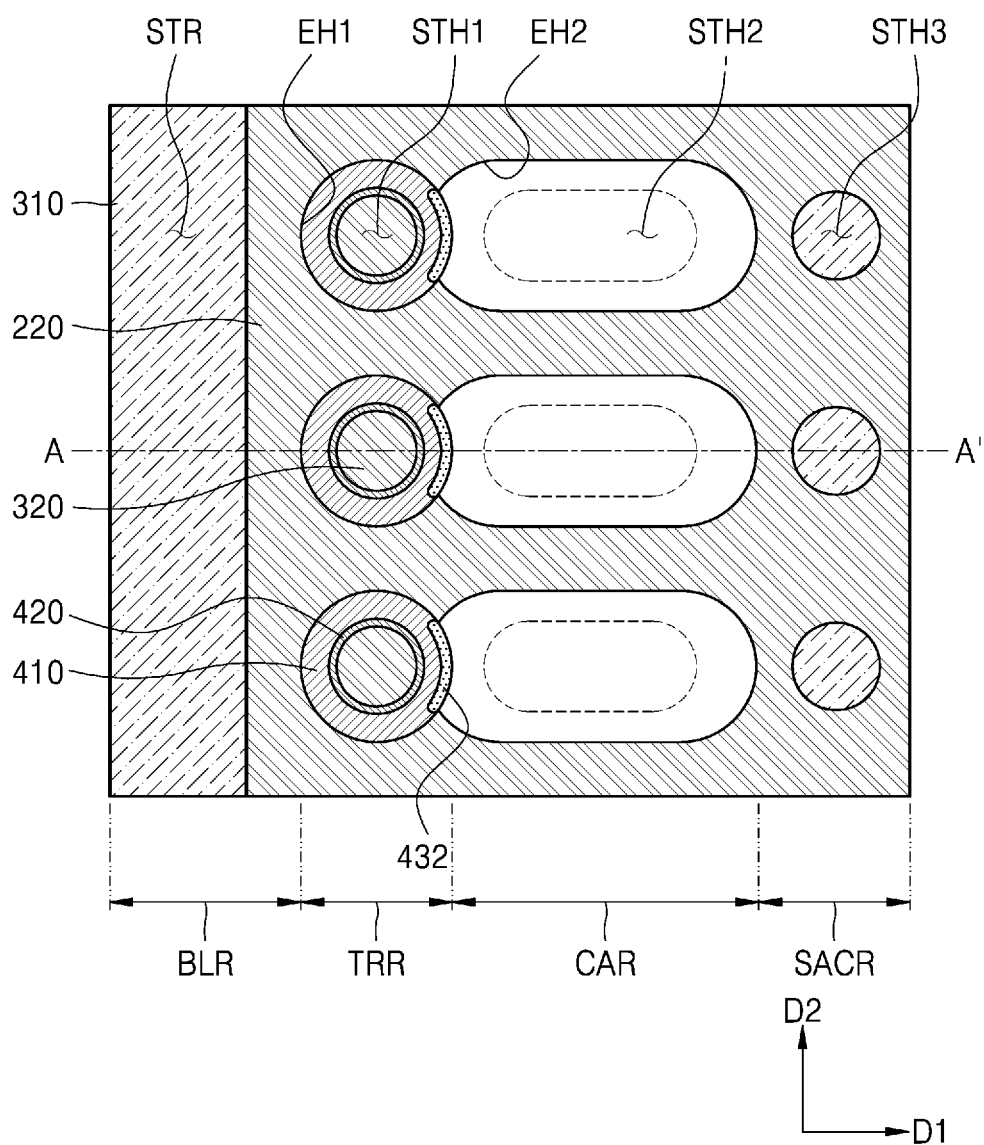

Referring to FIGS. 10A to 10C, a first cell impurity region 432 may be formed by implanting impurities into a portion adjacent to a surface of the channel layer 410 exposed through the second extension space EH2. The first cell impurity region 432 may be formed adjacent to an inner sidewall of the channel layer 410 facing the first stack hole STH1. For example, the first cell impurity region 432 may be formed as an n+ region.

In some embodiments, the first cell impurity region 432 may be omitted.

Figure 11A:
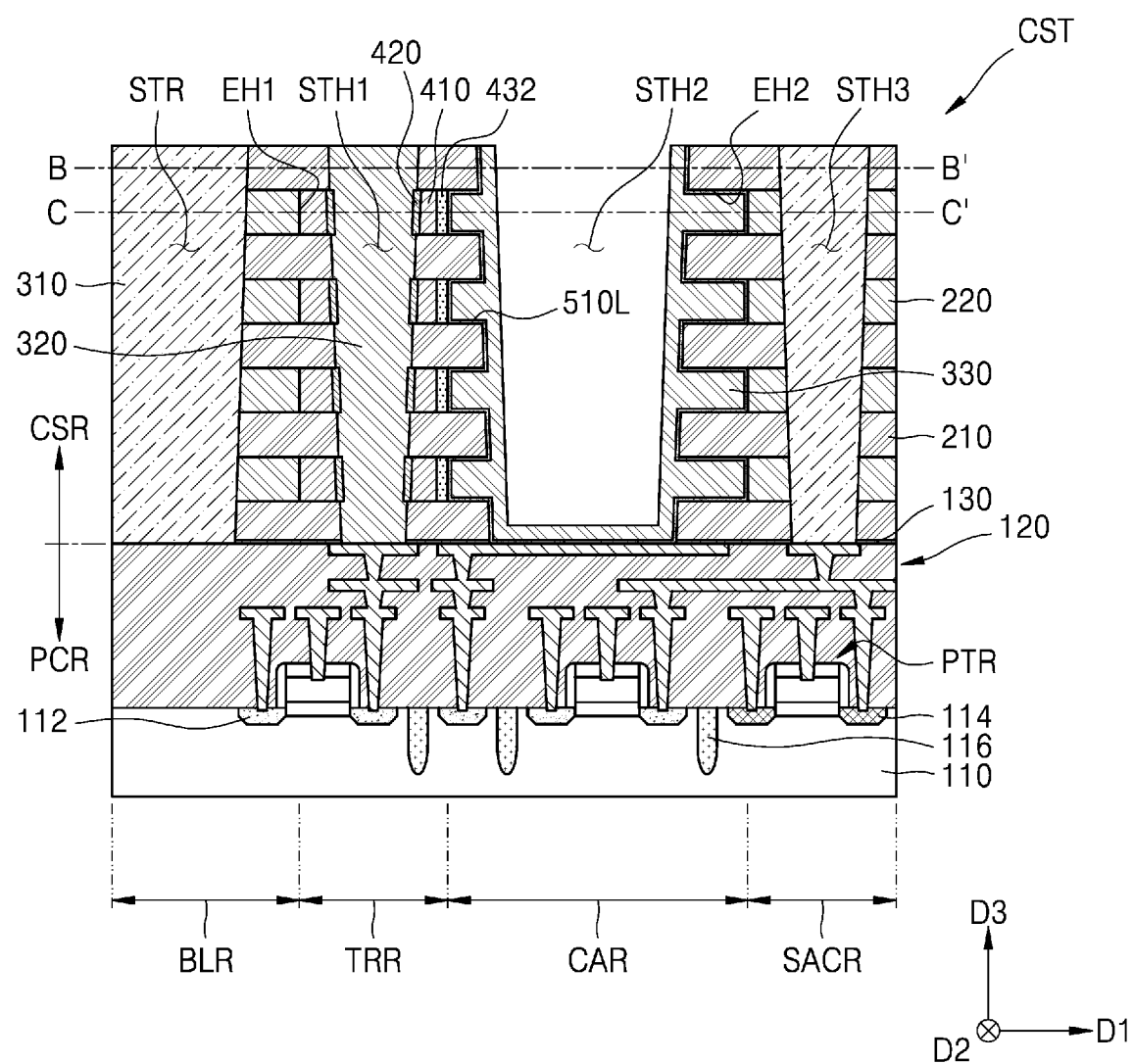
Figure 11B:
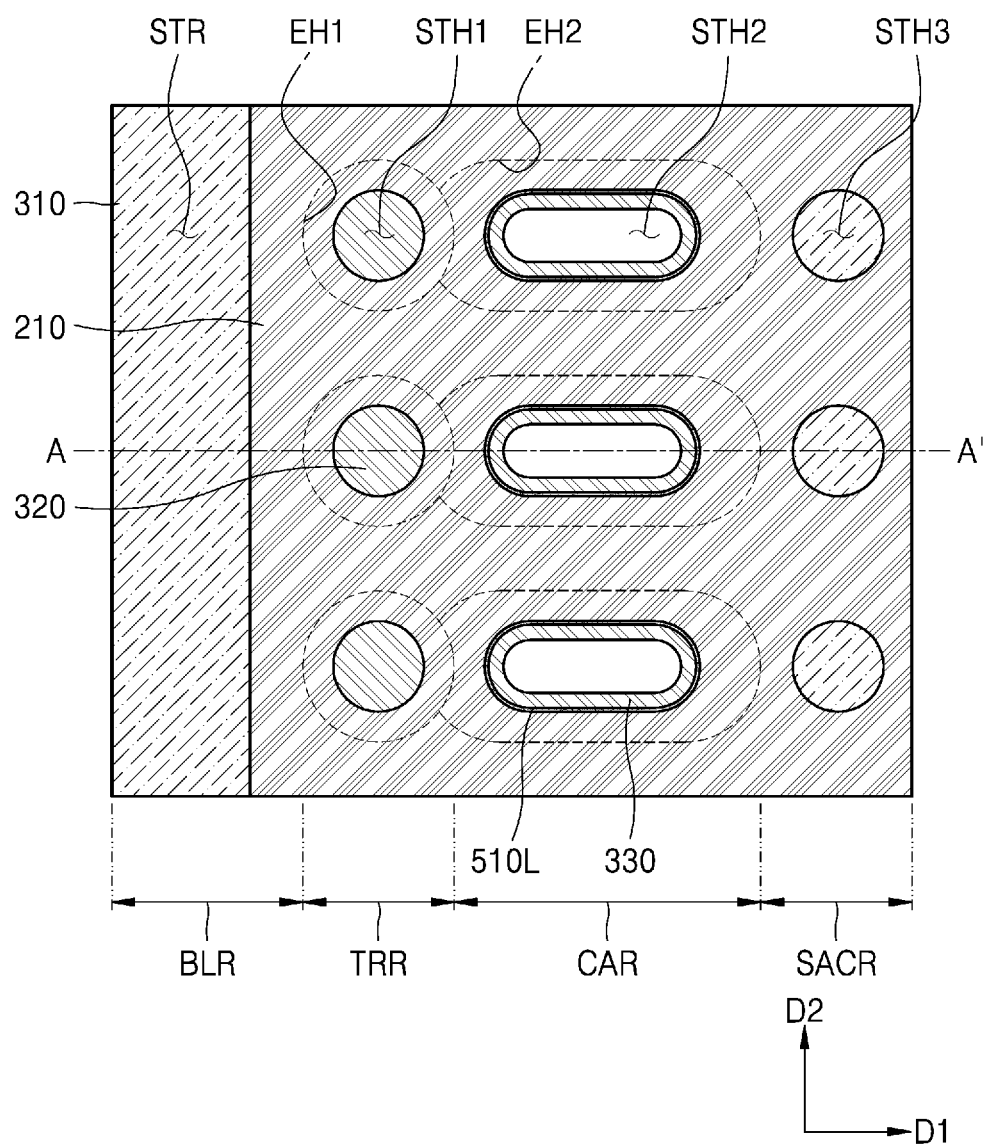
Figure 11C:
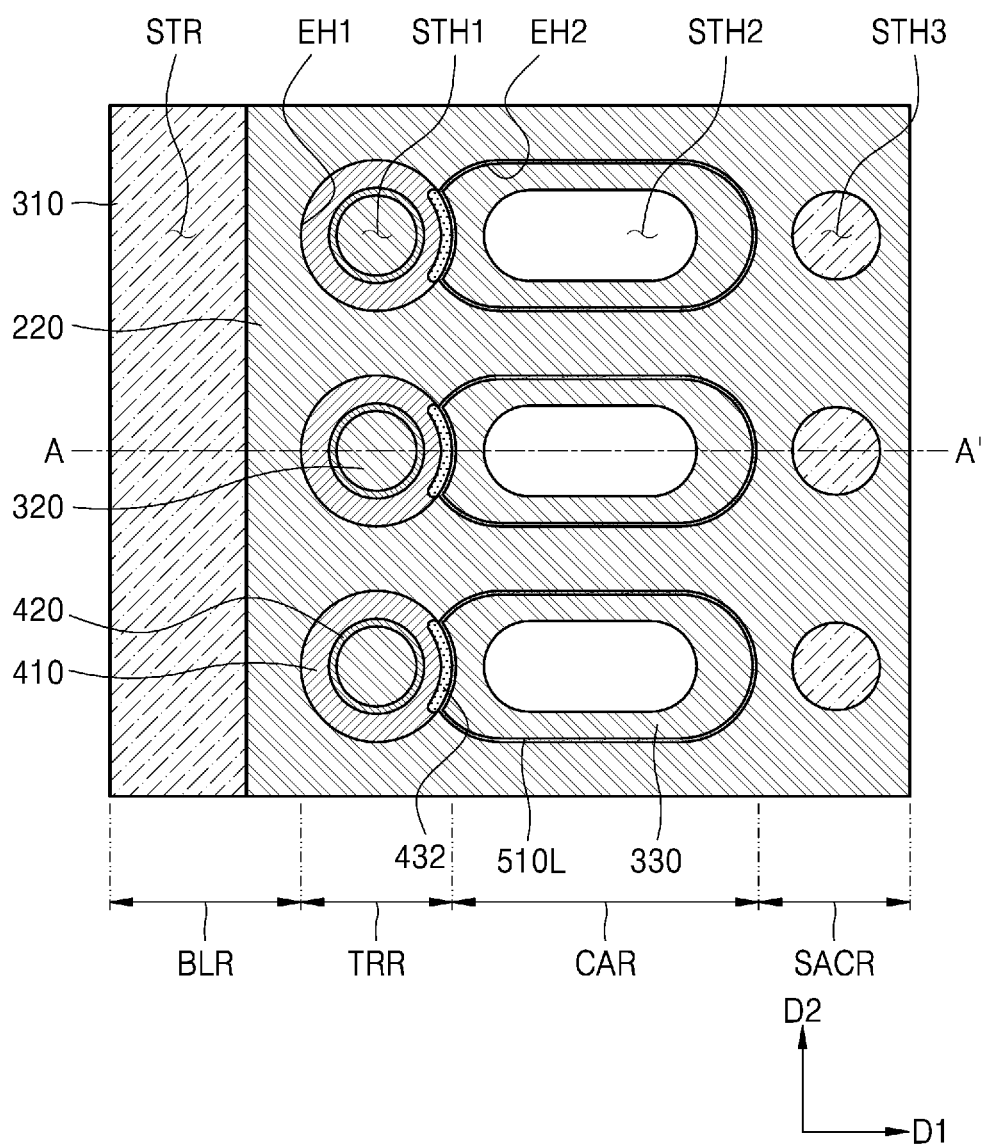

Referring to FIGS. 11A to 11C, a preliminary lower electrode layer 510L covering an inner surface of each of the second extension space EH2 and the second stack hole STH2 may be formed, and a third sacrificial layer 330 filled into all of the second extension space EH2 and at least a portion of the second stack hole STH2 may be formed to cover the preliminary lower electrode layer 510L. The preliminary lower electrode layer 510L may conformally cover a surface of each of the first cell impurity region 432 and the cell insulation layer 210 in the second extension space EH2 and a surface of each of the cell insulation layer 210 and the circuit wiring structure 120 in the second stack hole STH2.

For example, the second stack hole STH2 may have a width of tens of nm and a height of tens of nm. In some embodiments, a ratio of the width and the height of the second stack hole STH2 may be about 0.5 to about 2. For example, a ratio of the width and the height of the second stack hole STH2 may be about 1. The second extension space EH2 may extend from the second stack hole STH2, and thus, a width of the second extension space EH2 may be recognized as a height in a process of forming the preliminary lower electrode layer 510L. That is, in some embodiments, an aspect ratio of the second extension space EH2 may be about 0.5 to about 2 in the process of forming the preliminary lower electrode layer 510L. For example, the aspect ratio of the second extension space EH2 may be about 1. Therefore, the preliminary lower electrode layer 510L may be formed to cover an inner surface of the second extension space EH2 having a relatively lower aspect ratio, and thus, may be easily formed.

In FIG. 11A, it is illustrated that the preliminary lower electrode layer 510L and the third sacrificial layer 330 are formed in the second extension space EH2 and the second stack hole STH2, but the embodiment is not limited thereto and the preliminary lower electrode layer 510L and the third sacrificial layer 330 may be formed to cover a top surface of the cell stack structure CST.

The preliminary lower electrode layer 510L may include metal, conductive metal nitride, conductive metal silicide, or a combination thereof. For example, the preliminary lower electrode layer 510L may include titanium nitride (TiN). The third sacrificial layer 330 may include a material having an etch characteristic which is the same as or similar to that of the second sacrificial layer 320. For example, the third sacrificial layer 330 may include silicon nitride.

Figure 12A:
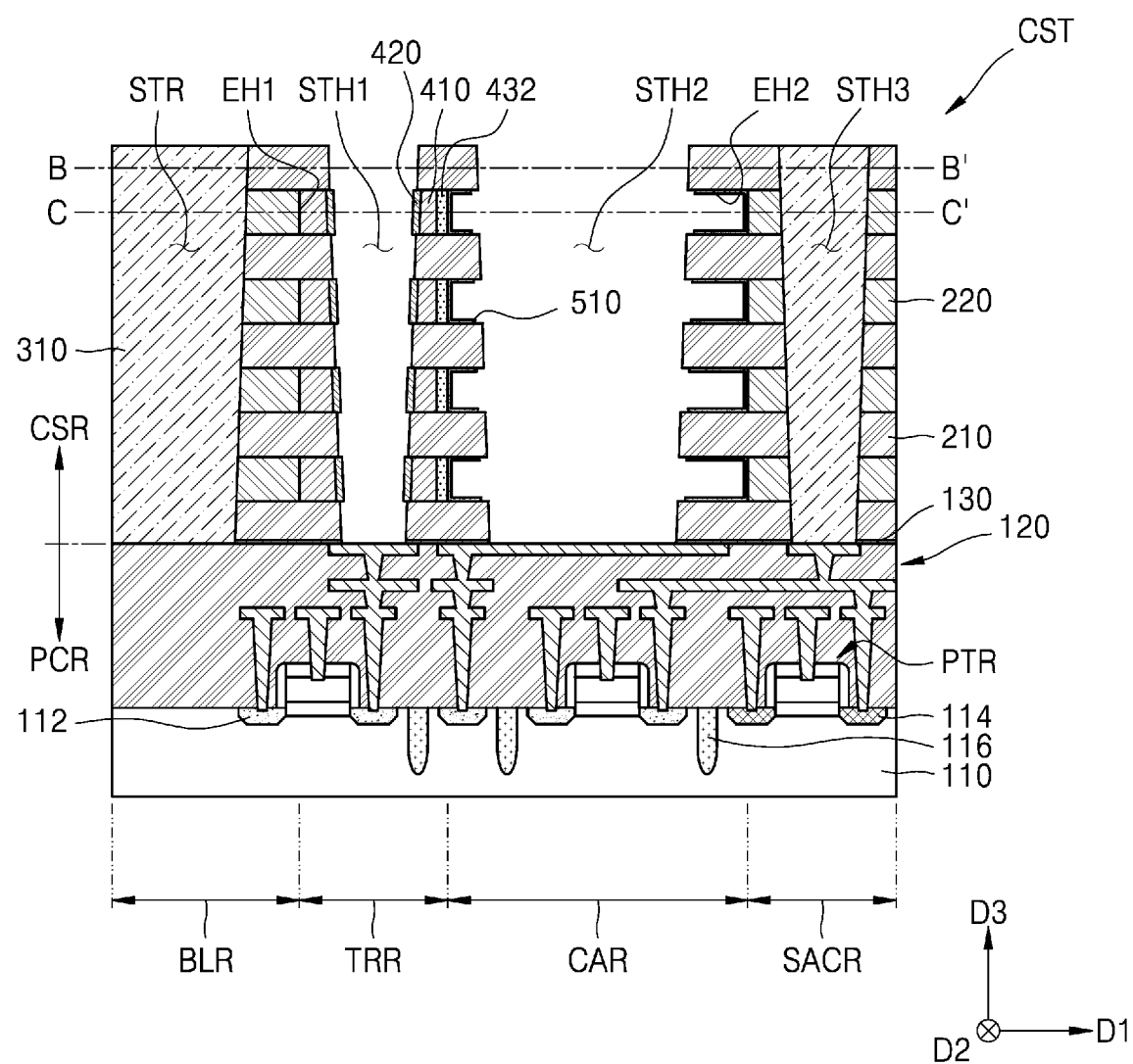
Figure 12B:
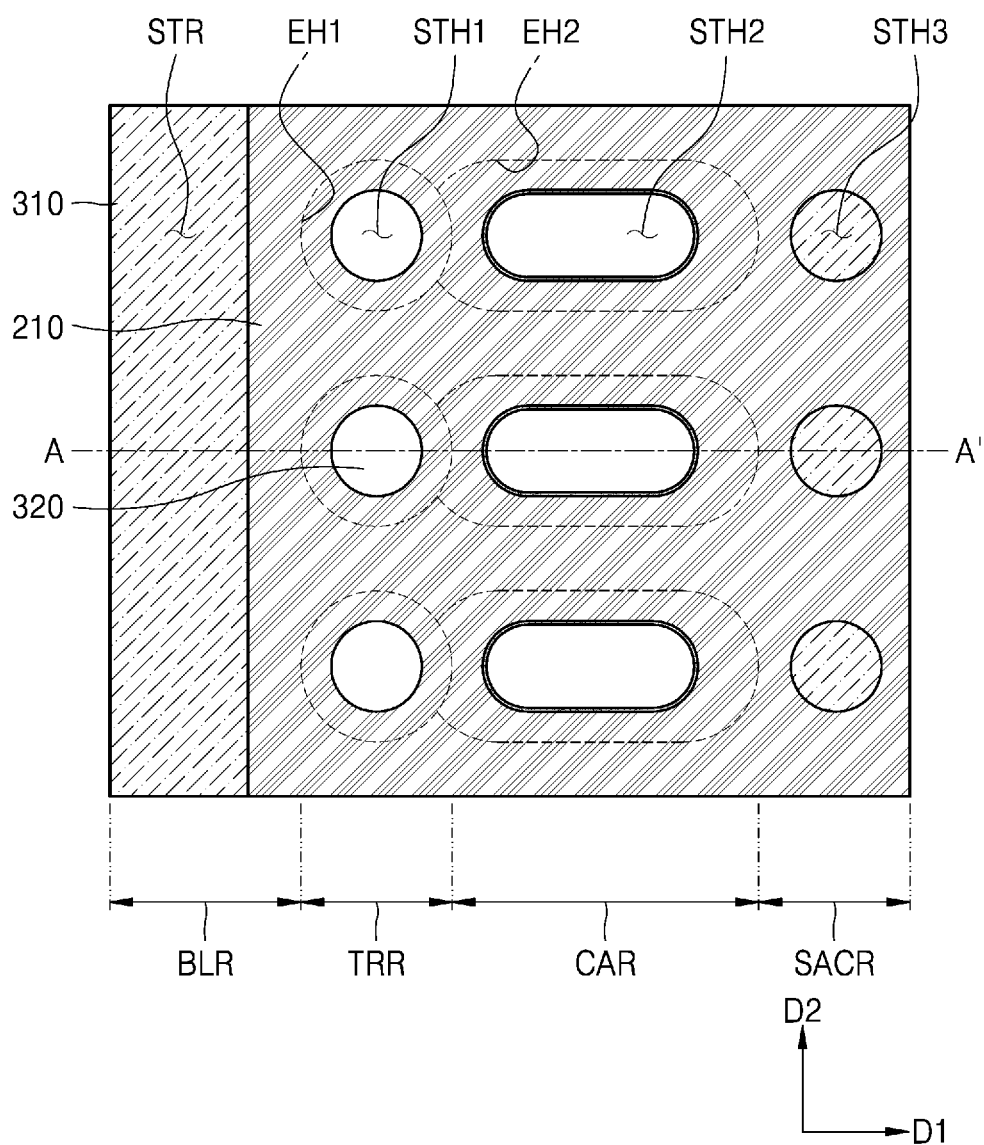
Figure 12C:
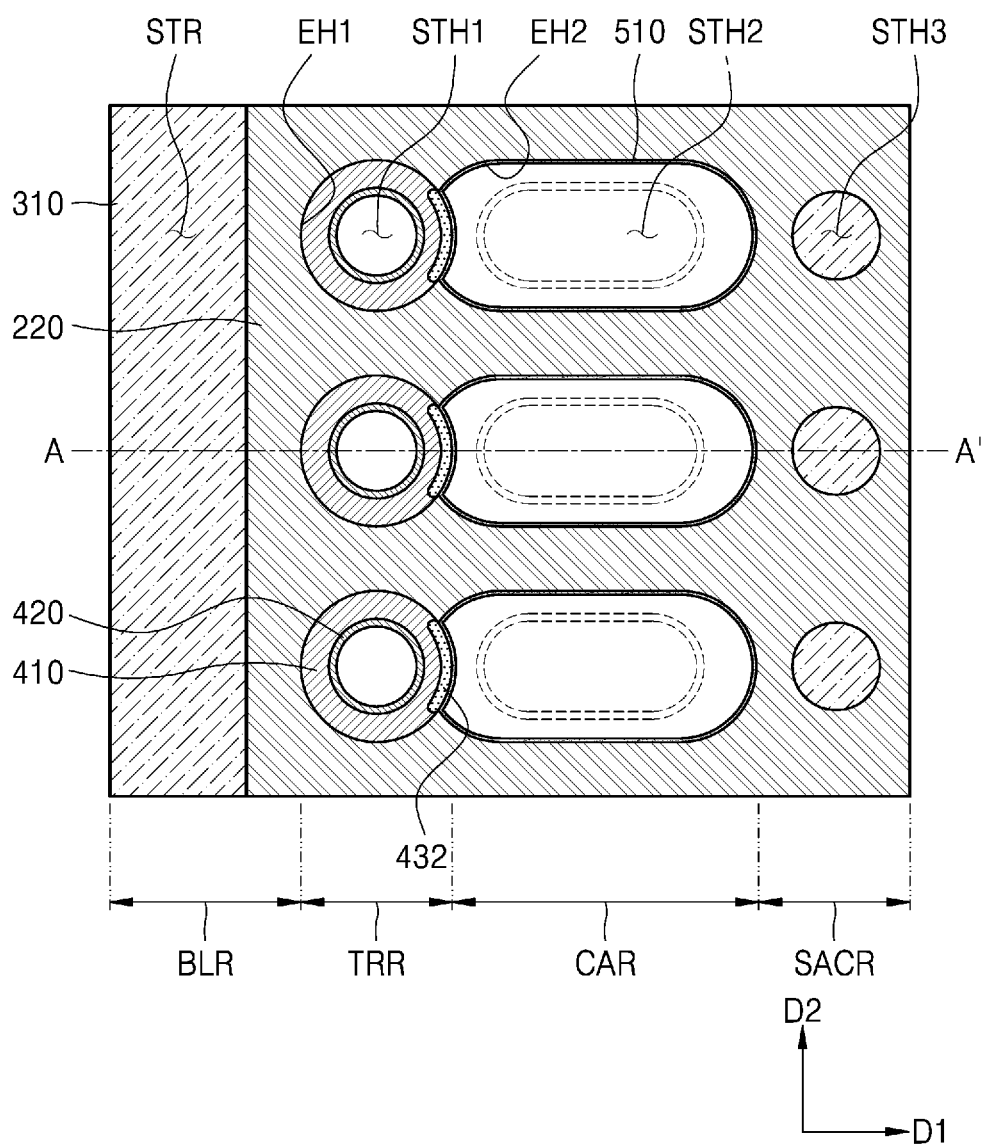

Referring to FIGS. 12A to 12C, a portion of the third sacrificial layer 330 in the second stack hole STH2 may be removed, and then, a lower electrode layer 510 may be formed by removing an exposed portion of a preliminary lower electrode layer (510L of FIG. 11A).

In some embodiments, in a process of forming the lower electrode layer 510, a portion of the preliminary lower electrode layer 510L covering a surface of a portion of the second extension space EH2 adjacent to the second stack hole EH2 may be removed together, and thus, the lower electrode layer 510 may be disposed apart from a boundary between the second stack hole STH2 and the second extension space EH2 and inward from the second extension space EH2. That is, the lower electrode layer 510 may cover all of a surface of the first cell impurity region 432 in the second extension space EH2 and may cover a portion of a surface of the cell insulation layer 210 in the second extension space EH2.

The lower electrode layer 510 may have a closed ring shape surrounding the second stack hole STH2 and may include a U-shaped vertical cross-sectional surface where an open portion thereof is rotated by 90 degrees to face the second stack hole STH2. The lower electrode layer 510 may have a distorted ring shape where a portion thereof adjacent to the first cell impurity region 432 is concave.

In a process of removing a portion of the third sacrificial layer 330 in the second stack hole STH2, a second sacrificial layer (320 of FIG. 11A) filled into the first stack hole STH1 may be removed together. Subsequently, the lower electrode layer 510 may be exposed by removing the portion of the third sacrificial layer 330 filled into the second extension space EH2.

Figure 13A:
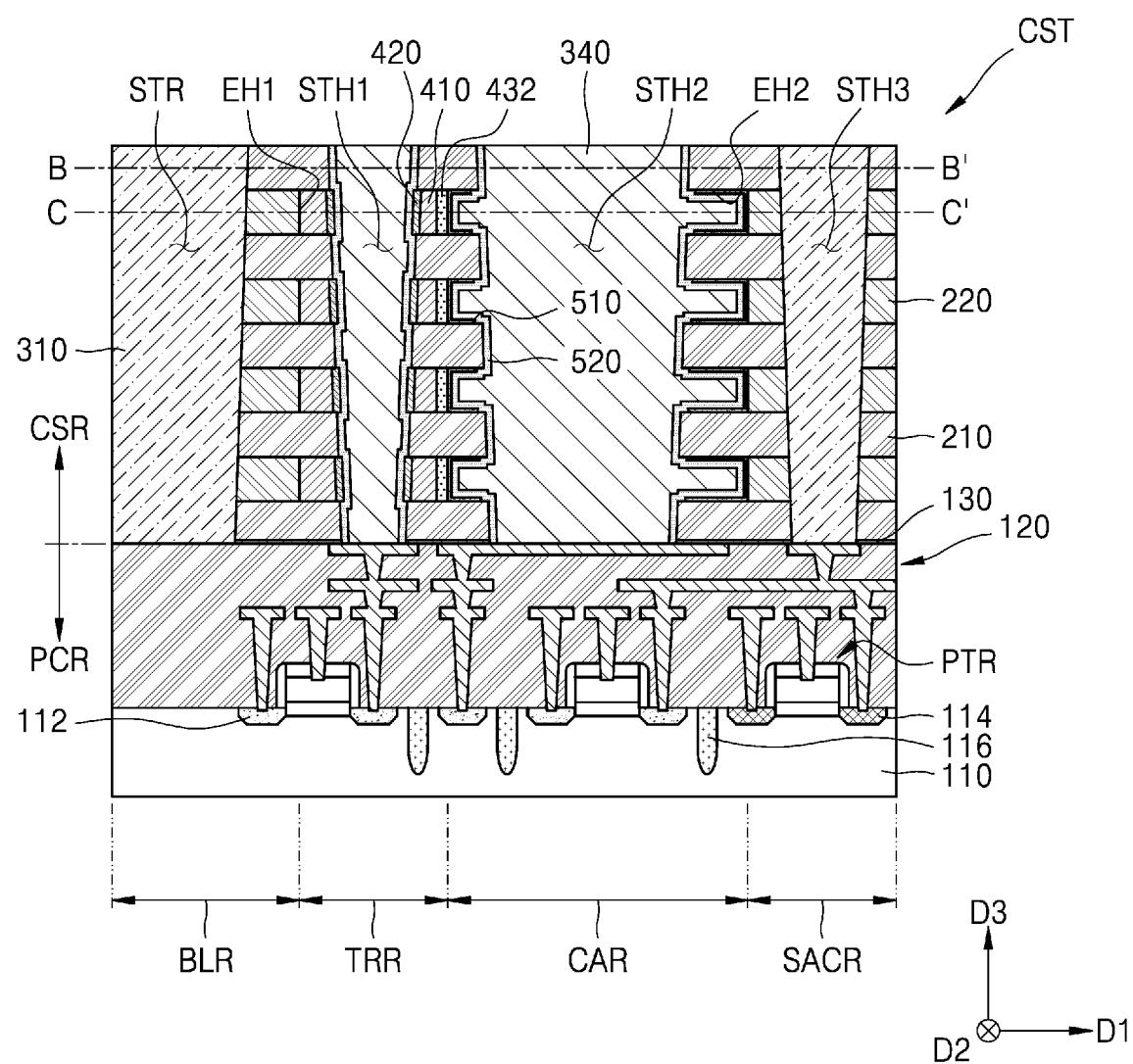
Figure 13B:
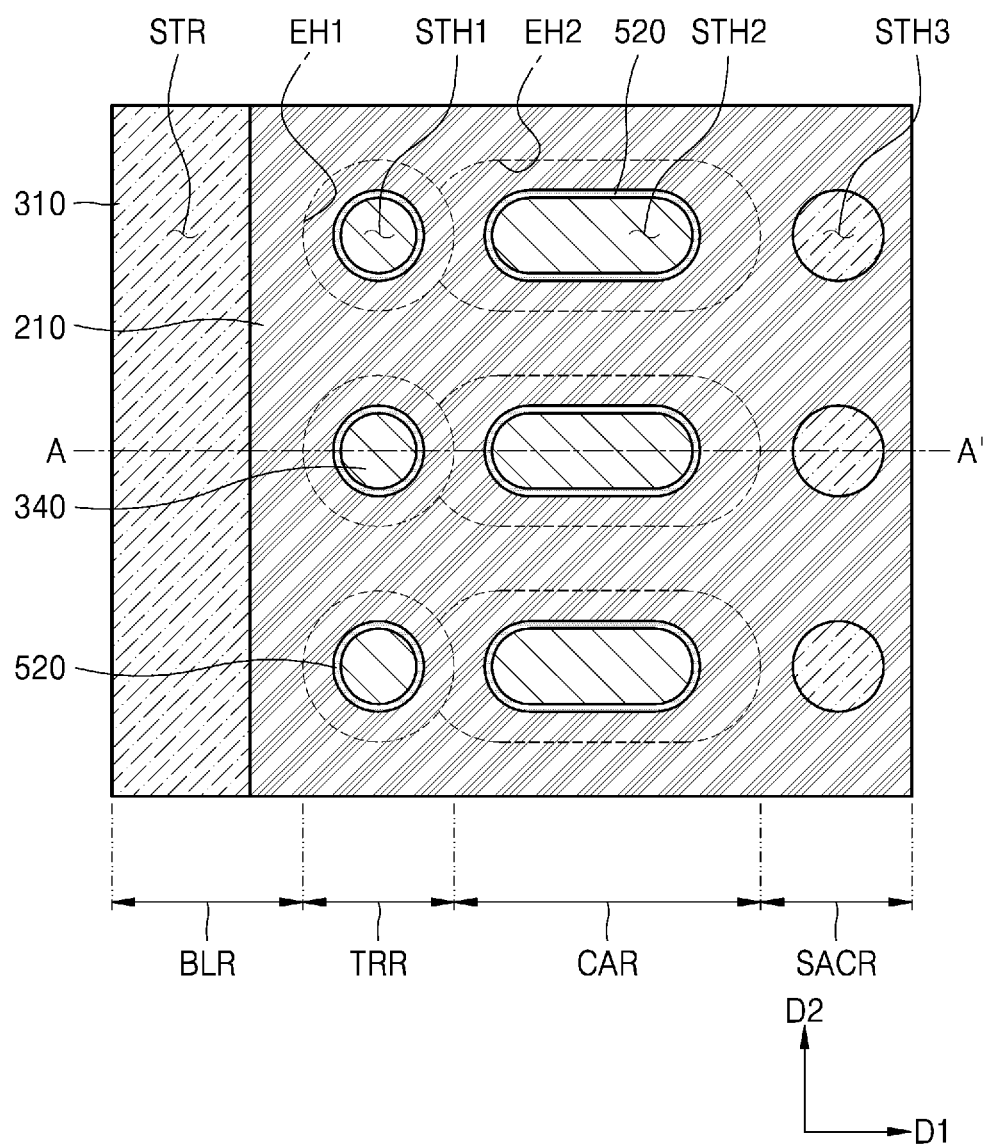
Figure 13C:
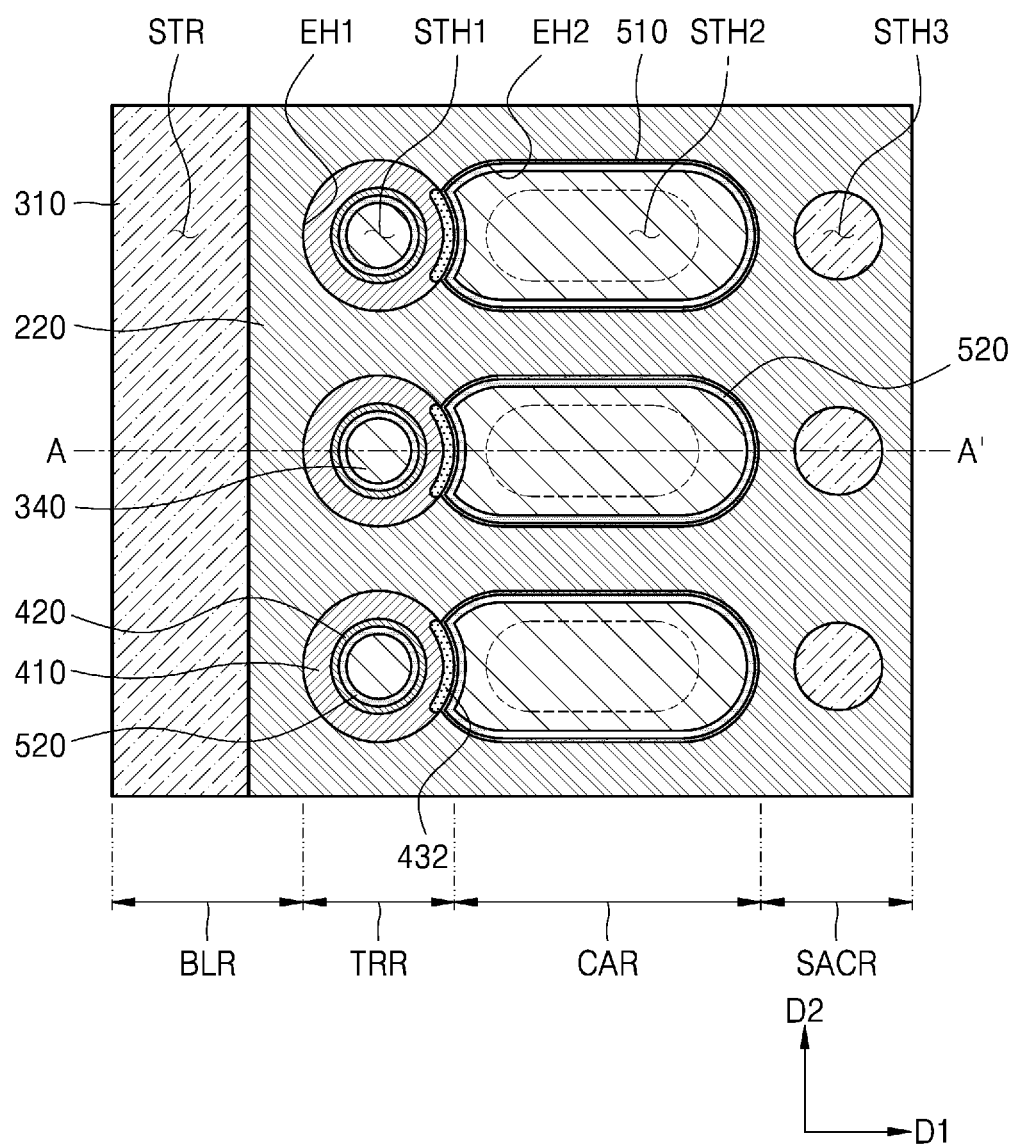

Referring to FIGS. 13A to 13C, a second dielectric layer 520 may be formed to cover an inner sidewall of the first stack hole STH1, an inner sidewall of the second stack hole STH2, and an inner surface of the second extension space EH2. The second dielectric layer 520 may include at least one material selected from among a ferroelectric material and a high-k dielectric material, each having a dielectric constant which is higher than that of silicon oxide. In some embodiments, the gate dielectric layer may include at least one material selected from among hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxide nitride (ZrON), zirconium silicon oxide nitride (ZrSiON), tantalum oxide (TaO), titanium oxide (TiO), barium strontium titanium oxide (BaSrTiO), barium titanium oxide (BaTiO), lead zirconate titanate (PZT), tantalic acid strontium bismuth (STB), bismuth iron oxide (BFO), strontium titanium oxide (SrTiO), yttrium oxide (YO), aluminum oxide (AlO), and lead scandium tantalum oxide (PbScTaO).

The second dielectric layer 520 may conformally cover a surface of the cell insulation layer 210 and a surface of the first dielectric layer 420 disposed on an inner sidewall of the first stack hole STH1. The first dielectric layer 420 and a portion of the second dielectric layer 520 covering the first dielectric layer 420 may configure the gate dielectric layer of the cell transistor. In some embodiments, each of the first dielectric layer 420 and the second dielectric layer 520 may perform a function of each of a high-k dielectric layer and an interfacial layer of the gate dielectric layer of the cell transistor.

The second dielectric layer 520 may conformally cover a surface of the lower electrode layer 510 disposed on the inner sidewall of the second extension space EH2 and a surface of the cell insulation layer 210 in the second stack hole STH2. A portion of the second dielectric layer 520 covering the lower electrode layer 510 may be a capacitor dielectric layer of the cell capacitor. Like a method of forming the preliminary lower electrode layer 510L described above with reference to FIGS. 11A to 11C, the second dielectric layer 520 may be formed to cover a surface of the lower electrode layer 510 disposed on the inner sidewall of the second extension space EH2 having a relatively low aspect ratio, and thus, the second dielectric layer 520 may be easily formed.

Subsequently, a fourth sacrificial layer 340 may be filled into the first stack hole STH1, the second extension space EH2, and the second stack hole STH2. The fourth sacrificial layer 340 may include a material having an etch selectivity with respect to the cell insulation layer 210 and the cell sacrificial layer 220.

Figure 14A:
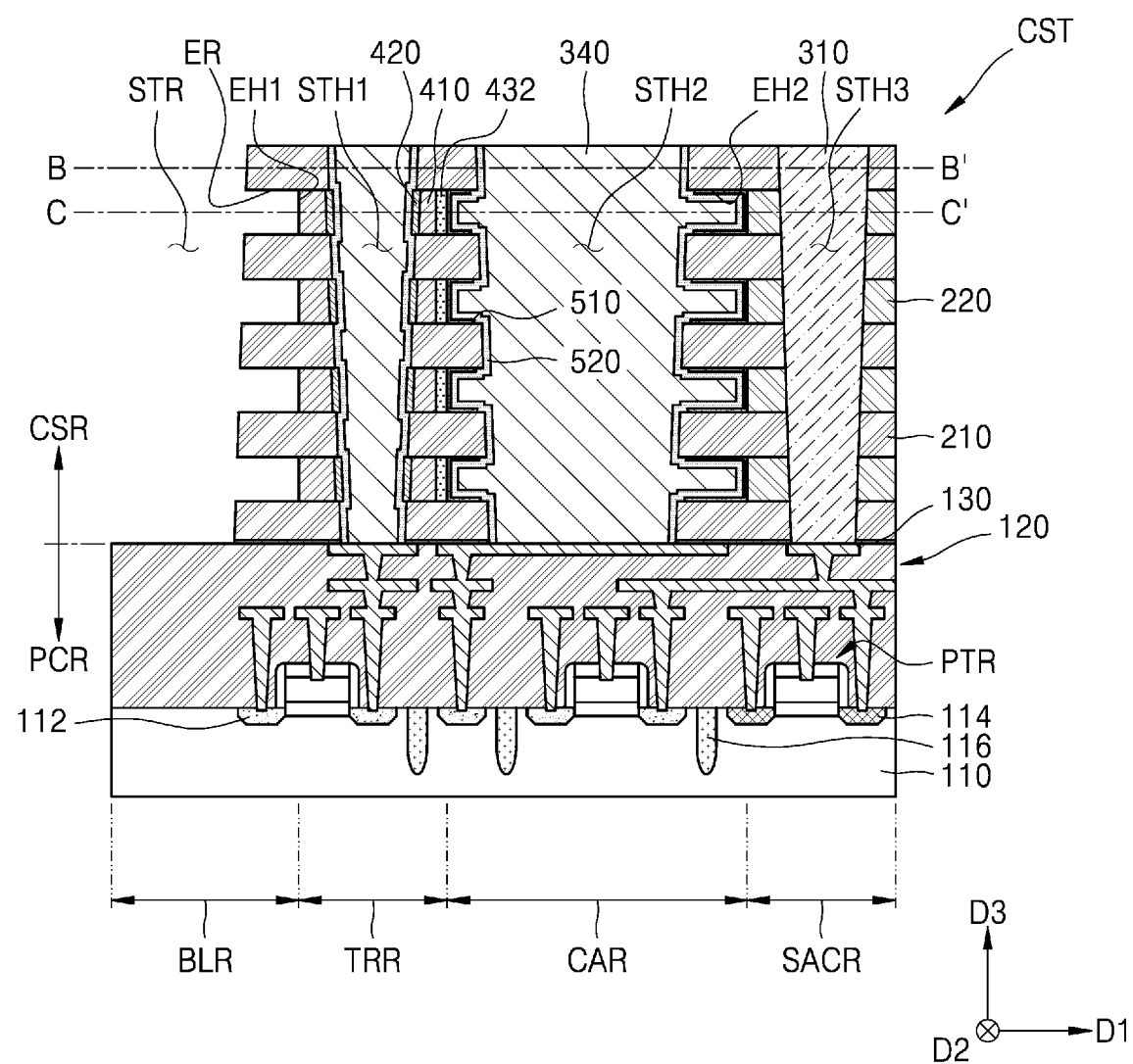
Figure 14B:
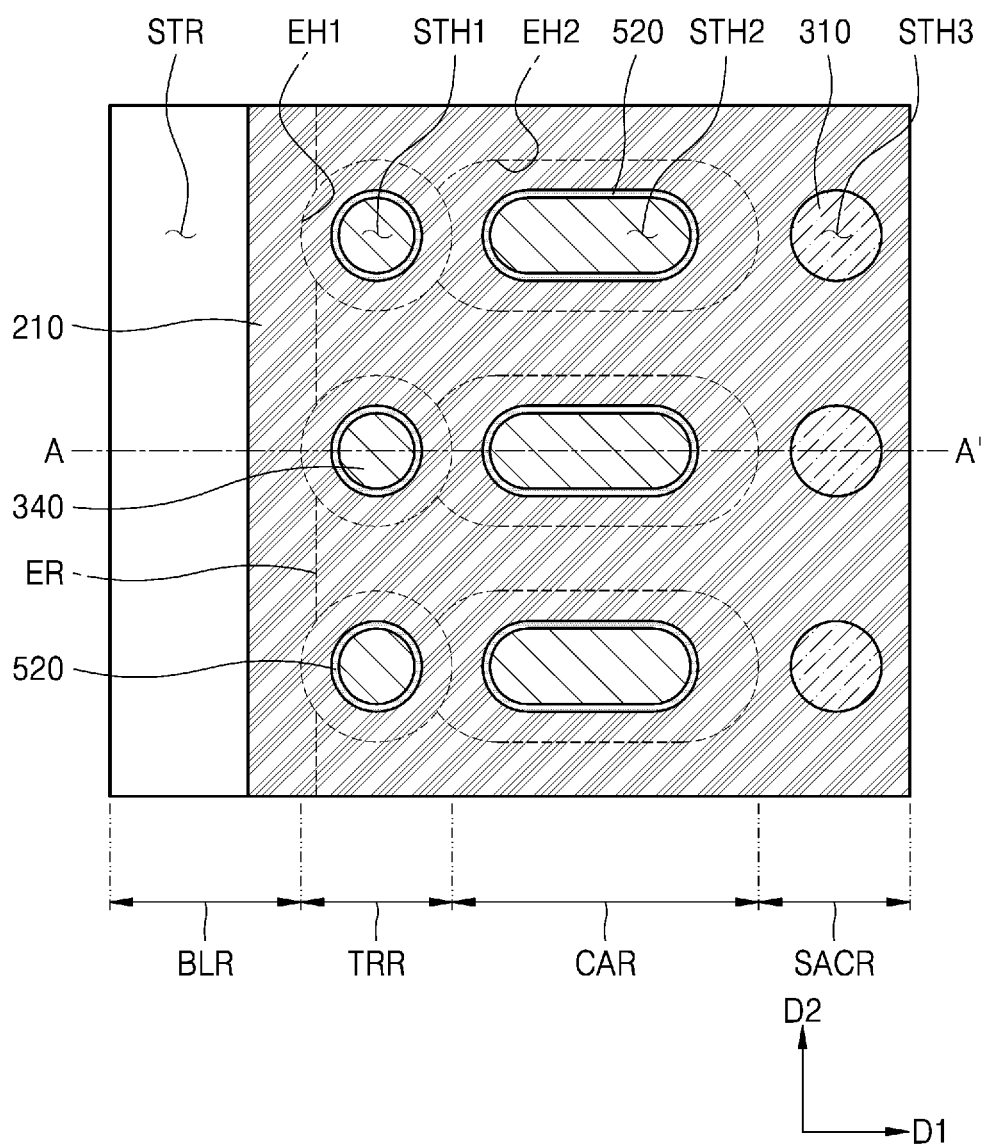
Figure 14C:
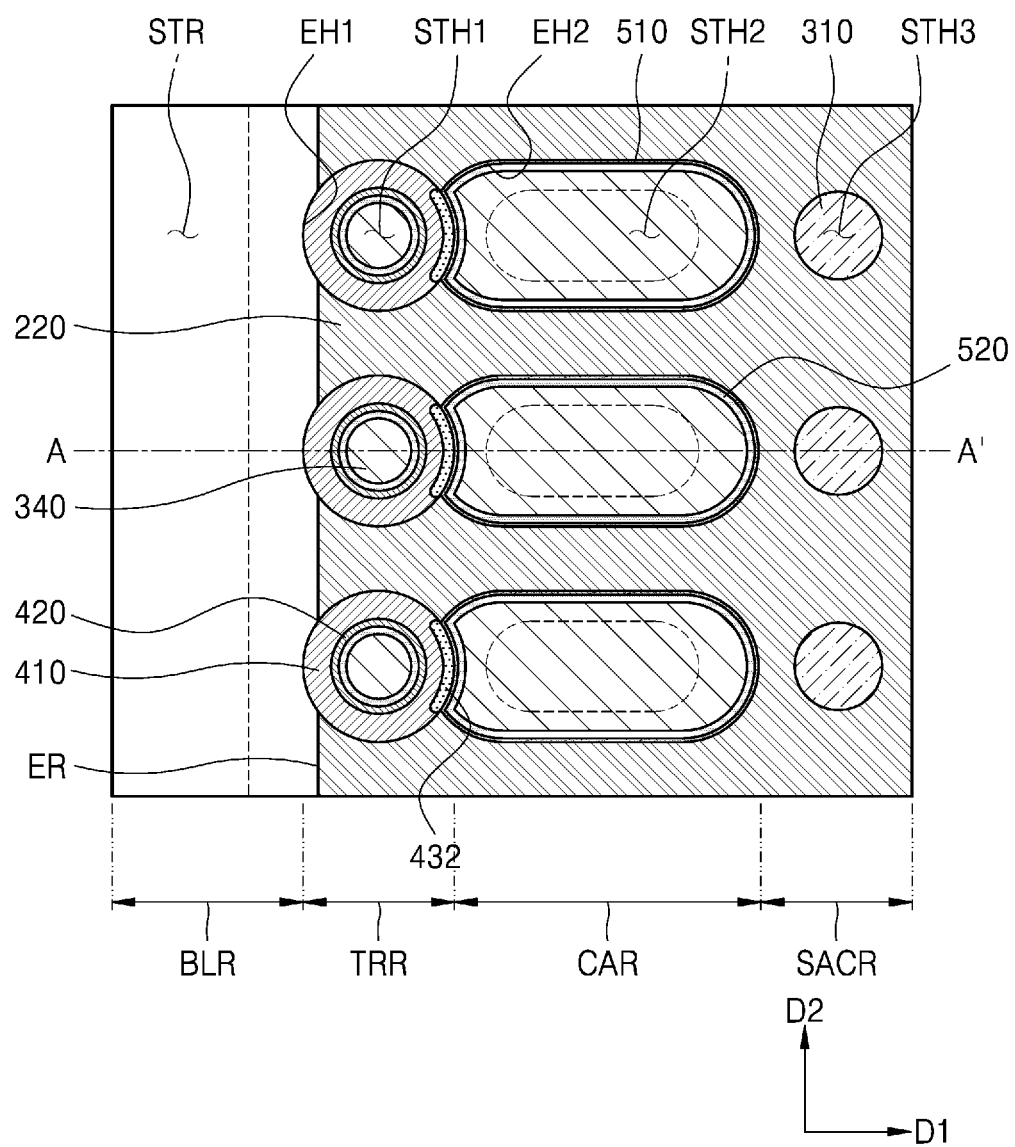

Referring to FIGS. 14A to 14C, a portion of the first sacrificial layer 310 filled into the stack recess STR may be removed, and then, by removing a portion of the cell sacrificial layer 220 exposed through the stack recess STR, a plurality of recess extension spaces ER in the stack recess STR may be formed. The plurality of recess extension spaces ER may be formed by removing the portion of the cell sacrificial layer 220 exposed through the stack recess STR so that the channel layer 410 is exposed.

Figure 15A:
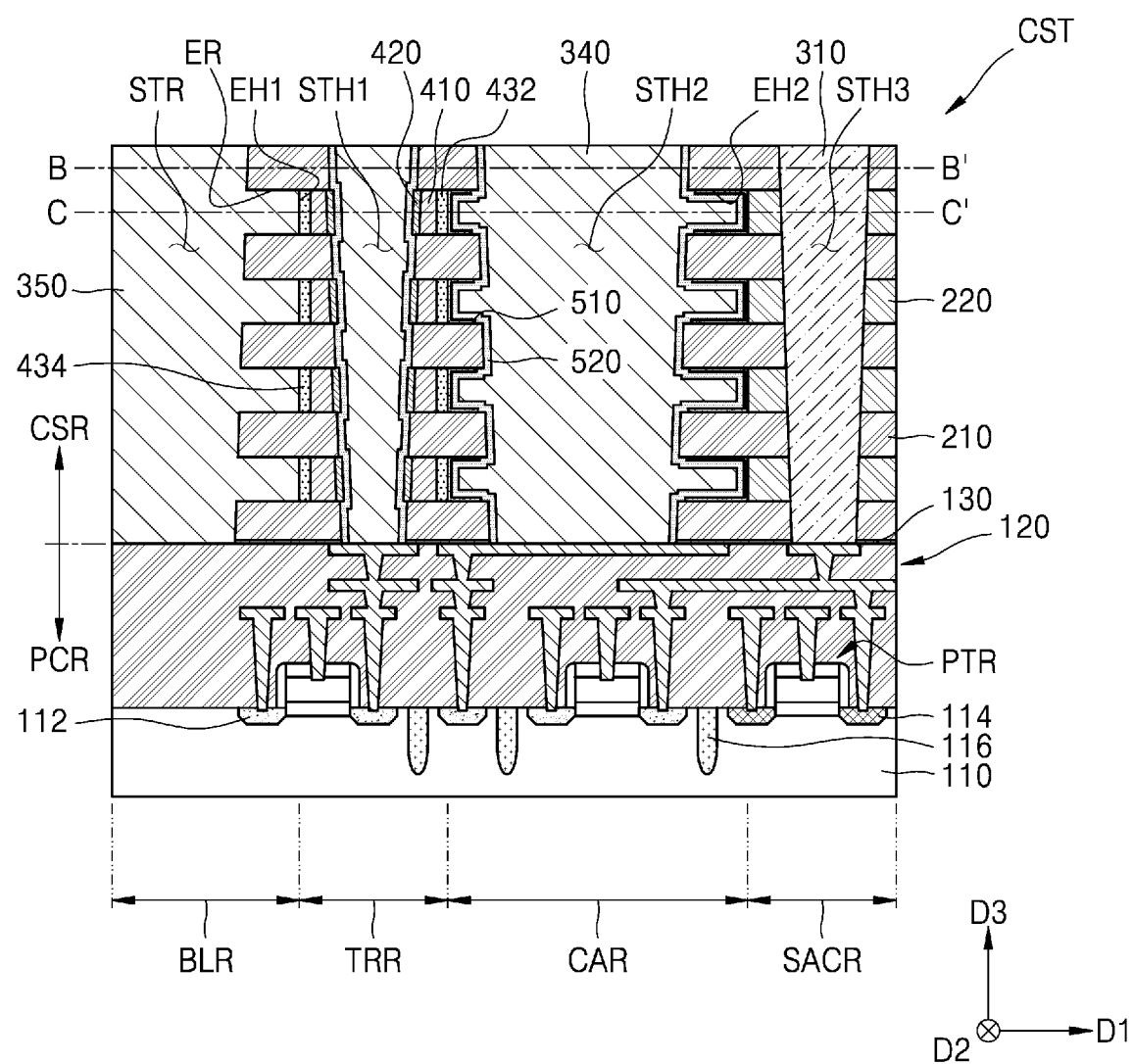
Figure 15B:
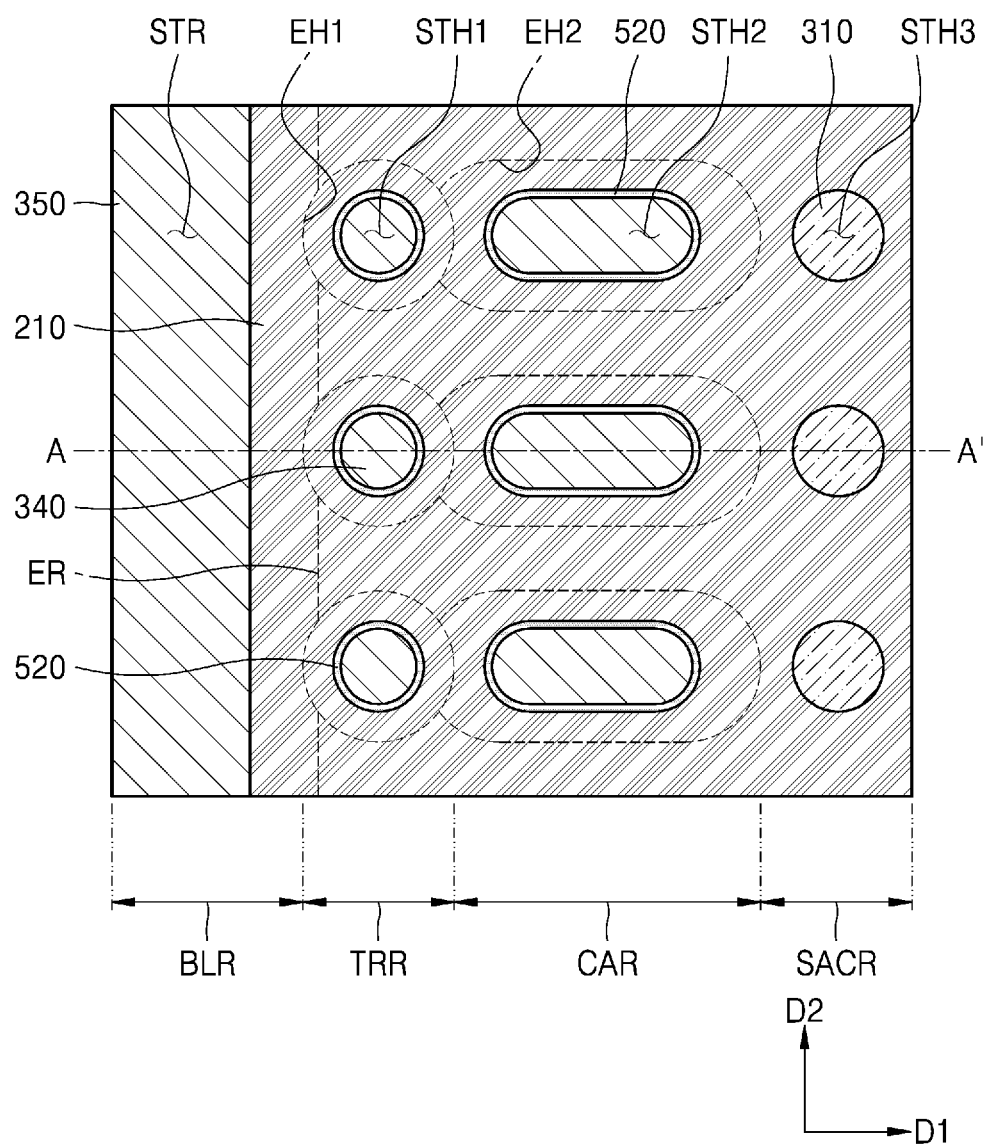
Figure 15C:
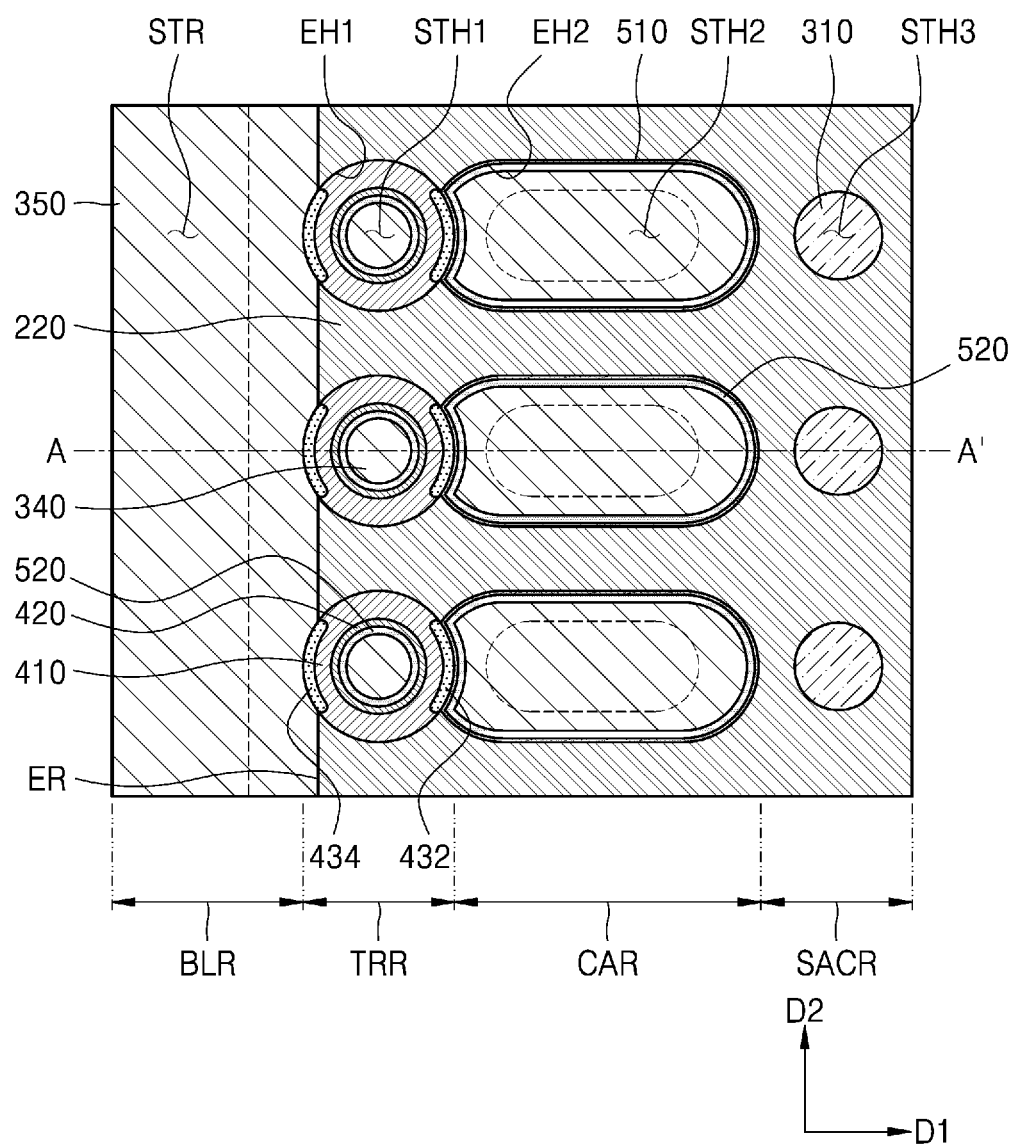

Referring to FIGS. 15A to 15C, a second cell impurity region 434 may be formed by implanting impurities into a portion adjacent to a surface of the channel layer 410 exposed through the recess extension space ER. The second cell impurity region 434 may be formed adjacent to an inner sidewall of the channel layer 410 facing the stack recess STR. For example, the second cell impurity region 434 may be formed as an n+ region.

In some embodiments, the second cell impurity region 434 may be omitted.

Subsequently, a fifth sacrificial layer 350 may be filled into the recess extension space ER and the stack recess STR. The fifth sacrificial layer 350 may include a material having an etch characteristic which is the same as or similar to that of the fourth sacrificial layer 340.

Figure 16A:
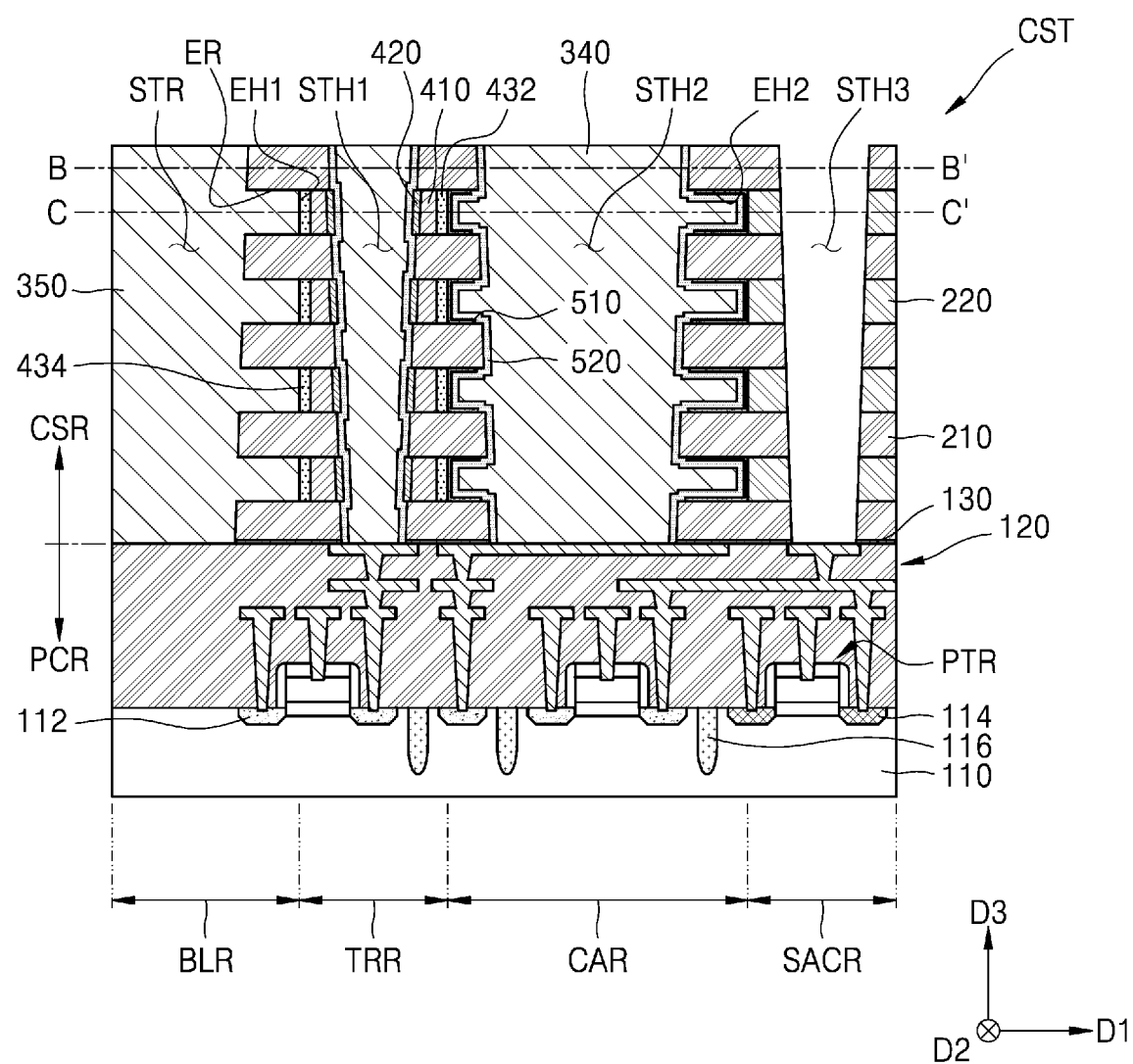
Figure 16B:
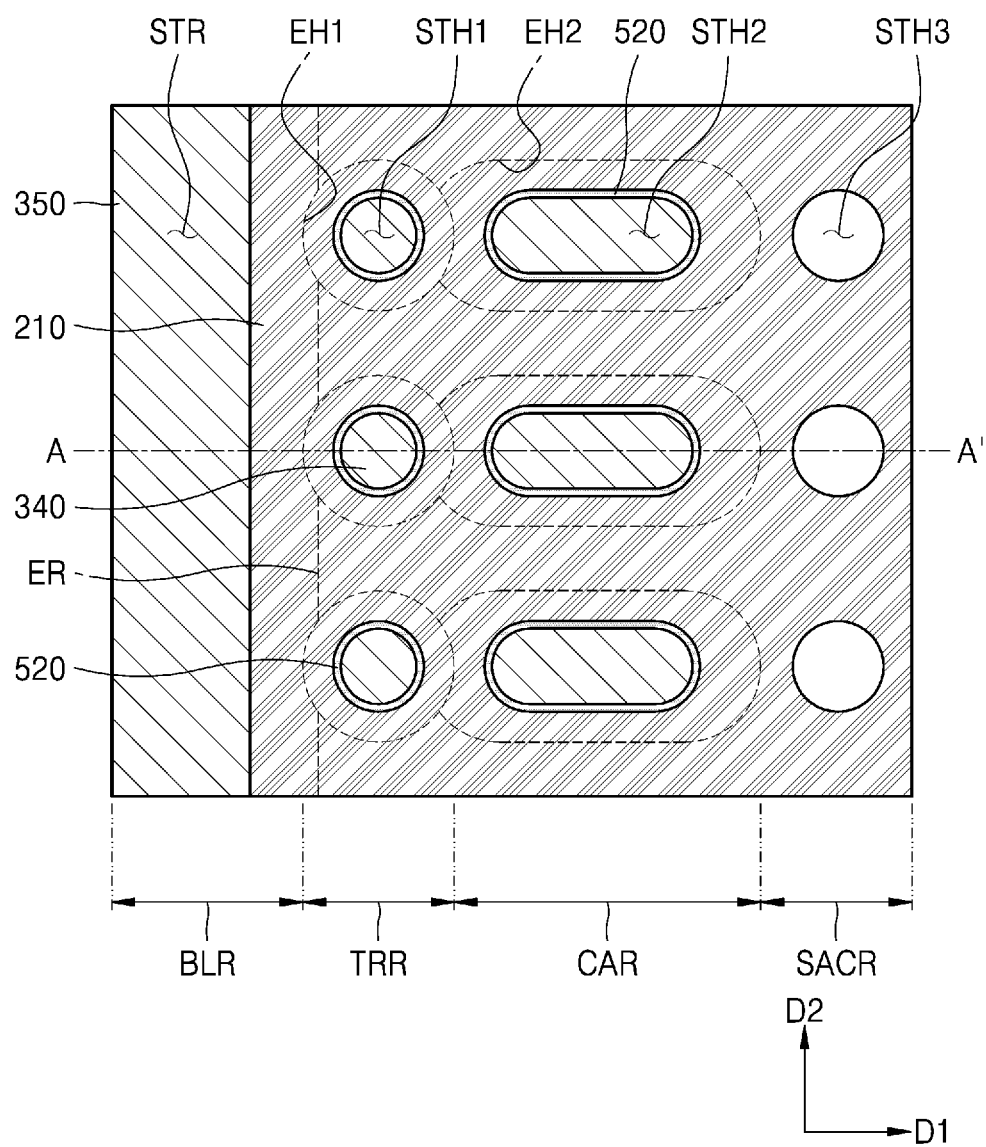
Figure 16C:
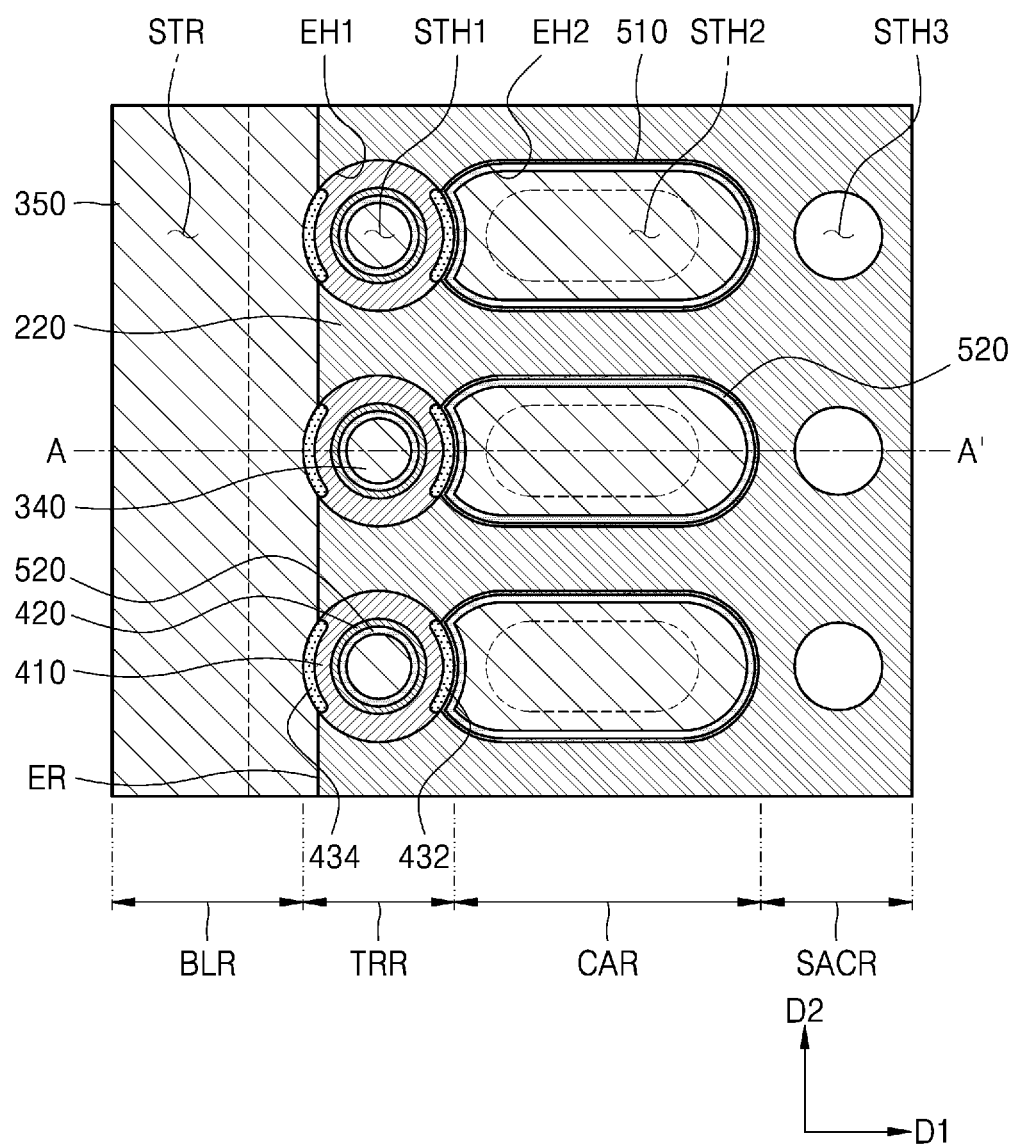

Referring to FIGS. 16A to 16C, a portion of a first sacrificial layer (310 of FIG. 15A) filled into the third stack hole STH3 may be removed.

Figure 17A:
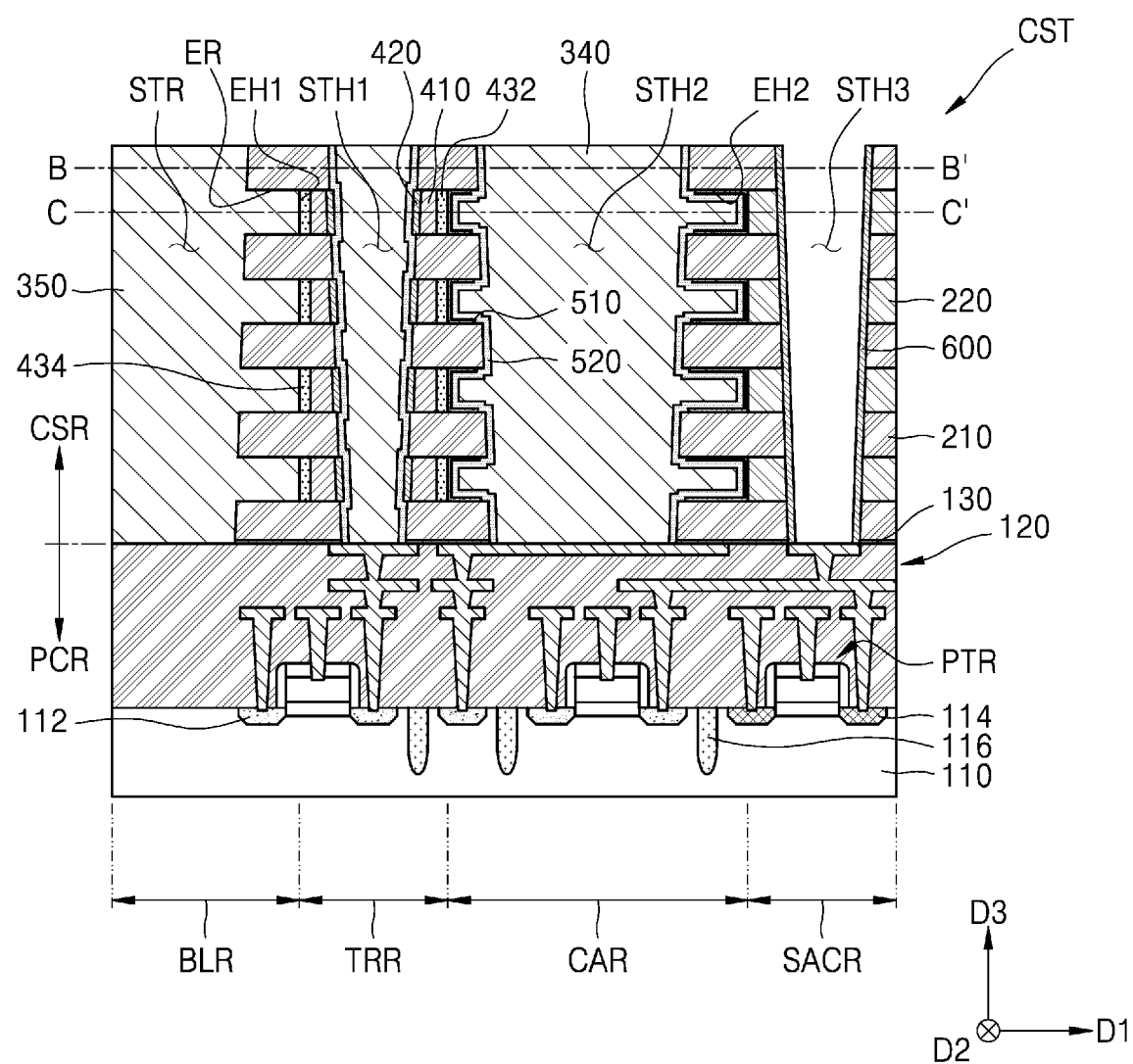
Figure 17B:
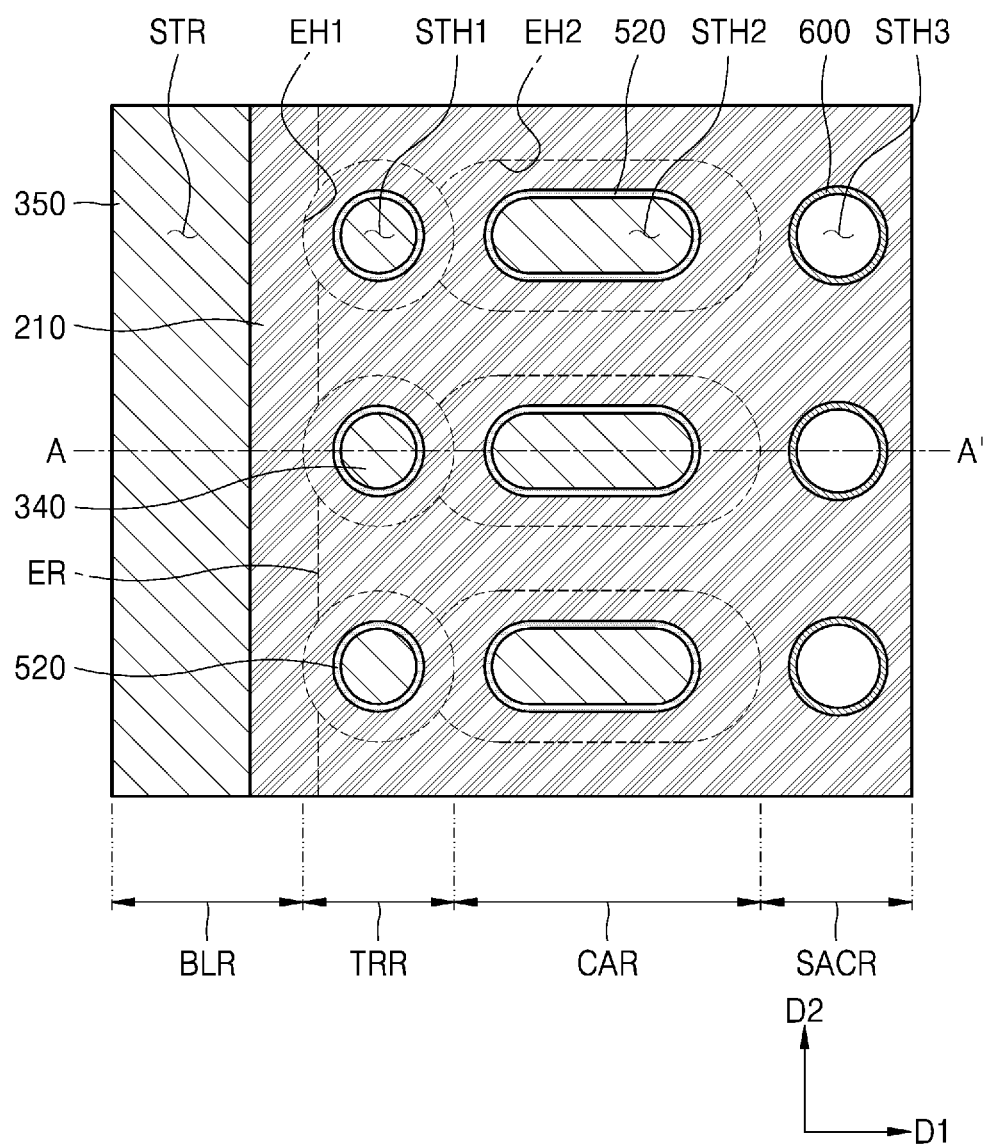
Figure 17C:
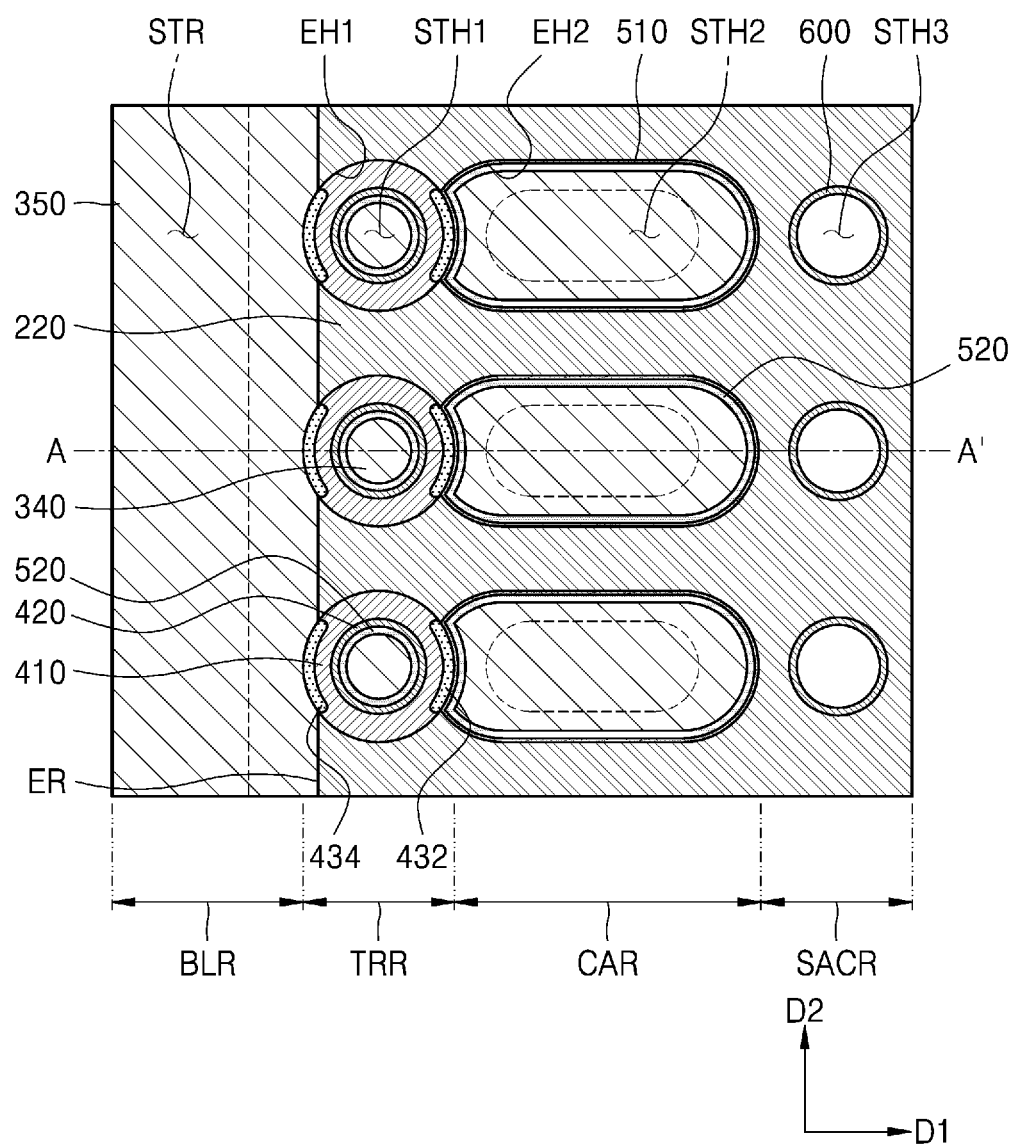

Referring to FIGS. 17A to 17C, a sidewall insulation layer 600 covering an inner sidewall of the third stack hole STH3 may be formed. The sidewall insulation layer 600 may include, for example, a material including at least one of silicon oxide, silicon nitride, and silicon oxynitride.

A preliminary insulation layer conformally covering an inner sidewall and a bottom surface of the third stack hole STH3 and a top surface of the cell stack structure CST may be formed, and then, the sidewall insulation layer 600 may be formed by removing a portion of the preliminary insulation layer covering the bottom surface of the third stack hole STH3 and a portion of the preliminary insulation layer covering the top surface of the cell stack structure CST.

Figure 18A:
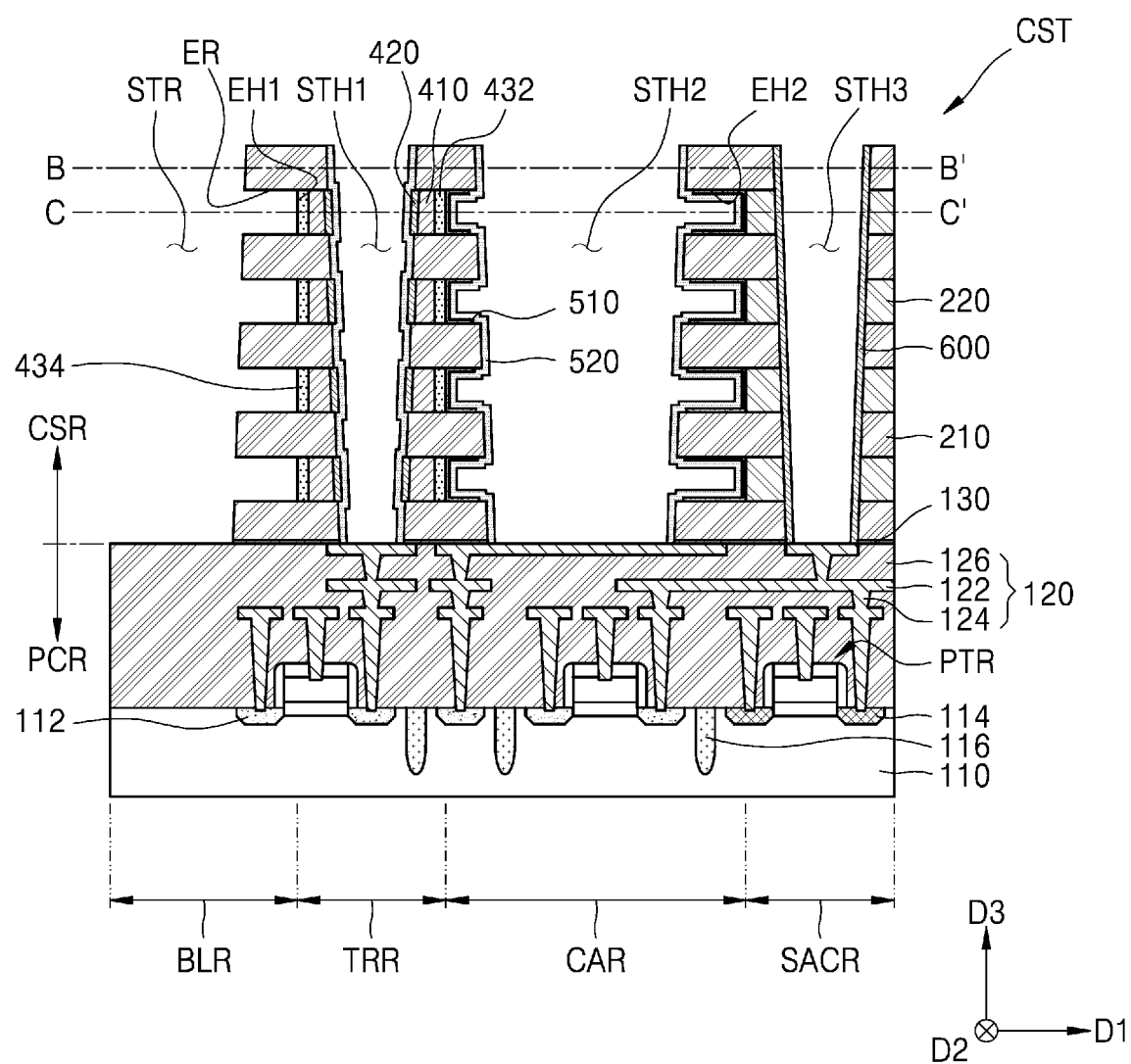
Figure 18B:
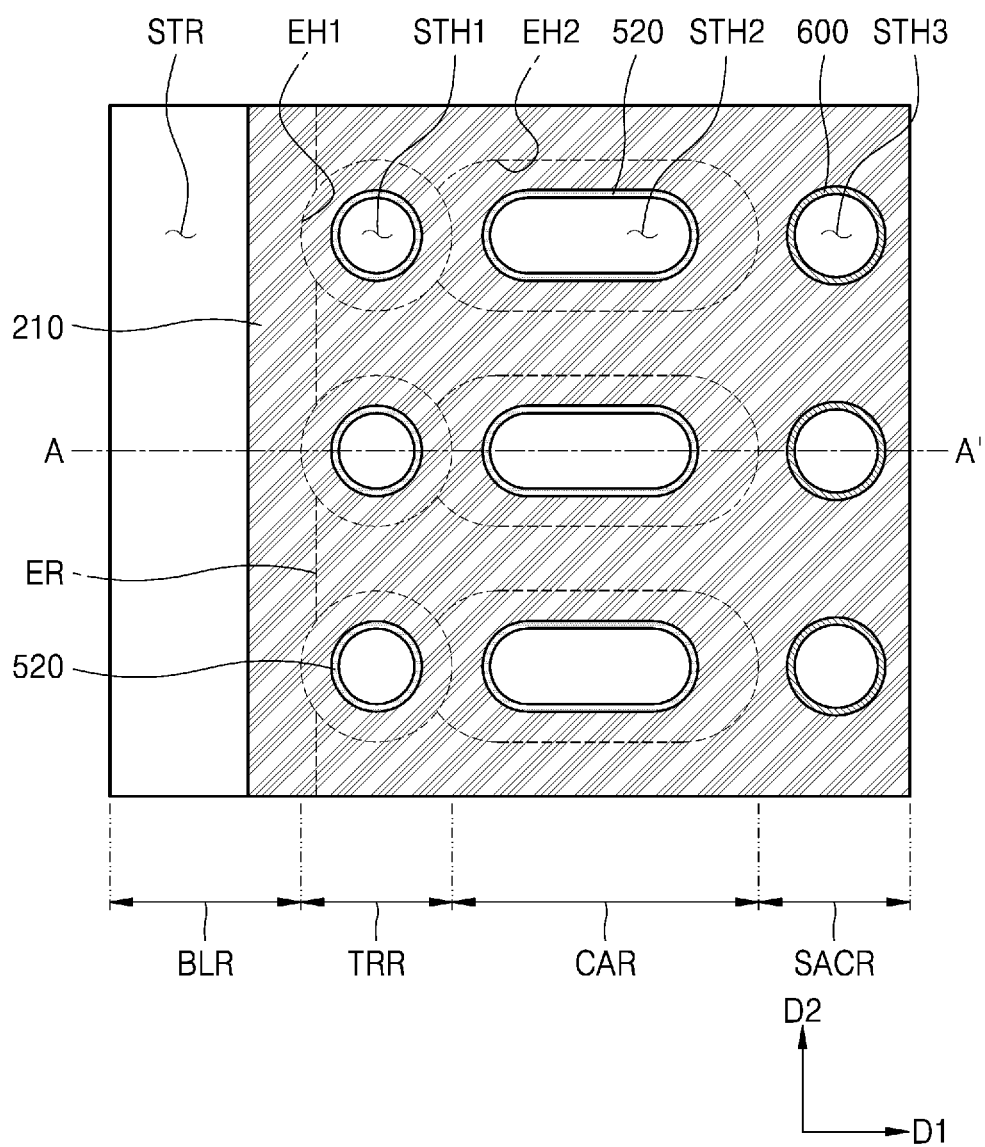
Figure 18C:
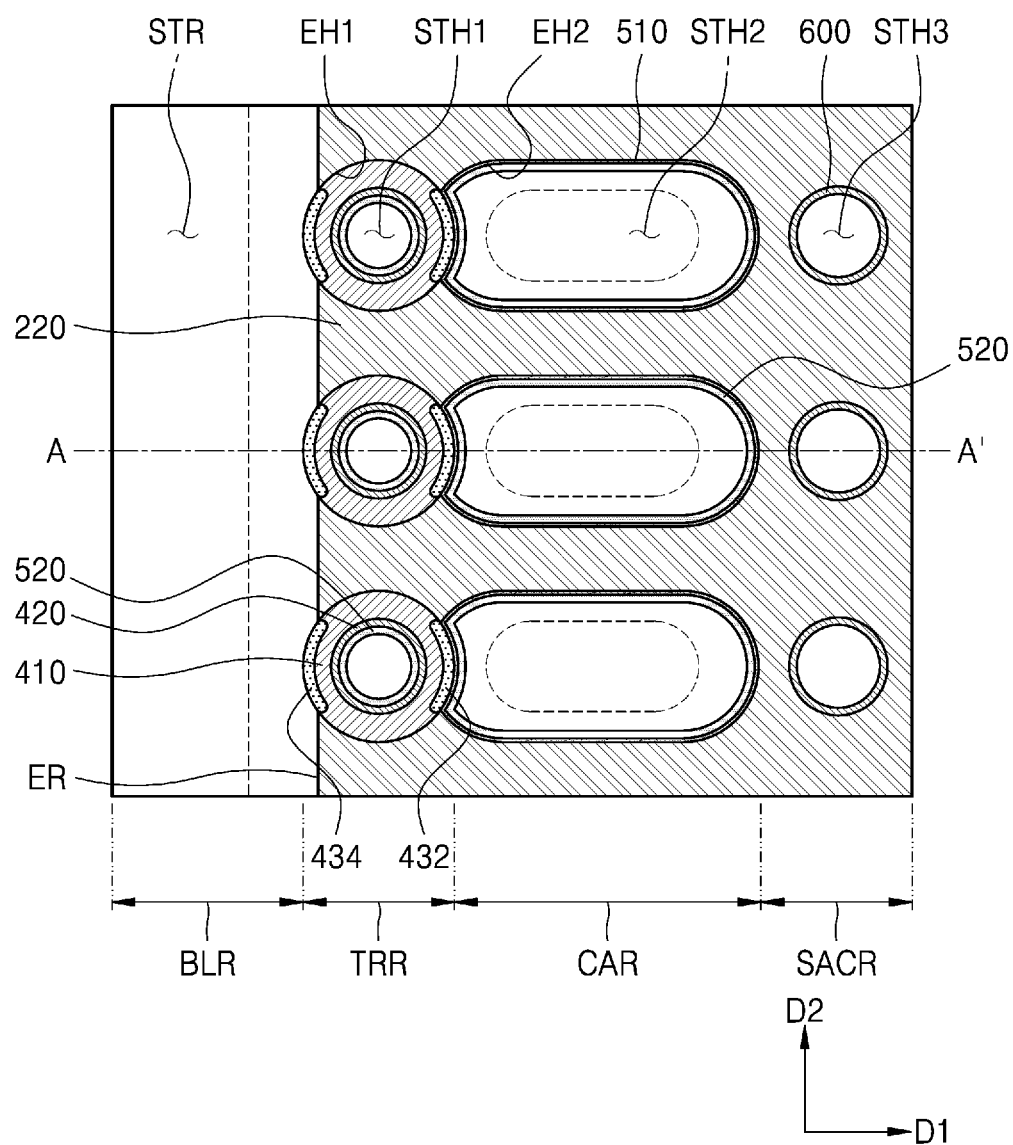

Referring to FIGS. 18A to 18C, a fifth sacrificial layer (350 of FIG. 17A) filled into the stack recess STR and the recess extension space ER and a fourth sacrificial layer (340 of FIG. 17A) filled into the first stack hole STH1, the second stack hole STH2, and the second extension space EH2 may be removed.

Because the fifth sacrificial layers 350 filled into the stack recess STR and the recess extension space ER are removed, the second cell impurity region 434 may be exposed at the recess extension space ER of the stack recess STR. A portion of the fourth sacrificial layer 340 filled into the first stack hole STH1, the second stack hole STH2, and the second extension space EH2 may be removed, and thus, a portion of the second dielectric layer 520 may be exposed at a sidewall of the first stack hole STH1, a sidewall of the second stack hole STH2, and an inner surface of the second extension space EH2. A portion of the fourth sacrificial layer 340 filled into the first stack hole STH1 and the second stack hole STH2 may be removed, and thus, the peripheral circuit wiring 122 may be exposed at a bottom surface of the first stack hole STH1 and a bottom surface of the second stack hole STH2.

Figure 19A:
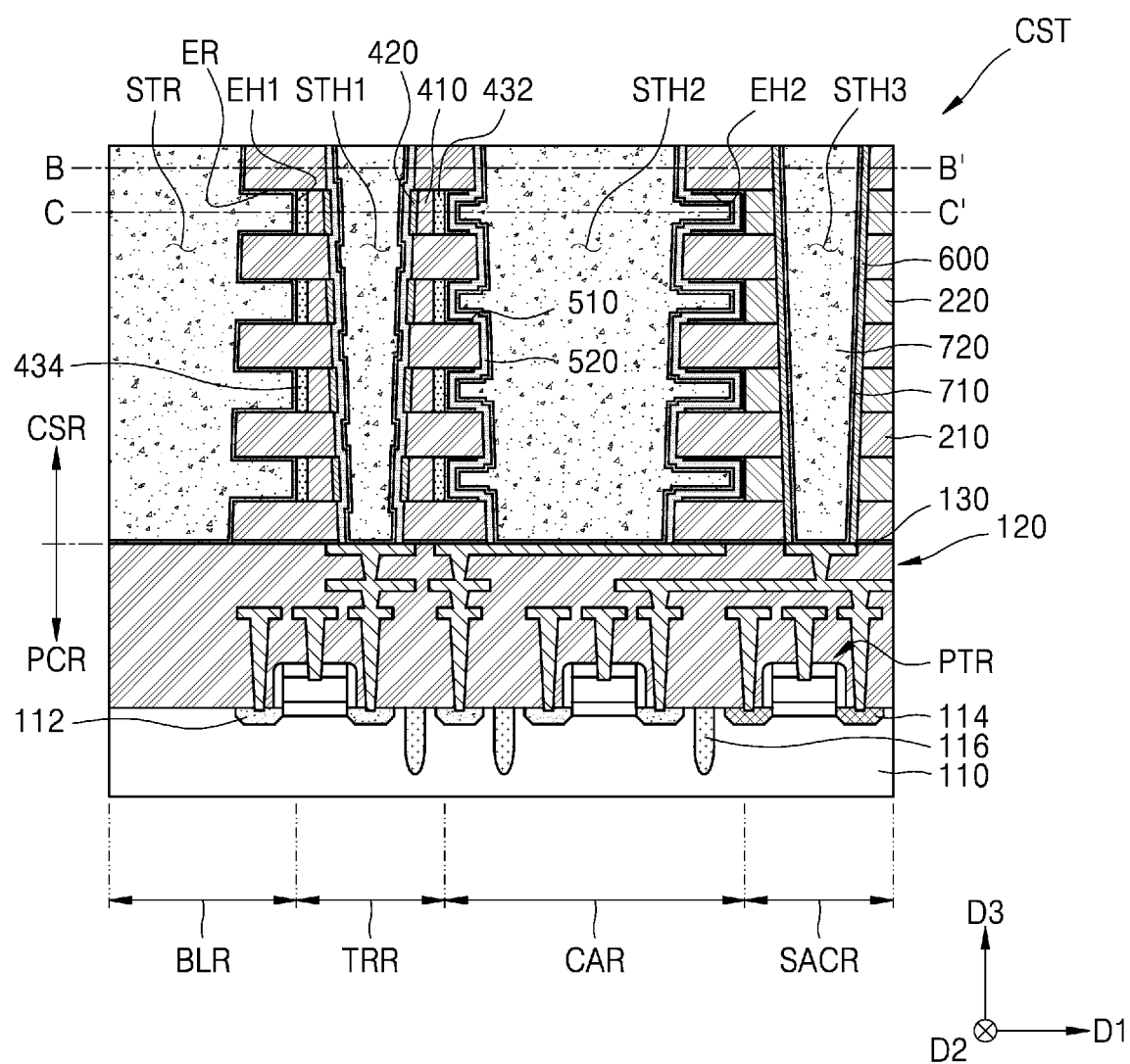
Figure 19B:
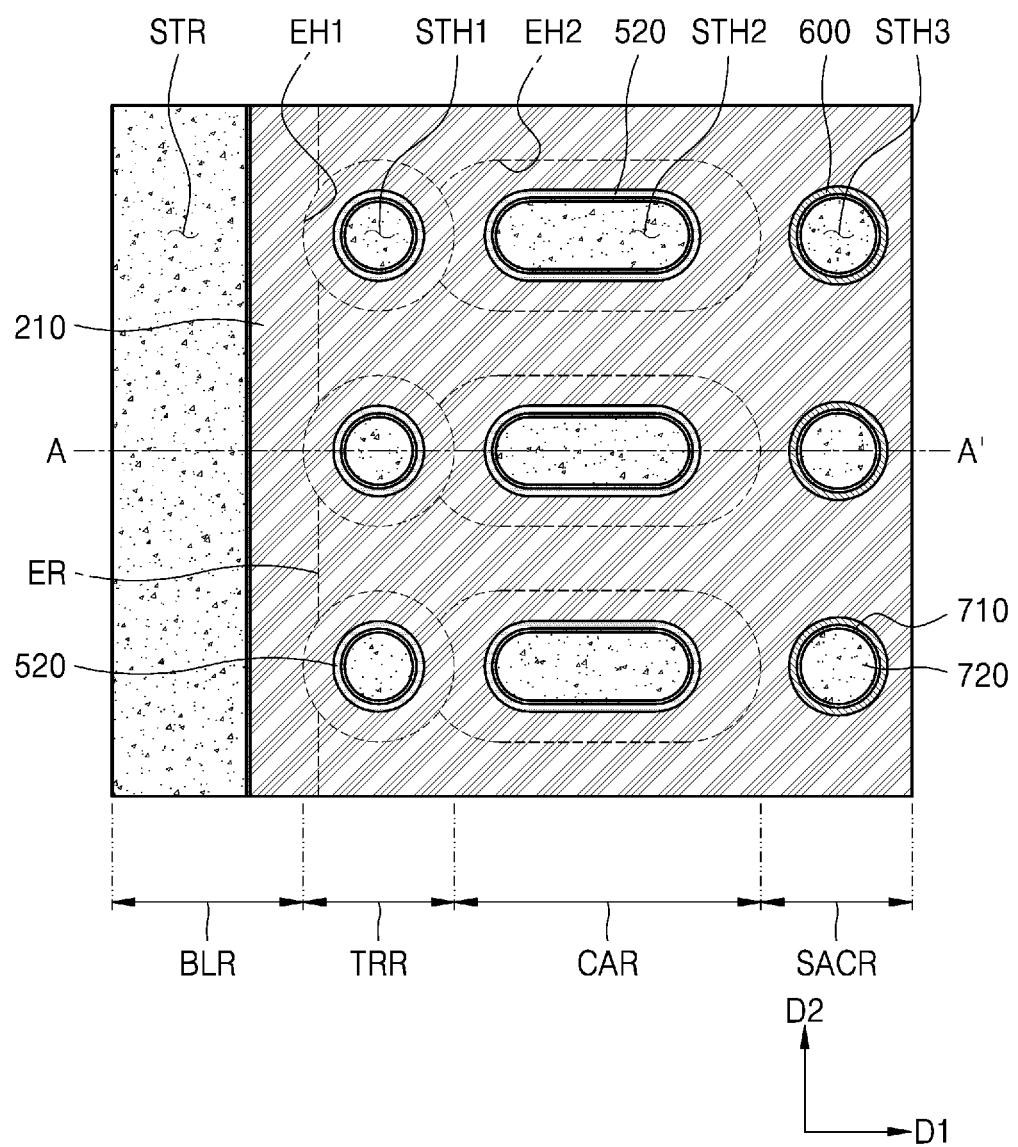
Figure 19C:
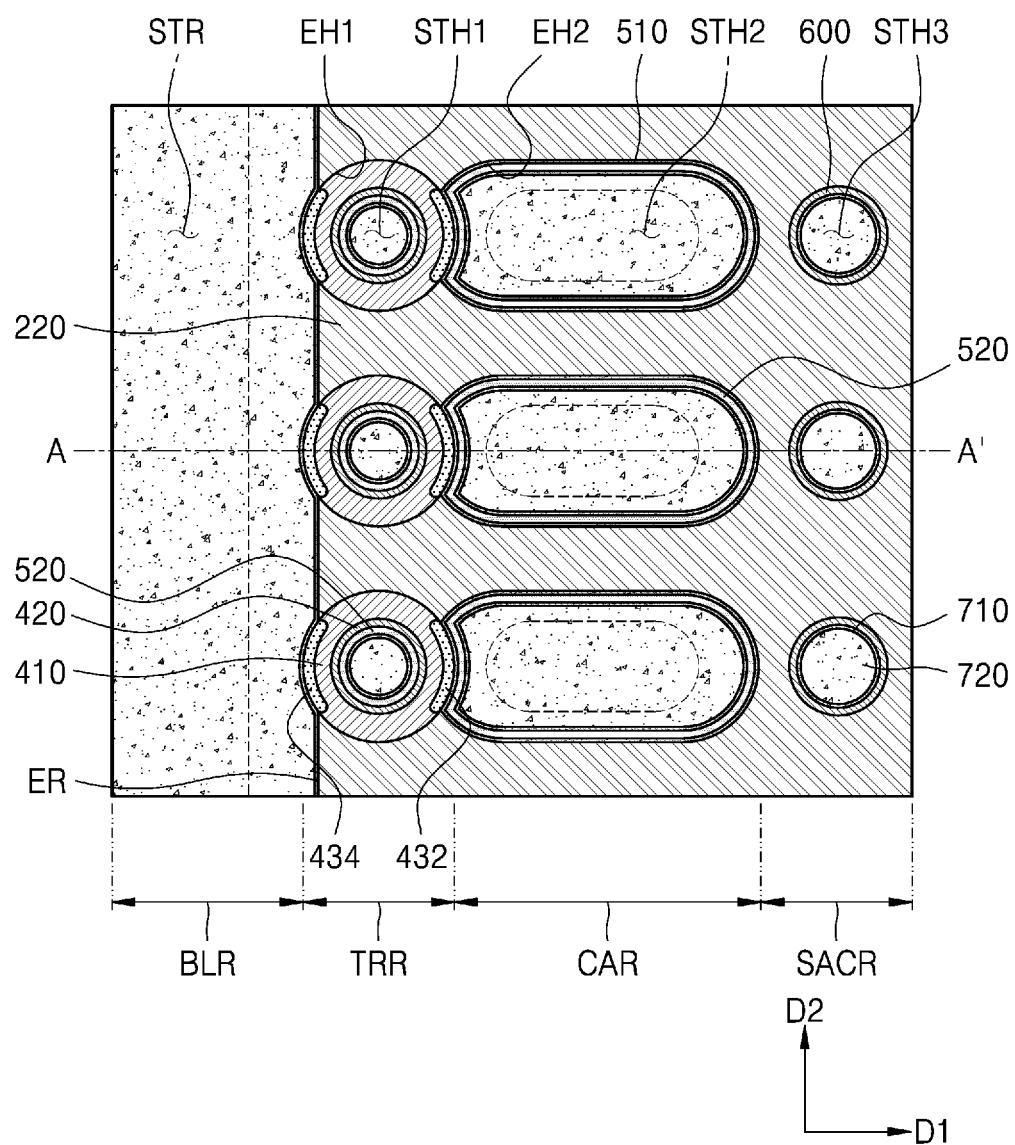

Referring to FIGS. 19A to 19C, a conductive barrier layer 710 conformally covering an inner surface of each of the stack recess STR, the recess extension space ER, the first stack hole STH1, the second stack hole STH2, the second extension space EH2, and the third stack hole STH3 may be formed. In addition, a conductive charge layer 720 may be filled into the stack recess STR, the recess extension space ER, the first stack hole STH1, the second stack hole STH2, the second extension space EH2, and the third stack hole STH3 to cover the conductive barrier layer 710.

The conductive barrier layer 710 may include metal, conductive metal nitride, conductive metal silicide, or a combination thereof. For example, the conductive barrier layer 710 may include TiN. The conductive barrier layer 710 may include, for example, doped silicon, ruthenium (Ru), ruthenium oxide (RuO), platinum (Pt), platinum oxide (PtO), iridium (Ir), iridium oxide (IrO), SRO(SrRuO), BSRO((Ba,Sr)RuO), CRO(CaRuO), barium ruthenium oxide (BaRuO), La(Sr,Co)O, titanium (Ti), titanium nitride (TiN), tungsten (W), tungsten nitride (WN), tantalum (Ta), tantalum nitride (TaN), titanium aluminum nitride (TiAlN), titanium silicon nitride (TiSiN), tantalum aluminum nitride (TaAlN), tantalum silicon nitride (TaSiN), or a combination thereof. In some embodiments, the conductive charge layer 720 may include W.

Figure 20A:
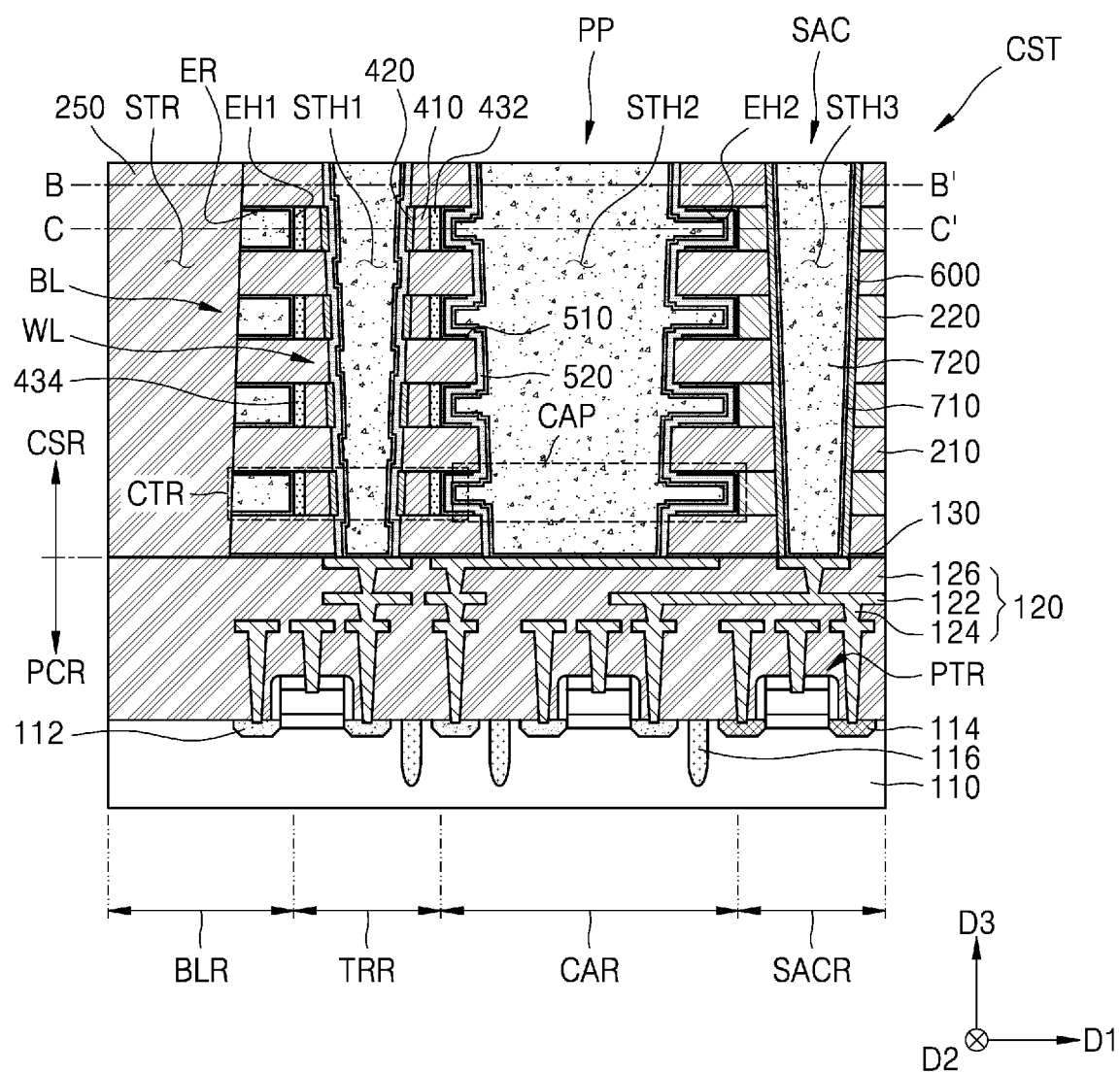
Figure 20B:
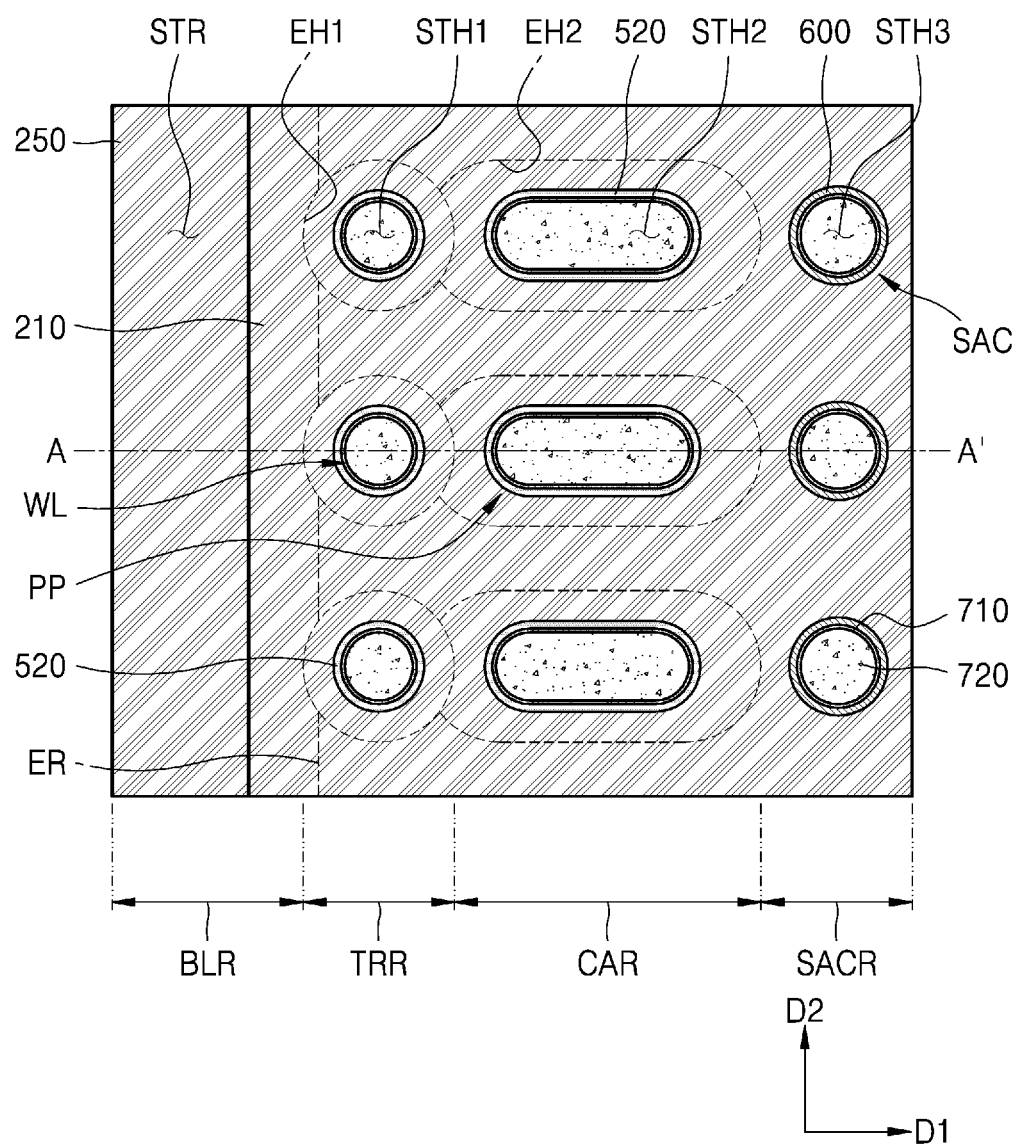
Figure 20C:
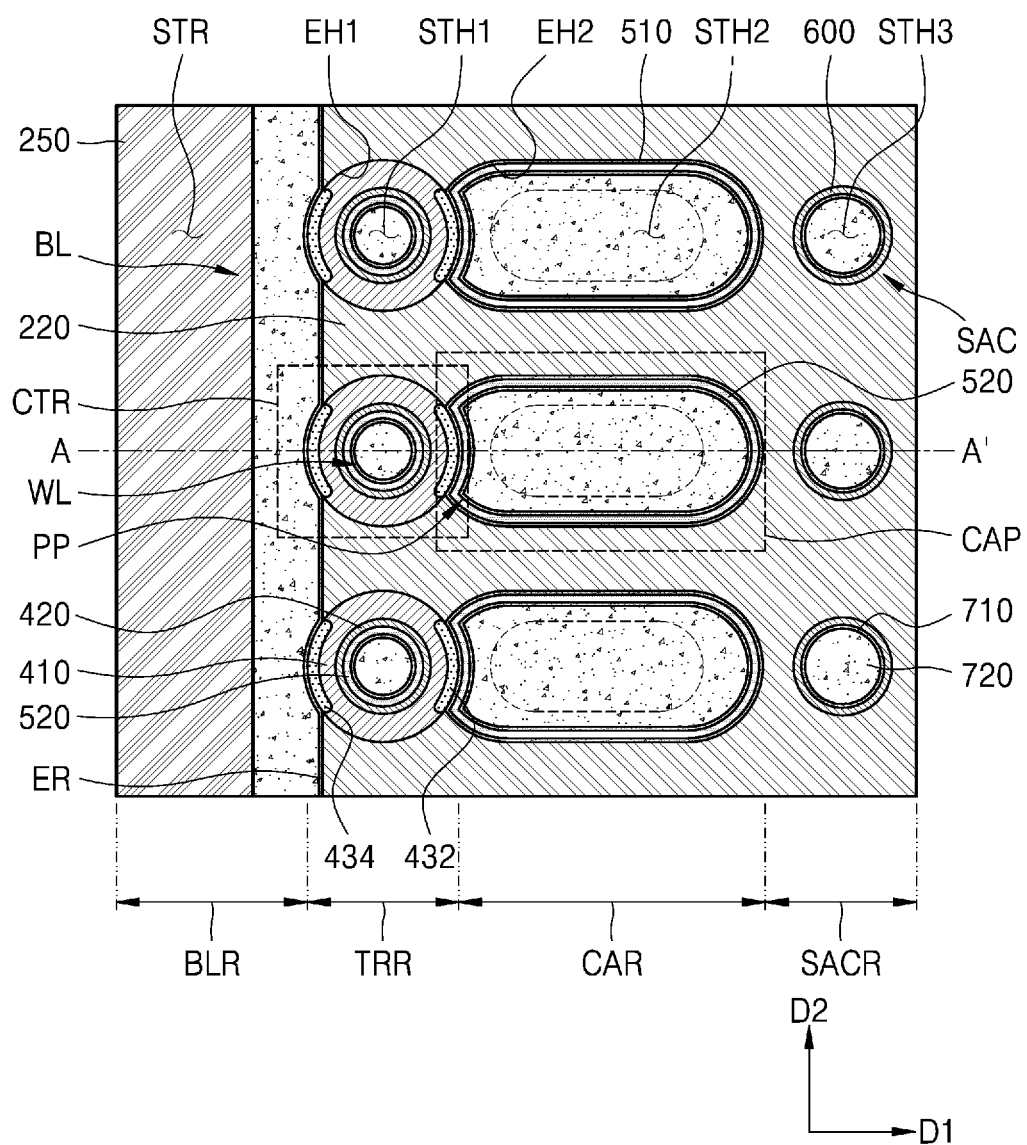

Referring to FIGS. 20A to 20C, by removing a portion of the conductive barrier layer 710 and a portion of the conductive charge layer 720 filled into the stack recess STR, a portion of the conductive barrier layer 710 and a portion of the conductive charge layer 720 filled into different recess extension spaces ER may be separated from each other.

Subsequently, a charge insulation layer 250 filled into the stack recess STR from which a portion of the conductive barrier layer 710 and a portion of the conductive charge layer 720 are removed may be formed. In some embodiments, the charge insulation layer 250 may include silicon oxide.

A portion of the conductive barrier layer 710 and a portion of the conductive charge layer 720 filled into a plurality of recess extension spaces ER may configure a plurality of bit lines BL. The plurality of bit lines BL may be apart from one another in the vertical direction D3 and may extend along the second horizontal direction D2.

A portion of the conductive barrier layer 710 and a portion of the conductive charge layer 720 filled into a plurality of first stack holes STH1 may configure a plurality of word lines WL. The plurality of word lines WL may be apart from one another in the second horizontal direction D2 and may extend in parallel in the vertical direction D3.

A portion of the conductive barrier layer 710 and a portion of the conductive charge layer 720 filled into the second stack hole STH2 and the second extension space EH2 may configure an upper electrode layer PP of the cell capacitor CAP. The upper electrode layer PP may include a first portion filled into the second stack hole STH2 and a plurality of second portions filled into a plurality of second extension spaces EH2. The first portion of the upper electrode layer PP may have an oval shape having a major axis extending in the first horizontal direction D1, or a pillar shape which includes a horizontal cross-sectional surface having a corner-rounded rectangular shape having a major axis extending in the first horizontal direction D1, and extends in the vertical direction D3. The plurality of second portions of the upper electrode layer PP may be apart from one another, and each may have a ring shape surrounding the first portion of the upper electrode layer PP.

A portion of the conductive barrier layer 710 and a portion of the conductive charge layer 720 filled into the third stack hole STH3 may configure a sense amplifier contact SAC.

A word line WL, a portion of the first dielectric layer 420 surrounding the word line WL, a portion of the second dielectric layer 520 surrounding the first dielectric layer 420, the channel layer 410 surrounding a portion of the first dielectric layer 420 and a portion of the second dielectric layer 520, and a bit line BL may configure a cell transistor CTR. The lower electrode layer 510, a portion of the second dielectric layer 520 covering the lower electrode layer 510, and the upper electrode layer PP may configure a cell capacitor CAP. One cell transistor CTR and one cell capacitor CAP connected to each other may configure one memory cell. A plurality of cell capacitors CAP may be disposed apart from one another in the vertical direction D3 to correspond to the plurality of second portions of the upper electrode layer PP and to configure a column.

A portion of the first dielectric layer 420 and a portion of the second dielectric layer 520 surrounding the word line WL may configure a gate dielectric layer of the cell transistor CTR.

The first cell impurity region 432 and the second cell impurity region 434 disposed at both ends of the channel layer 410 may each form an ohmic contact between the channel layer 410 and the lower electrode layer 510 of the cell capacitor CAP and between the channel layer 410 and the bit line BL and may each perform a function of a source/drain region of the cell transistor CTR.

Figure 21A:
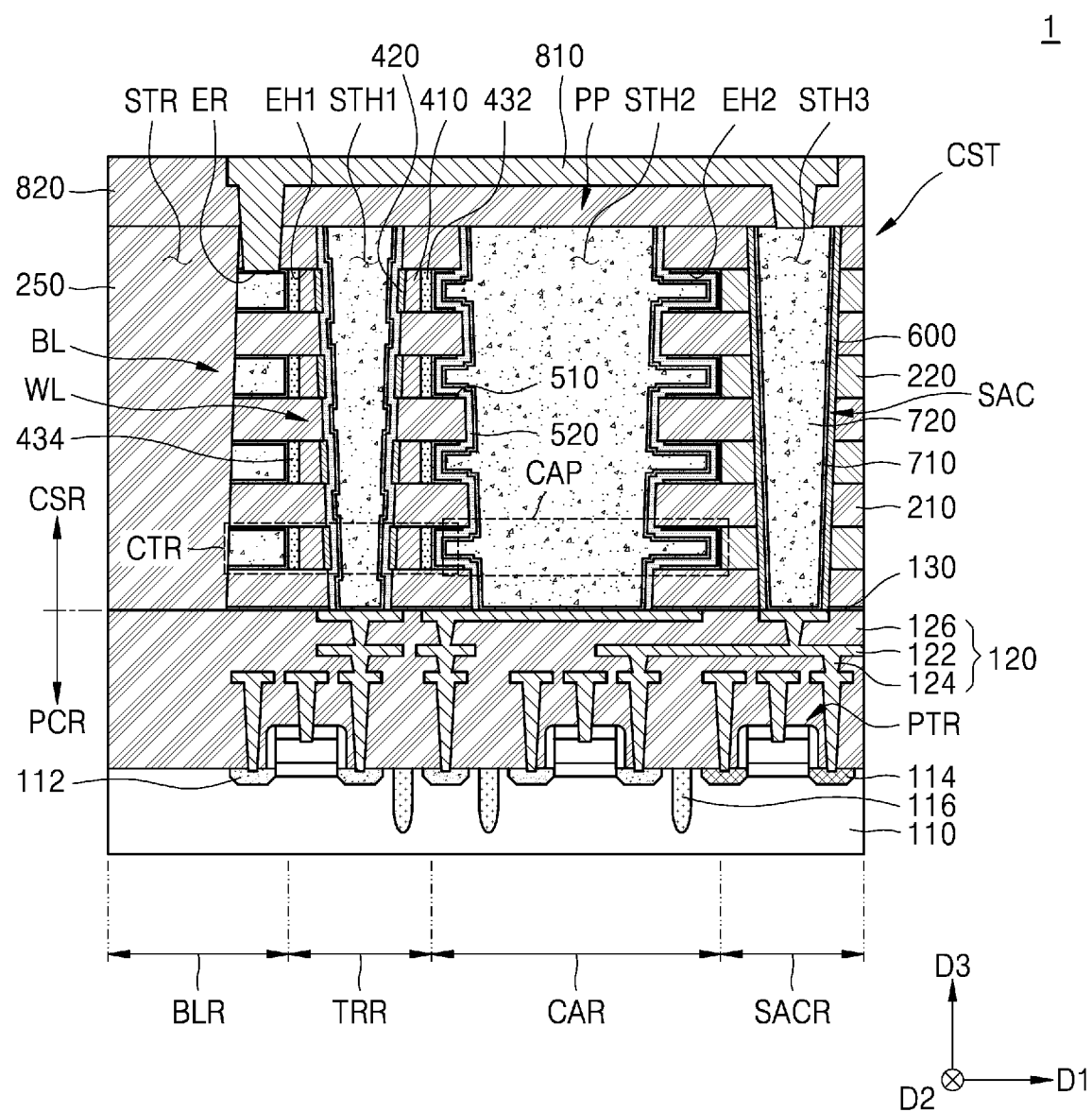
FIG. 21A is a diagram illustrating a semiconductor memory device according to an embodiment.
Figure 21B:
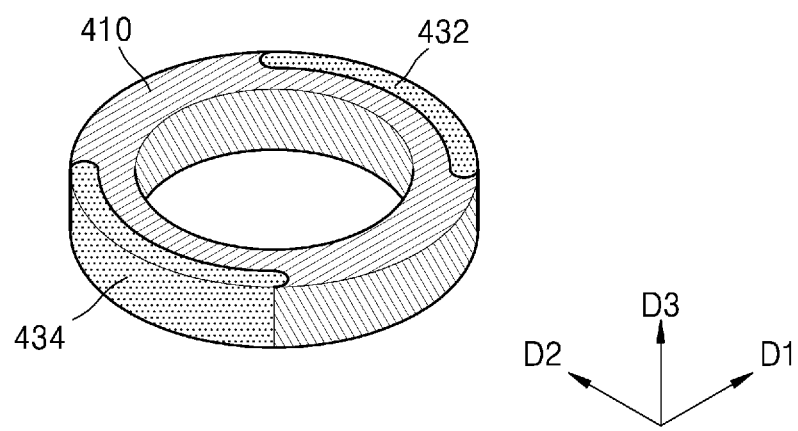
FIG. 21B is a perspective view of a channel layer of the semiconductor memory device according to an embodiment.
Figure 21C:
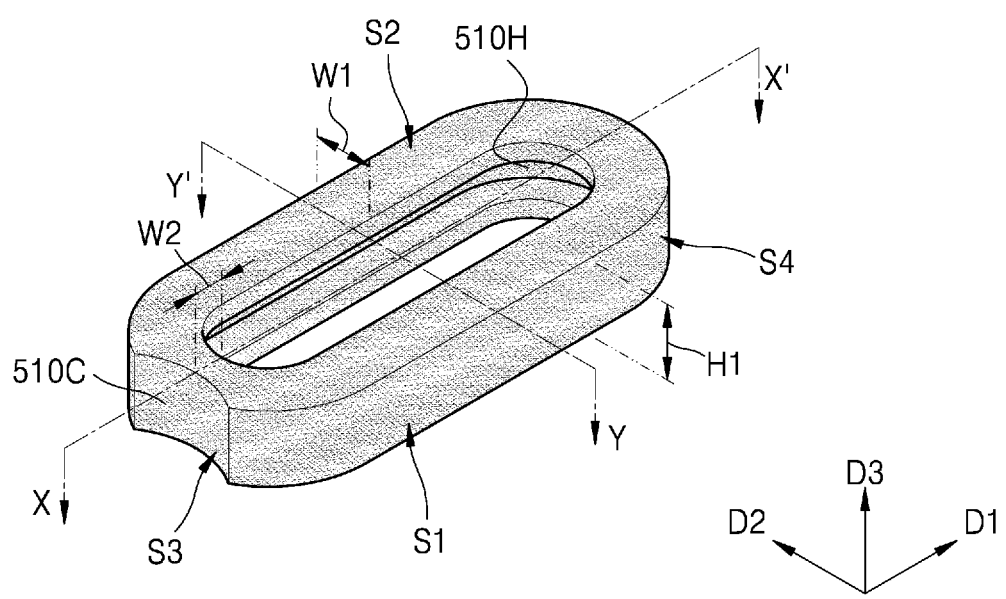
FIG. 21C is an exploded perspective view illustrating a lower electrode layer of the semiconductor memory device according to an embodiment.
Figure 21D:
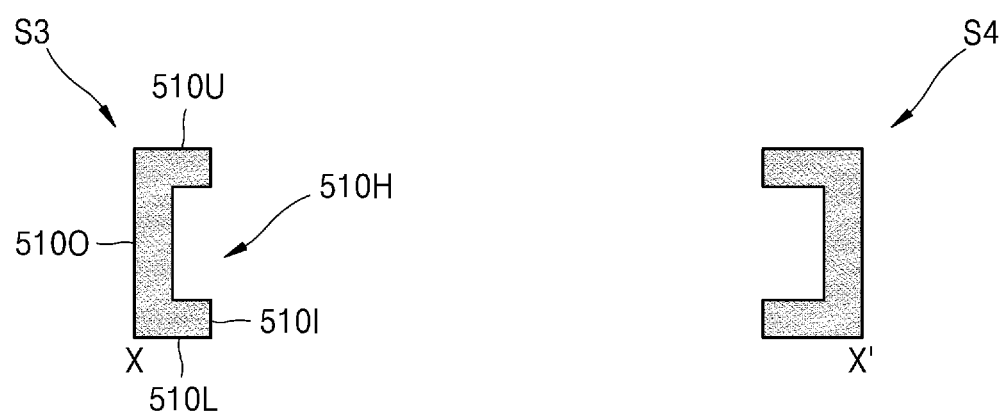
FIG. 21D illustrates cross-sectional views of the lower electrode layer of the semiconductor memory device according to an embodiment.
Figure 21D:
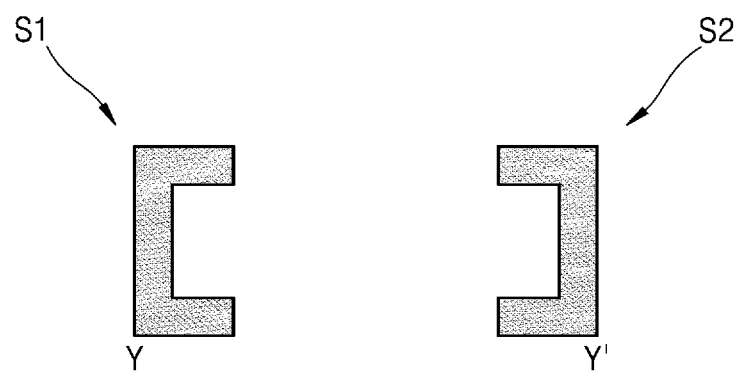

FIG. 21A is a diagram illustrating a semiconductor memory device according to an embodiment; FIG. 21B is a perspective view of a channel layer of the semiconductor memory device according to an embodiment; FIG. 21C is an exploded perspective view illustrating a lower electrode layer of the semiconductor memory device according to an embodiment; and FIG. 21D illustrates cross-sectional views illustrating the lower electrode layer of the semiconductor memory device according to an embodiment. In detail, FIG. 21A is a diagram illustrating a cross-sectional surface corresponding to FIG. 20A, and FIG. 21D illustrates cross-sectional views taken along line X-X' and line Y-Y' of FIG. 20C.

Referring to FIGS. 21A to 21D, a cell connection wiring 810 electrically connecting a bit line BL to a sense amplifier contact SAC and an inter-wiring insulation layer 820 covering a cell stack structure CST and surrounding a cell connection wiring 810 may be formed, thereby forming a semiconductor memory device 1. A cross-sectional view taken along a horizontal-direction line of each of a cell transistor CTR and a cell capacitor CAP in the semiconductor memory device 1 may be substantially the same as FIG. 20C, and thus, will be described below with reference to FIG. 20C.

The cell connection wiring 810 may include metal, conductive metal nitride, conductive metal silicide, or a combination thereof. For example, the cell connection wiring 810 may include W or copper (Cu). For example, the inter-wiring insulation layer 820 may include silicon oxide.

Figure 28:
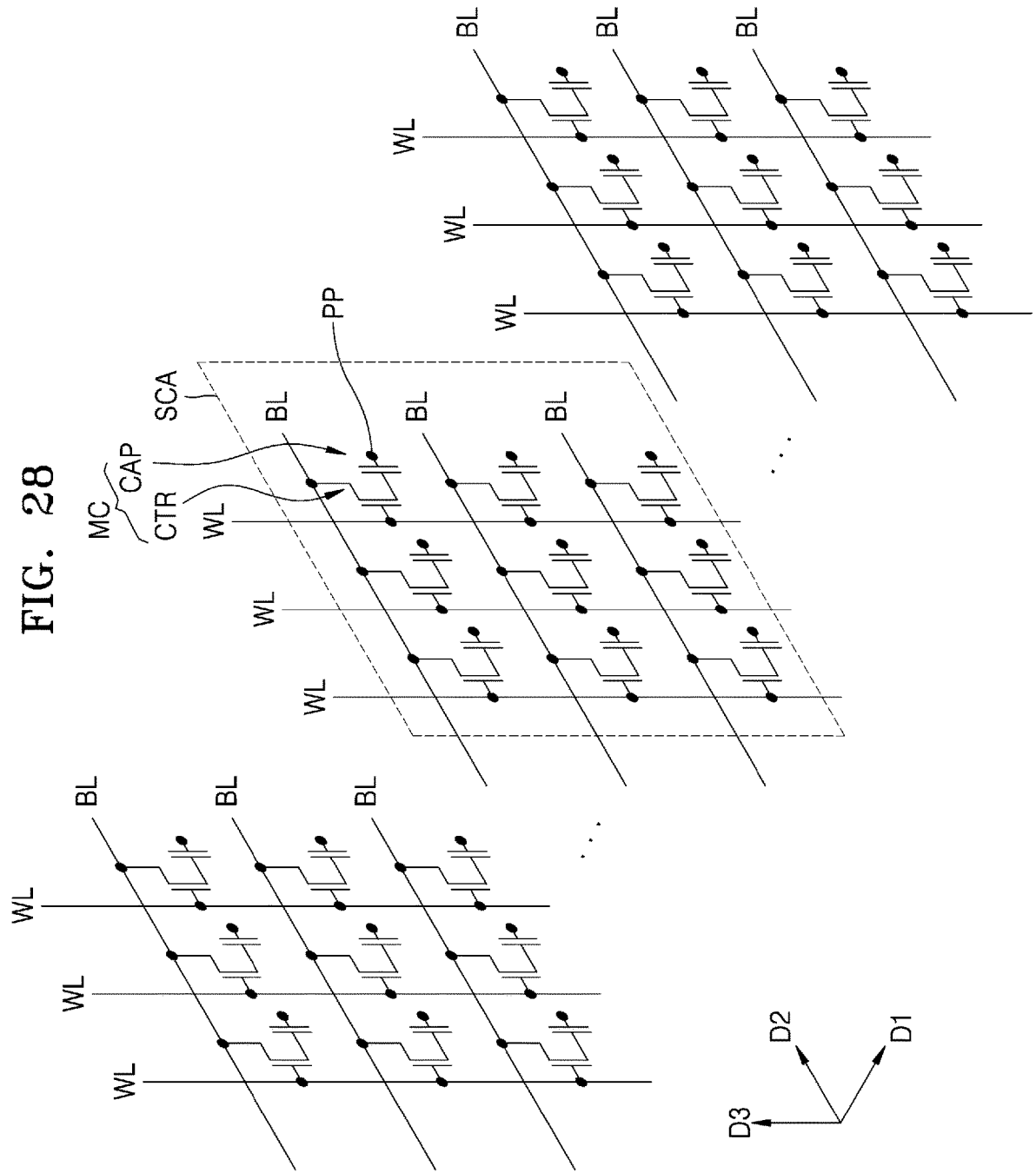
FIG. 28 is a circuit diagram illustrating a cell array of a semiconductor memory device according to an embodiment.

The semiconductor memory device 1 may include a plurality of memory cells (MC of FIG. 28) each configured by the cell transistor CTR and the cell capacitor CAP which are disposed in a first horizontal direction D1 and are connected to each other. A plurality of memory cells MC may be disposed apart from one another in the second horizontal direction D2 and the vertical direction D3 to configure a column, and thus, the plurality of memory cells MC may configure a sub cell array (SCA of FIG. 28). Also, as illustrated in FIG. 28, in the semiconductor memory device 1, a plurality of sub cell arrays SCA may be disposed apart from one another in a second horizontal direction D2.

A word line WL, a portion of a second dielectric layer 520 surrounding the word line WL, a gate dielectric layer, which is a portion of a first dielectric layer 420 surrounding the second dielectric layer 520, a channel layer 410 surrounding a portion of the first dielectric layer 420 and a portion of the second dielectric layer 520, and the bit line BL may configure a cell transistor CTR.

The channel layer 410 configuring each of the plurality of cell transistors CTR may have a horizontal ring shape which has a width of tens of nm and completely surround a first stack hole STH1. For example, the channel layer 410 may have a thickness of tens of nm. That is, the channel layer 410 may have a donut shape where a central hole thereof is a portion of the first stack hole STH1.

A first cell impurity region 432 and a second cell impurity region 434 disposed at both ends of the channel layer 410 may each contact a lower electrode layer 510 and the bit line BL to form an ohmic contact. In some embodiments, the first cell impurity region 432 and the second cell impurity region 434 may be omitted, and the both ends of the channel layer 410 may directly contact the lower electrode layer 510 and the bit line BL.

A plurality of word lines WL may be apart from one another in the second horizontal direction D2 and may extend along the vertical direction D3. The plurality of word lines WL may be filled into a plurality of first stack holes STH1. That is, the plurality of word lines WL may be respectively disposed in first stack holes STH1 which are central holes of channel layers 410 disposed apart from one another in the vertical direction D3. Therefore, the channel layers 410 may be disposed apart from one another in the vertical direction D3 to surround the word line WL. A gate dielectric layer of the cell transistor CTR, configured by a portion of the first dielectric layer 420 and a portion of the second dielectric layer 520, may be disposed between the word line WL and the channel layer 410.

A bottom surface of the word line WL may contact the peripheral circuit wiring 122 electrically connected to a sub word line driver. A horizontal cross-sectional surface of the word line WL may have a circular shape or an oval shape similar to a circular shape.

A plurality of bit lines BL may be apart from one another in the vertical direction D3 and may extend along the second horizontal direction D2. A portion of the conductive barrier layer 710 and a portion of the conductive charge layer 720 filled into a plurality of recess extension spaces ER may configure a plurality of bit lines BL.

That is, the cell transistor CTR may be configured with the word line WL extending in the vertical direction D3, the channel layer 410 having a ring shape surrounding the word line WL, a gate dielectric layer disposed between the word line WL and the channel layer 410 to have a ring shape, and the bit line BL which is disposed at one end of the channel layer 410 in the first horizontal direction D1 to extend in the second horizontal direction D2.

The lower electrode layer 510, the upper electrode layer PP, and a portion of the second dielectric layer 520 disposed between the lower electrode layer 510 and the upper electrode layer PP may configure the cell capacitor CAP. A portion of the second dielectric layer 520, disposed between the lower electrode layer 510 and the upper electrode layer PP to cover the lower electrode layer 510, may configure a capacitor dielectric layer of the cell capacitor CAP.

The lower electrode layer 510 may have a closed ring shape surrounding the second stack hole STH2 and may include a U-shaped vertical cross-sectional surface where an open portion thereof is rotated by 90 degrees to face the second stack hole STH2. The lower electrode layer 510 may have a distorted ring shape where a portion thereof adjacent to the first cell impurity region 432 may be a concave shape.

Specifically, referring to FIGS. 21C and 21D, the lower electrode layer 510 may include a first segment S1 and a second segment S2 opposite from the first segment S1, and a third segment S3 and a fourth segment S4 which respectively connect both ends of the first segment S1 and both ends of the second segment S2. The both ends of the first segment S1 may be connected by one end of the third segment S3 and one end of the fourth segment S4, and the both ends of the second segment S2 may be connected by the other end of the third segment S3 and the other end of the fourth segment S4, whereby the lower electrode layer 510 may have a closed ring shape. The first segment S1 and the second segment S2 may extend in the first horizontal direction D1. In a plan view, the third segment S3 may include a concave portion 510C corresponding to the channel layer 410 and having a convex shape toward the center of the lower electrode layer 510, and the fourth segment S4 may have a convex shape, which is concaving away from the center of the lower electrode layer 510. The concave portion 510C of the lower electrode layer 510 may contact the first cell impurity region 432.

The first segment S1, the second segment S2, the third segment S3, and the fourth segment S4 of the lower electrode layer 510 may have the same vertical height H1. The first segment S1, the second segment S2, and the fourth segment S4 of the lower electrode layer 510 may have approximately the same first horizontal width W1, and the third segment S3 may have a second horizontal width W2 which is less than the first horizontal width W1 at the deepest concave portion. For example, when the second horizontal width W2 is a minimum horizontal width of the lower electrode layer 510, the third segment S3 may have a horizontal width which varies between the first horizontal width W1 and the second horizontal width W2. The vertical height H1 and the first horizontal width W1 of the lower electrode layer 510 may each be tens of nm. In some embodiments, the vertical height H1 and the first horizontal width W1 of the lower electrode layer 510 may have approximately the same or similar values. For example, the vertical height H1 and the first horizontal width W1 of the lower electrode layer 510 may each be about 20 nm.

Also, the lower electrode layer 510 may include an inner surface 510I, an outer surface 510O, a top surface 510U, and a bottom surface 510L. The inner surface 510I may include an electrode hole 510H which extends along a perimeter of the lower electrode layer 510 to have a concave shape. The electrode hole 510H may extend along a perimeter of the upper electrode layer PP and may completely surround the upper electrode layer PP. The outer surface 510O of the lower electrode layer 510 may extend along a perimeter of the lower electrode layer 510 in the vertical direction D3, and the top surface 510U and the bottom surface 510L of the lower electrode layer 510 may extend in the first horizontal direction D1 and the second horizontal direction D2.

A portion of the second dielectric layer 520 functioning as the gate dielectric layer of the cell capacitor CAP may cover the inner surface 510I of the lower electrode layer 510 to cover a portion of the electrode hole 510H. The portion of the second dielectric layer 520 functioning as the gate dielectric layer of the cell capacitor CAP may cover a surface of the lower electrode layer 510, extending along the perimeter and having a U-shape rotated by 90 degrees, and thus, an area of the cell capacitor CAP may increase, thereby increasing a capacity of the cell capacitor CAP.

The upper electrode layer PP may cover the portion of the second dielectric layer 520 functioning as the gate dielectric layer of the cell capacitor CAP. The upper electrode layer PP may include a first portion filled into the second stack hole STH2 and a plurality of second portions filled into a plurality of second extension spaces EH2. The first portion of the upper electrode layer PP may have an oval shape having a major axis extending in the first horizontal direction D1, or a pillar shape which includes a horizontal cross-sectional surface having a corner-rounded rectangular shape having a major axis extending in the first horizontal direction D1 and extends in the vertical direction D3. The plurality of second portions of the upper electrode layer PP may be apart from one another and may each have a ring shape surrounding the first portion of the upper electrode layer PP.

In some embodiments, a bottom surface of the upper electrode layer PP may contact the peripheral circuit wiring 122, which is a ground wiring providing a ground.

The bit line BL may be electrically connected to the sense amplifier contact SAC through the cell connection wiring 810. In FIG. 21A, only the cell connection wiring 810 connecting an uppermost bit line BL to the sense amplifier contact SAC is illustrated. In some embodiments, one end of each of bit lines BL connected to one another in the vertical direction D3 may have a staircase shape in the second horizontal direction D2.

In FIG. 21A, it is illustrated that the cell connection wiring 810 passes through the cell insulation layer 210 covering a top surface of the bit line BL and connects the bit line BL to the sense amplifier contact SAC via the cell stack structure CST, but the embodiment is not limited thereto. In some embodiments, the cell connection wiring 810 may be omitted, and the bit line BL and the sense amplifier contact SAC may be electrically connected to each other through a sense amplifier contact having a shape which extends in the vertical direction D3 so that a bottom surface of the bit line BL is connected to the peripheral circuit wiring 122 electrically connected to a sense amplifier.

The semiconductor memory device 1 according to an embodiment may include a three-dimensional (3D) semiconductor memory device where the plurality of memory cells MC each including the cell transistor CTR and the cell capacitor CAP are stacked in the vertical direction D3, and thus, a memory capacity may increase. Also, the lower electrode layer 510 configuring the cell capacitor CAP and a capacitor dielectric layer may be easily formed, and thus, an area of the cell capacitor CAP may increase. Therefore, a capacity of the cell capacitor CAP needed for each of the memory cells MC included in the semiconductor memory device 1 may be secured.

Also, the channel layer 410 configuring the cell transistor CTR of the semiconductor memory device 1 according to an embodiment may approximately have a constant value without being affected by a vertical level with respect to the substrate 110. Therefore, despite an increase in the number of memory cells MC disposed apart from one another in the vertical direction D3, cell transistors CTR of the memory cells MC may have similar operation characteristics. The semiconductor memory device 1 may reliably operate despite an increase in the number of memory cells MC stacked in the vertical direction D3.

Figure 22:
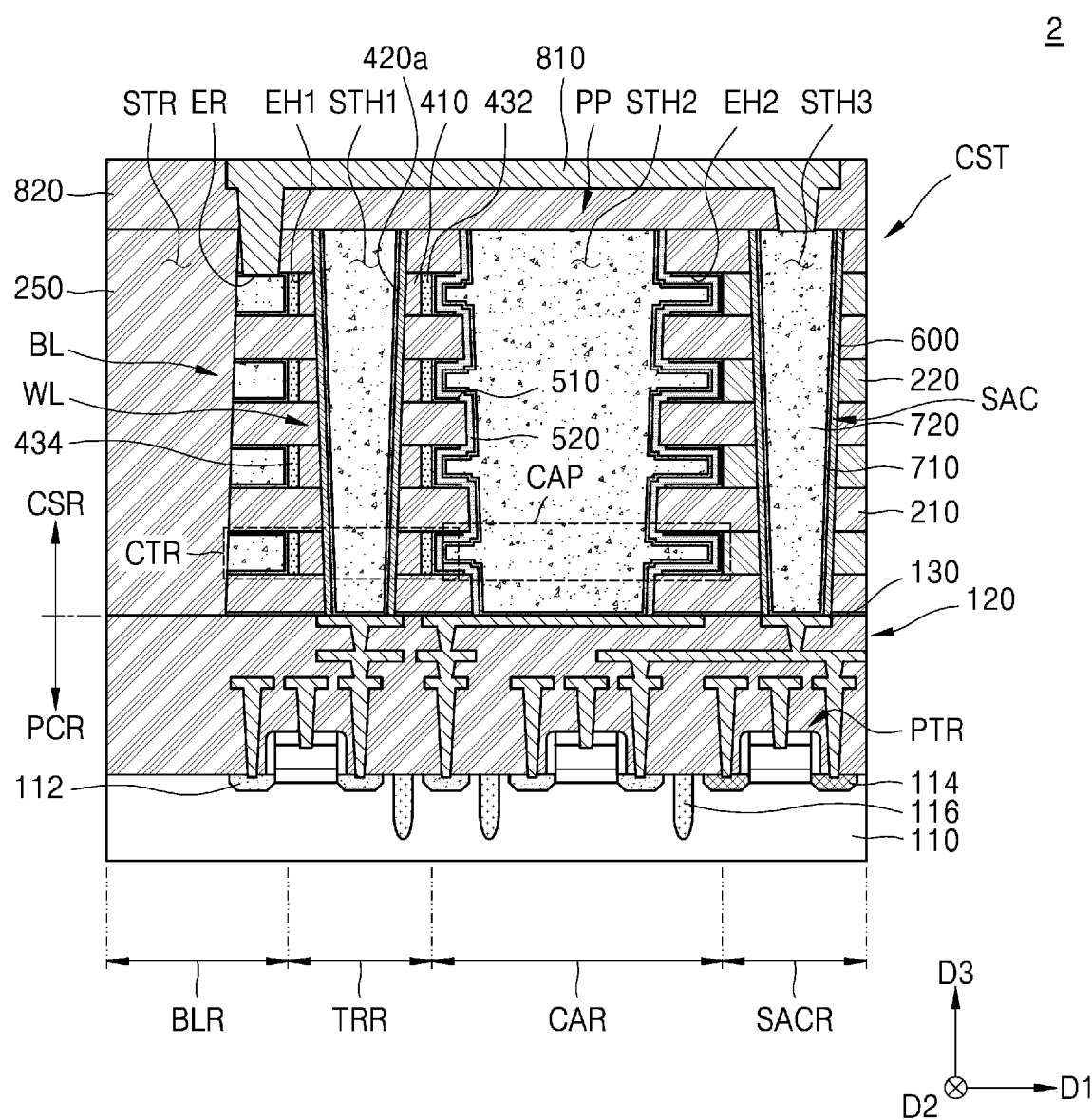
FIG. 22 is a diagram illustrating a semiconductor memory device according to an embodiment.

FIG. 22 is a diagram illustrating a semiconductor memory device 2 according to embodiments. In detail, FIG. 22 is a diagram illustrating a cross-sectional surface corresponding to FIG. 20A. In describing FIG. 22, descriptions which are the same as or similar to descriptions given above with reference to FIGS. 1A to 21D may be omitted.

Referring to FIG. 22, the semiconductor memory device 2 may include a plurality of memory cells (MC of FIG. 28) each including a cell transistor CTR and a cell capacitor CAP which are disposed in a first horizontal direction D1 and are connected to each other. The semiconductor memory device 2 illustrated in FIG. 22 may include a first dielectric layer 420a, instead of the first dielectric layer 420 included in the semiconductor memory device 1 illustrated in FIGS. 21A to 21D.

The first dielectric layer 420a may cover an inner sidewall of a first stack hole STH1. That is, the first dielectric layer 420a may cover a surface of a channel layer 410 and a surface of a cell insulation layer 210, which are exposed through the first stack hole STH1. For example, the first dielectric layer 420a may be formed by a deposition process such as a CVD process, a PECVD process, or an ALD process. The first dielectric layer 420a may include silicon oxide, silicon nitride, a high-k dielectric material, or a combination thereof.

Figure 23A:
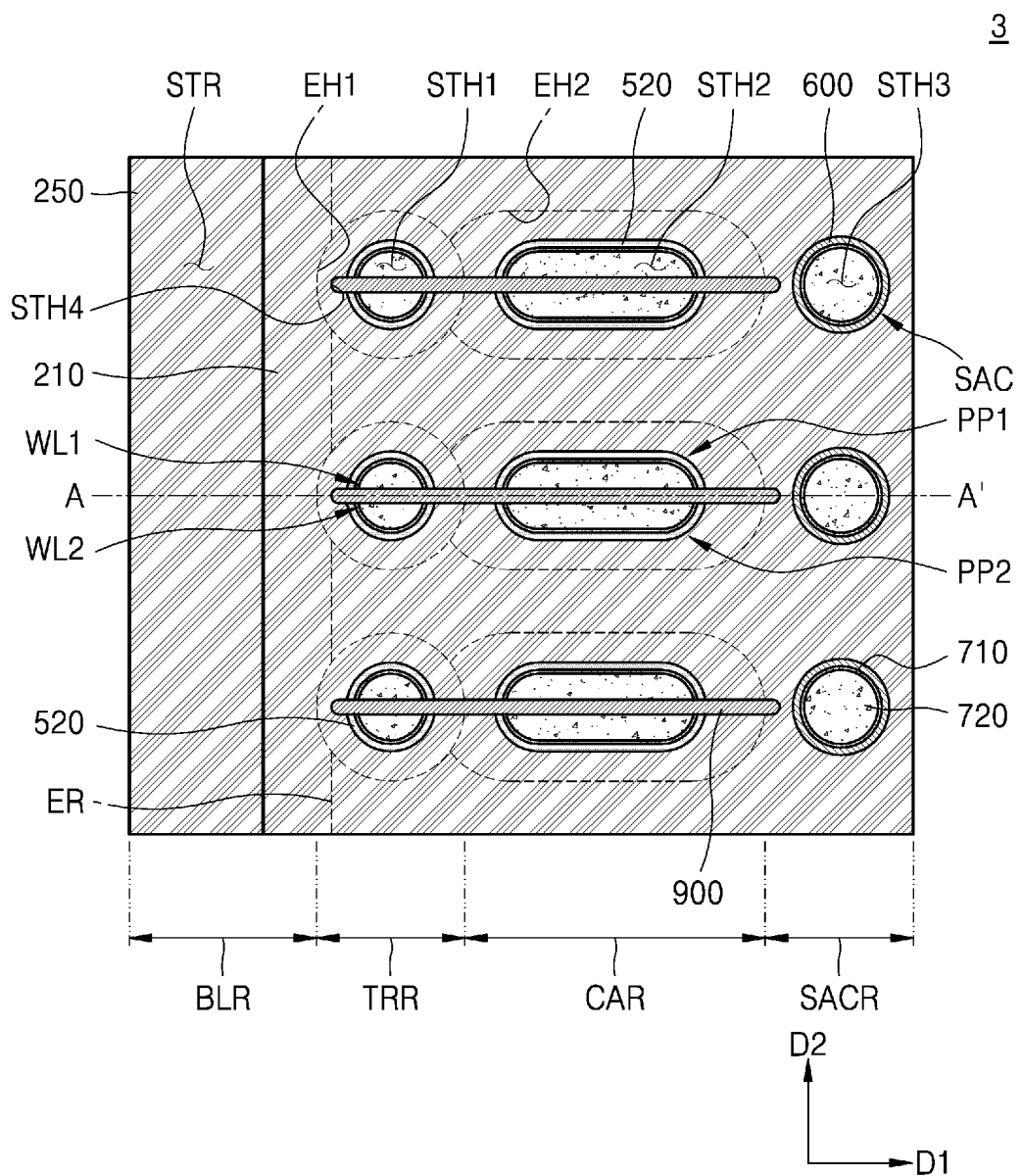
FIGS. 23A and 23B are diagrams illustrating a top view of a semiconductor memory device according to embodiments.
Figure 23B:
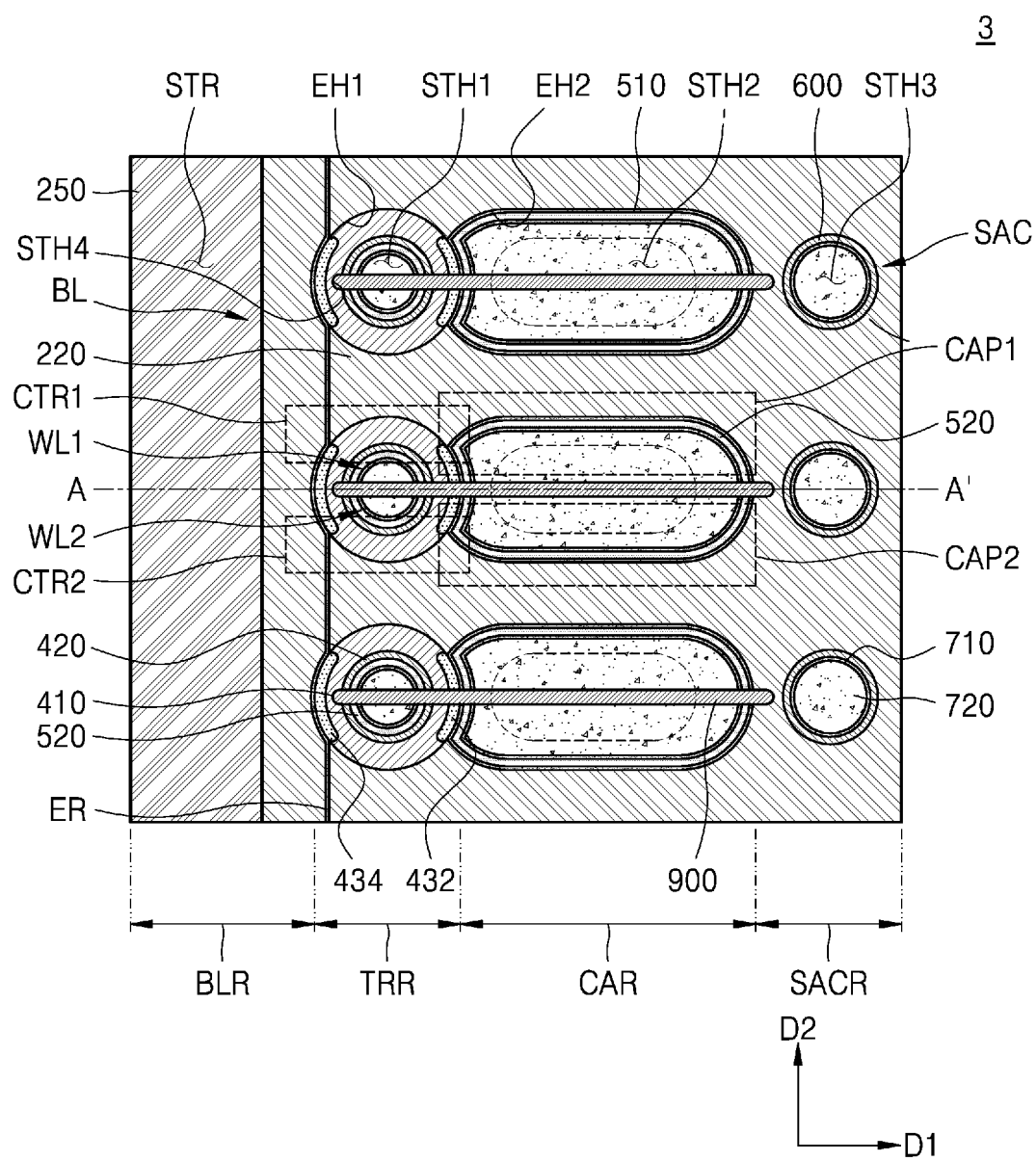

FIGS. 23A and 23B are diagrams illustrating a semiconductor memory device 3 according to embodiments. In detail, FIGS. 23A and 23B are diagrams illustrating cross-sectional surfaces respectively corresponding to FIGS. 20B and 20C. In describing FIGS. 23A and 23B, descriptions which are the same as or similar to descriptions given above with reference to FIGS. 1A to 21D may be omitted.

Referring to FIGS. 23A and 23B, the semiconductor memory device 3 may include an isolation layer 900 which extends in a first horizontal direction D1 between a bit line BL and a sense amplifier contact SAC. In some embodiments, the isolation layer 900 may include an insulating material. For example, the isolation layer 900 may include silicon oxide.

In FIGS. 23A and 23B, it is illustrated that the isolation layer 900 is apart from the bit line BL, but the embodiment is not limited thereto. For example, unless the bit line BL is specifically configured to be isolated, the isolation layer 900 may contact the bit line BL.

The isolation layer 900 may extend in the first horizontal direction D1 across a region between a first word line WL1 and a second word line WL2 and a region between a first upper electrode layer PP1 and a second upper electrode layer PP2. Therefore, the word line WL illustrated in FIGS. 20B and 20C may be divided into the first word line WL1 and the second word line WL2 with the isolation layer 900 therebetween, and the upper electrode layer PP illustrated in FIGS. 20B and 20C may be divided into the first upper electrode layer PP1 and the second upper electrode layer PP2 with the isolation layer 900 therebetween. Also, a lower electrode layer 510 surrounding the upper electrode layer PP illustrated in FIGS. 20B and 20C may be divided into two portions with the isolation layer 900 therebetween.

In some other embodiments, the semiconductor memory device 3 may include a separation space which is disposed in a space with the isolation layer 900 provided therein and is filled with air. That is, a preliminary separation space may be formed, and then, by filling the preliminary separation space with an insulating material, the isolation layer 900 may be formed. Also, after the preliminary separation space is formed, an insulating material may be formed at only an upper portion of the preliminary separation space, and thus, the separation space filled with air may be formed.

One cell transistor CTR illustrated in FIGS. 21A to 21D may be divided into a first cell transistor CTR1 and a second cell transistor CTR2, and one cell capacitor CAP illustrated in FIGS. 21A to 21D may be divided into a first cell capacitor CAP1 and a second cell capacitor CAP2. Therefore, the semiconductor memory device 3 illustrated in FIGS. 23A and 23B may include a plurality of memory cells which correspond to twice the number of memory cells included in the semiconductor memory device 1 illustrated in FIGS. 21A to 21D.

Figure 24A:
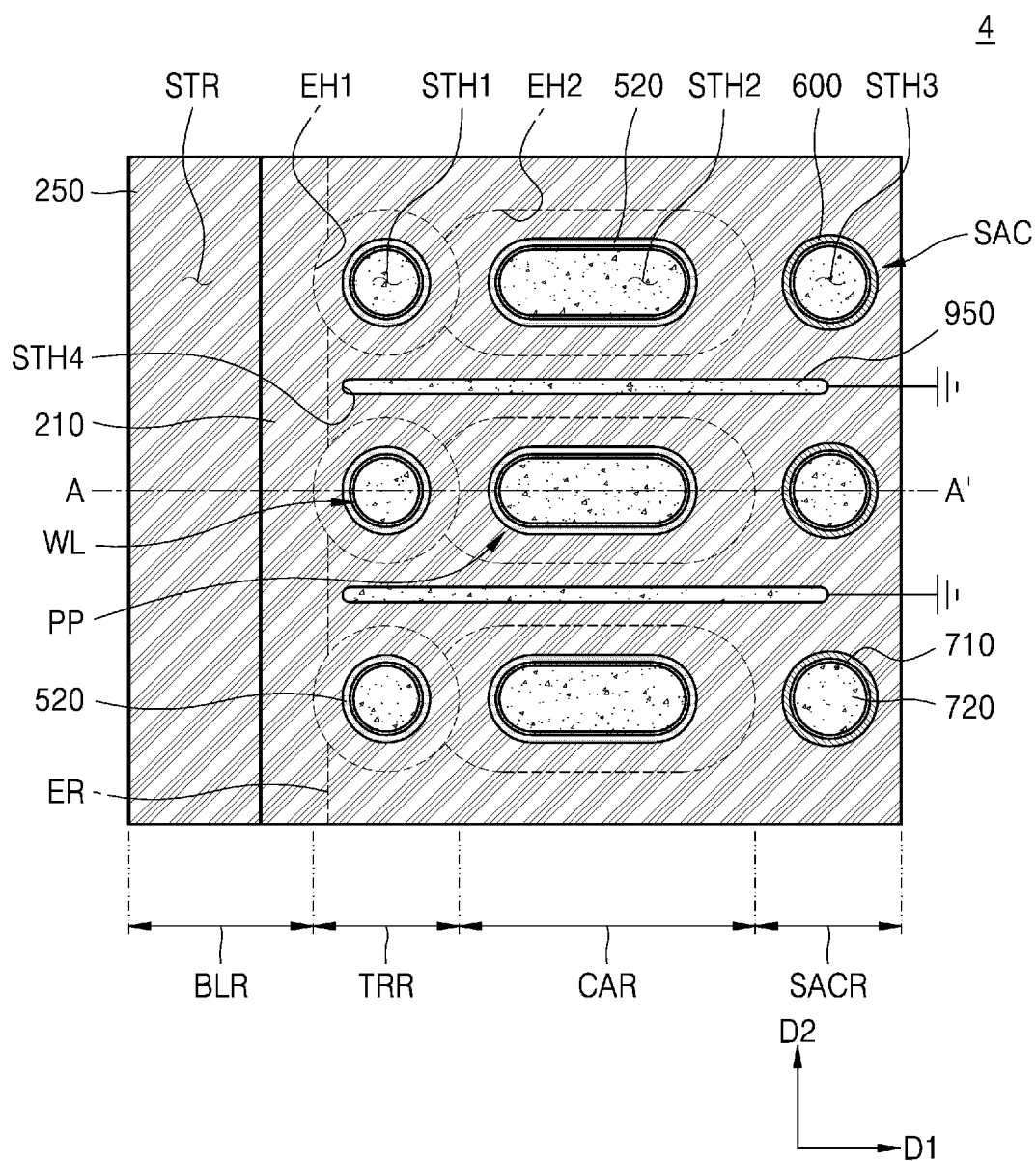
FIGS. 24A and 24B are diagrams illustrating a top view of a semiconductor memory device according to embodiments.
Figure 24B:
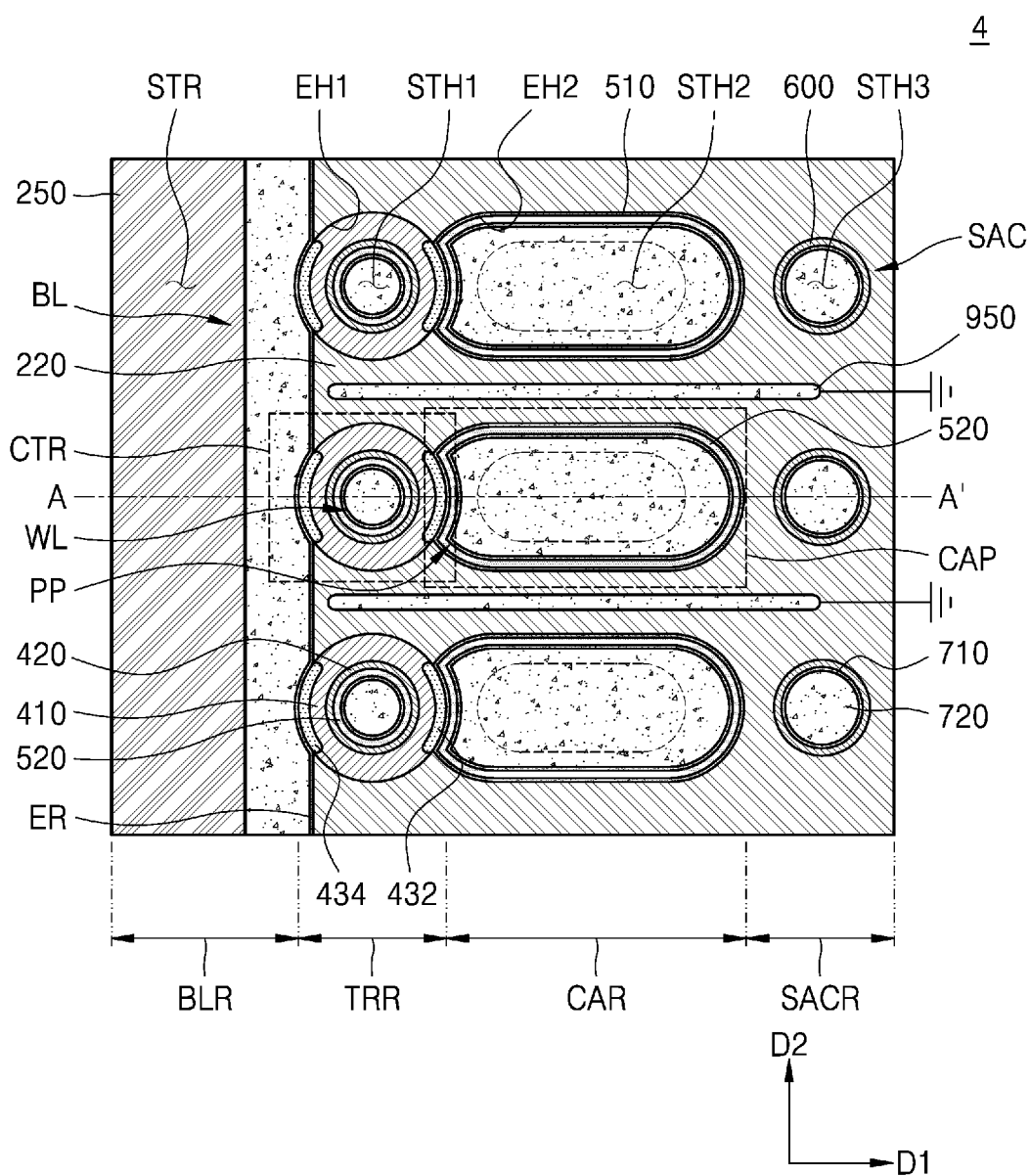

FIGS. 24A and 24B are diagrams illustrating a semiconductor memory device 4 according to embodiments. Specifically, FIGS. 24A and 24B are diagrams illustrating cross-sectional surfaces respectively corresponding to FIGS. 20B and 20C. In describing FIGS. 24A and 24B, descriptions which are the same as or similar to descriptions given above with reference to FIGS. 1A to 21D may be omitted.

Referring to FIGS. 24A and 24B, the semiconductor memory device 4 may include a shielding layer 950 which extends in a first horizontal direction D1 along a region between two cell transistors CTR and two cell capacitors CAP adjacent to one another in a second horizontal direction D2. The shielding layer 950 may shield electromagnetic interference which may occur between two cell transistors CTR and two cell capacitors CAP adjacent to one another.

In some embodiments, the shielding layer 950 may include the same material as that of a bit line BL, a word line WL, or an upper electrode layer PP. For example, a shielding space may be formed through an etching process of forming a stack recess STR, a first stack hole STH1, or a second stack hole STH2, and then, the shielding layer 950 may be formed by filling the shielding space with a conductive barrier layer 710 and a conductive charge layer 720 for forming the bit line BL, the word line WL, or the upper electrode layer PP.

Figure 25A:
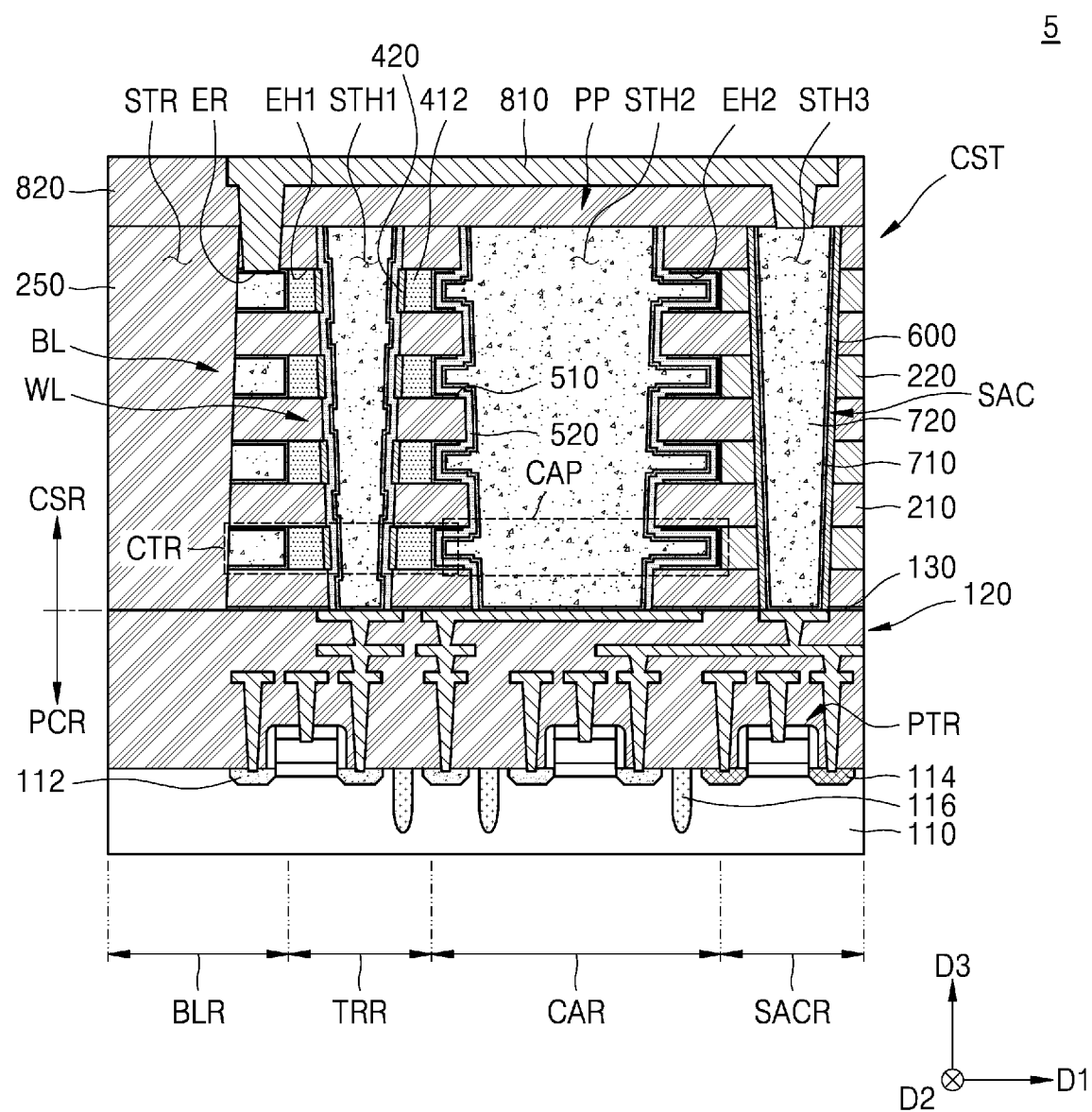
FIG. 25A is a diagram illustrating a semiconductor memory device according to an embodiment.
Figure 25B:
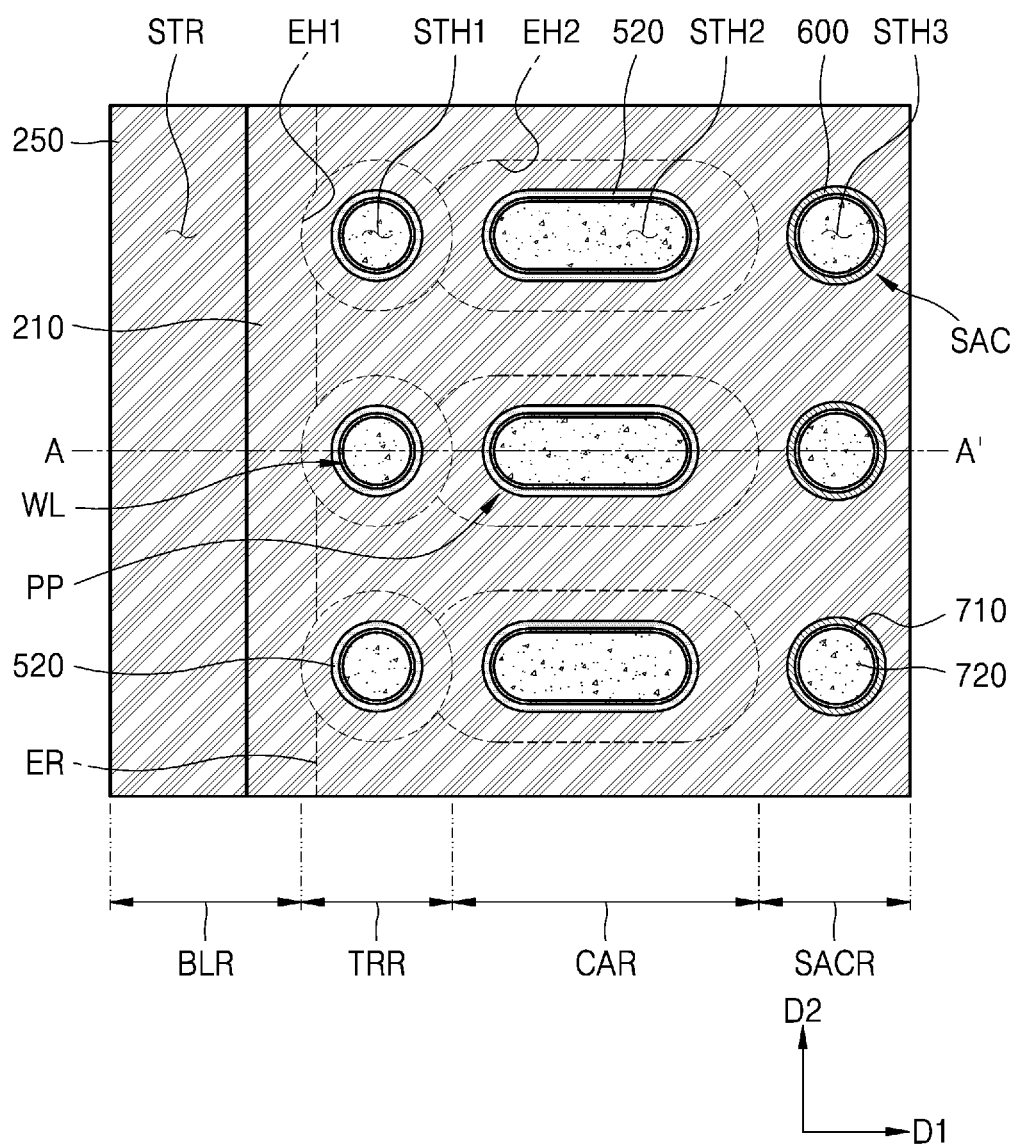
FIG. 25B is a diagram illustrating a top view of the semiconductor memory device according to an embodiment.
Figure 25C:
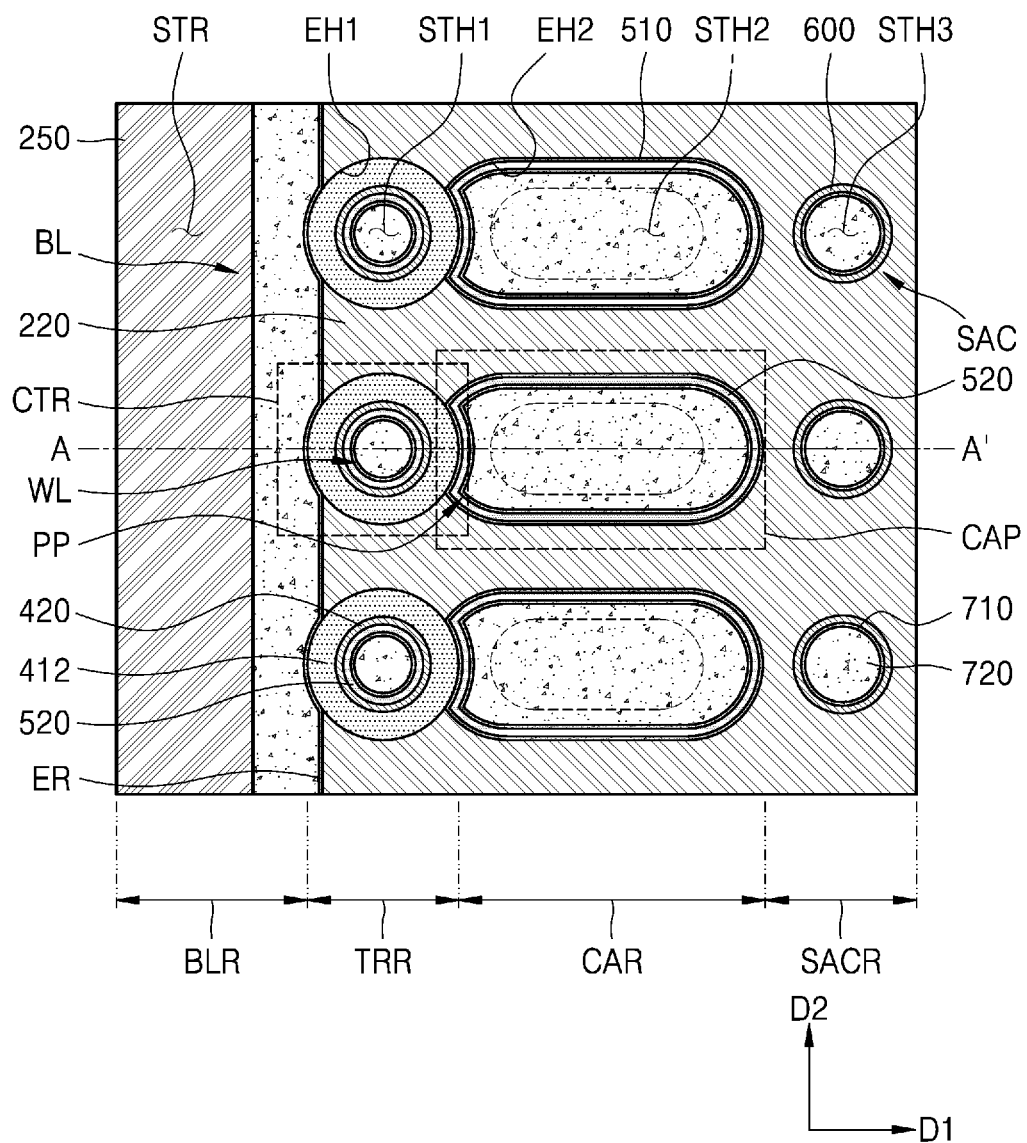
FIG. 25C is a diagram illustrating a top view of the semiconductor memory device according to an embodiment.
Figure 25D:
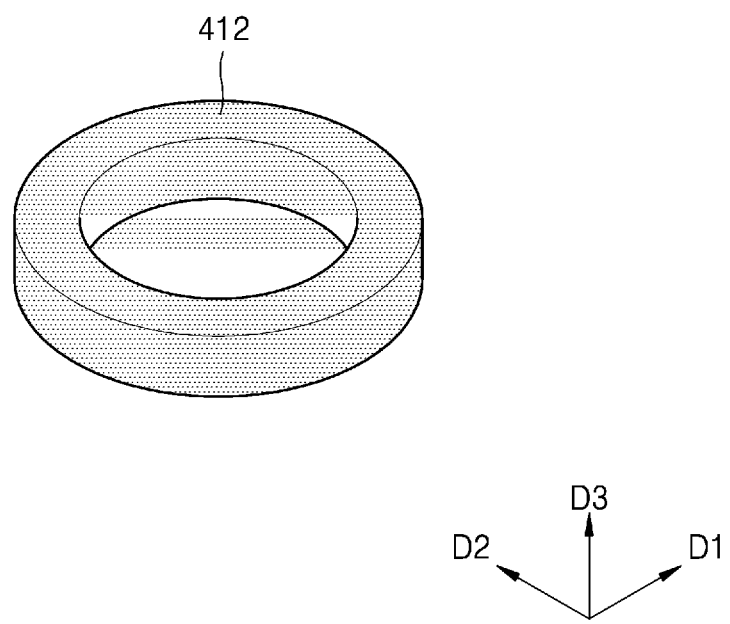
FIG. 25D is a perspective view illustrating a channel layer of the semiconductor memory device according to an embodiment.

FIGS. 25A to 25D are diagrams illustrating a semiconductor memory device 5 according to embodiments. FIG. 25D is a perspective view illustrating a channel layer of the semiconductor memory device 5. In detail, FIG. 25A is a diagram illustrating a cross-sectional surface corresponding to FIG. 20A, and FIGS. 25B and 25C are diagrams respectively illustrating cross-sectional surfaces corresponding to FIGS. 20B and 20C. In describing FIGS. 25A to 25D, descriptions which are the same as or similar to descriptions given above with reference to FIGS. 1A to 21D may be omitted.

Referring to FIGS. 25A to 25D, the semiconductor memory device 5 may include a plurality of memory cells (MC of FIG. 28) each including a cell transistor CTR and a cell capacitor CAP which are disposed in a first horizontal direction D1 and are connected to each other. The semiconductor memory device 5 illustrated in FIGS. 25A to 25D may include a channel layer 412, instead of the channel layer 410 included in the semiconductor memory device 1 illustrated in FIGS. 21A to 21D. The channel layer 412 may include, for example, an oxide semiconductor material. The oxide semiconductor material may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof, where each x, y and z represent a numerical value greater than or equal to 1. The channel layer 412 may include a single layer or a multilayer of oxide semiconductor material. In some embodiments, the channel layer 412 may have band gap energy that is greater than that of silicon. For example, the channel layer 412 may have band gap energy of about 1.5 eV to about 5.6 eV. For example, the channel layer 412 may have optimal channel performance when the channel layer 412 has band gap energy of about 2.0 eV to about 4.0 eV. For example, the channel layer 412 may be polycrystalline or amorphous, but is not limited thereto.

In some embodiments, the semiconductor memory device 5 may not include the first cell impurity region 432 and the second cell impurity region 434 that are illustrated in FIGS. 21A and 21B. That is, in the semiconductor memory device 5, the first cell impurity region 432 and the second cell impurity region 434 may not be formed at both ends of the channel layer 412. Therefore, the channel layer 412 may directly contact a lower electrode layer 510 and a bit line BL respectively disposed at the both ends of the channel layer 412.

For example, the channel layer 412 may have a horizontal closed-ring shape which has a width of tens of nm, and completely surrounds a first stack hole STH1. For example, the channel layer 412 may have a thickness of tens of nm. That is, the channel layer 412 may have a donut shape where a central hole thereof is a portion of the first stack hole STH1.

Figure 26A:
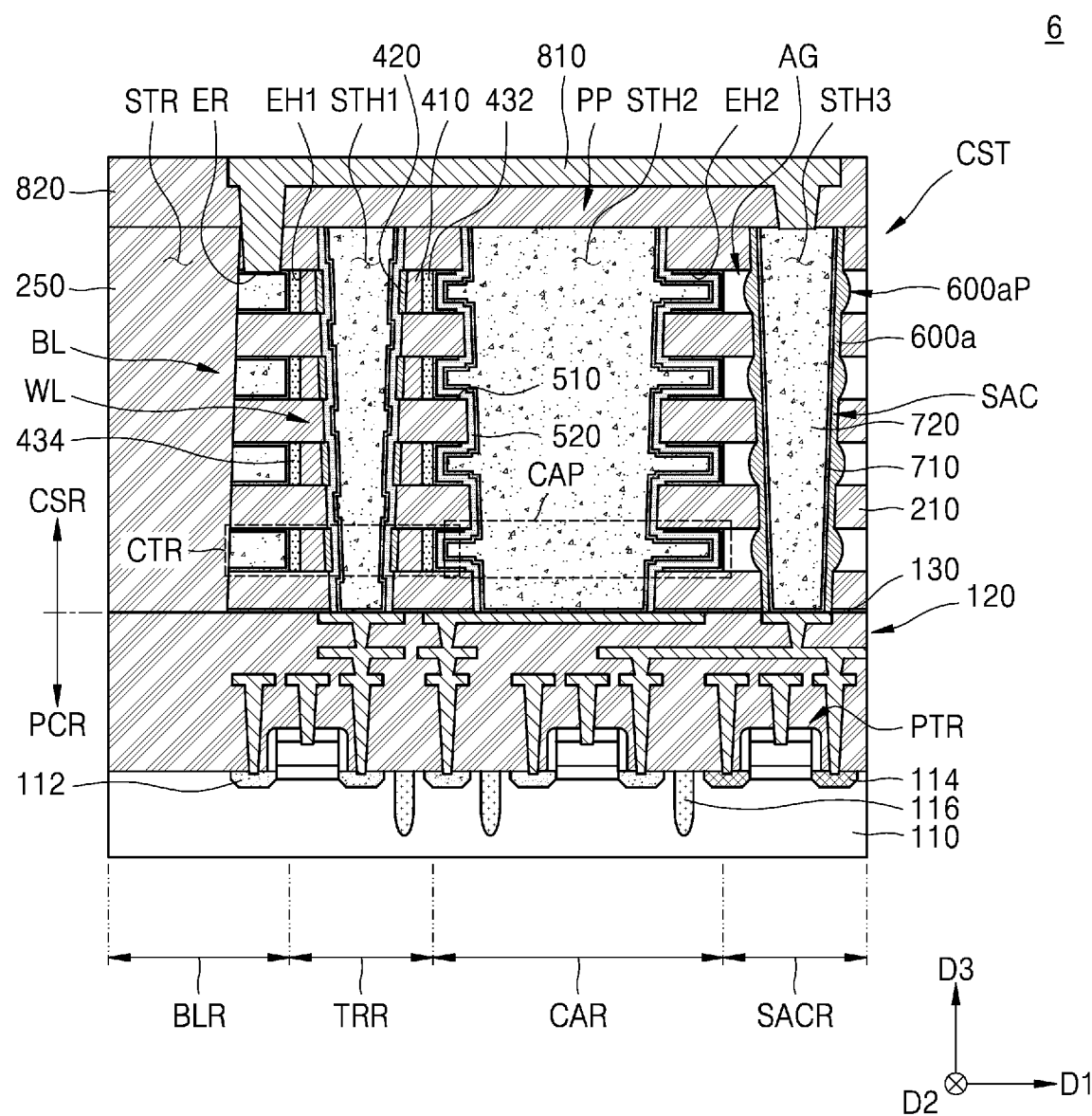
FIGS. 26A and 26B are diagrams illustrating a semiconductor memory device according to embodiments.
Figure 26B:
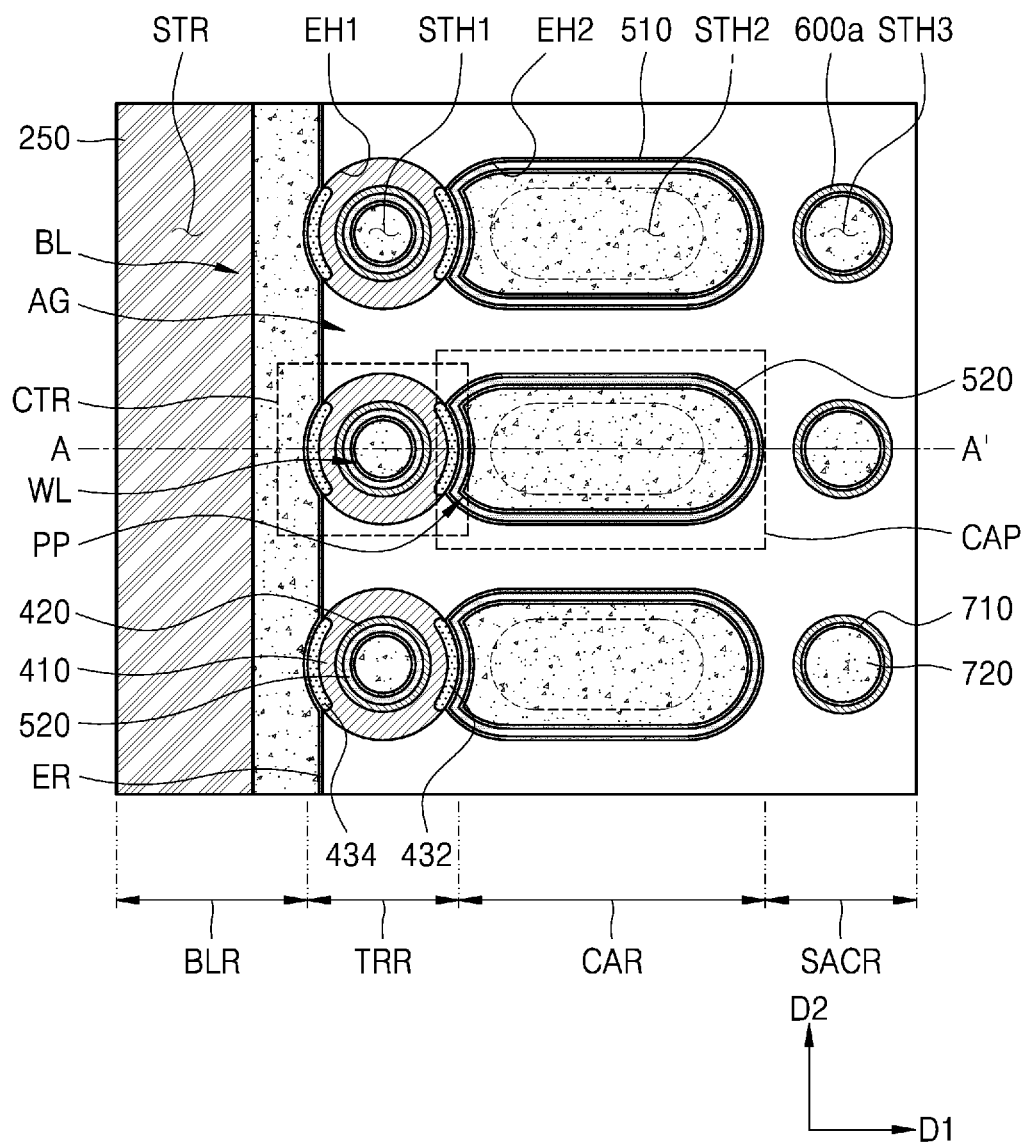

FIGS. 26A and 26B are diagrams illustrating a semiconductor memory device 6 according to embodiments. Specifically, FIG. 26A is a diagram illustrating a cross-sectional surface corresponding to FIG. 20A, and FIG. 26B is a diagram illustrating a cross-sectional surface corresponding to FIG. 20C. In describing FIGS. 26A and 26B, descriptions which are the same as or similar to descriptions given above with reference to FIGS. 1A to 21D may be omitted.

Referring to FIGS. 26A and 26B, the semiconductor memory device 6 may include a plurality of memory cells (MC of FIG. 28), each including a cell transistor CTR and a cell capacitor CAP which are disposed in a first horizontal direction D1 and are connected to each other.

The semiconductor memory device 6 may include an air gap AG, instead of at least a portion of the cell sacrificial layer 220 included in the semiconductor memory device 1 illustrated in FIGS. 21A to 21D. That is, a conductive barrier layer 710 may be formed, and then at least a portion of the cell sacrificial layer 220 illustrated in FIGS. 20A to 20C may be removed. Subsequently, an insulating material may be formed at only an upper portion of a space from which the cell sacrificial layer 220 is removed, thereby forming the air gap AG.

The air gap AG may be disposed between two cell transistors CTR adjacent to each other in a second horizontal direction D2 and/or between two cell capacitors CAP adjacent to each other in the second horizontal direction D2. In some embodiments, a low-k dielectric material may be filled into the space from which the cell sacrificial layer 220 is removed, instead of forming the air gap AG.

The air gap AG may decrease a parasitic capacitance in the semiconductor memory device 6, thereby enhancing an operation speed of the semiconductor memory device 6.

Figure 27A:
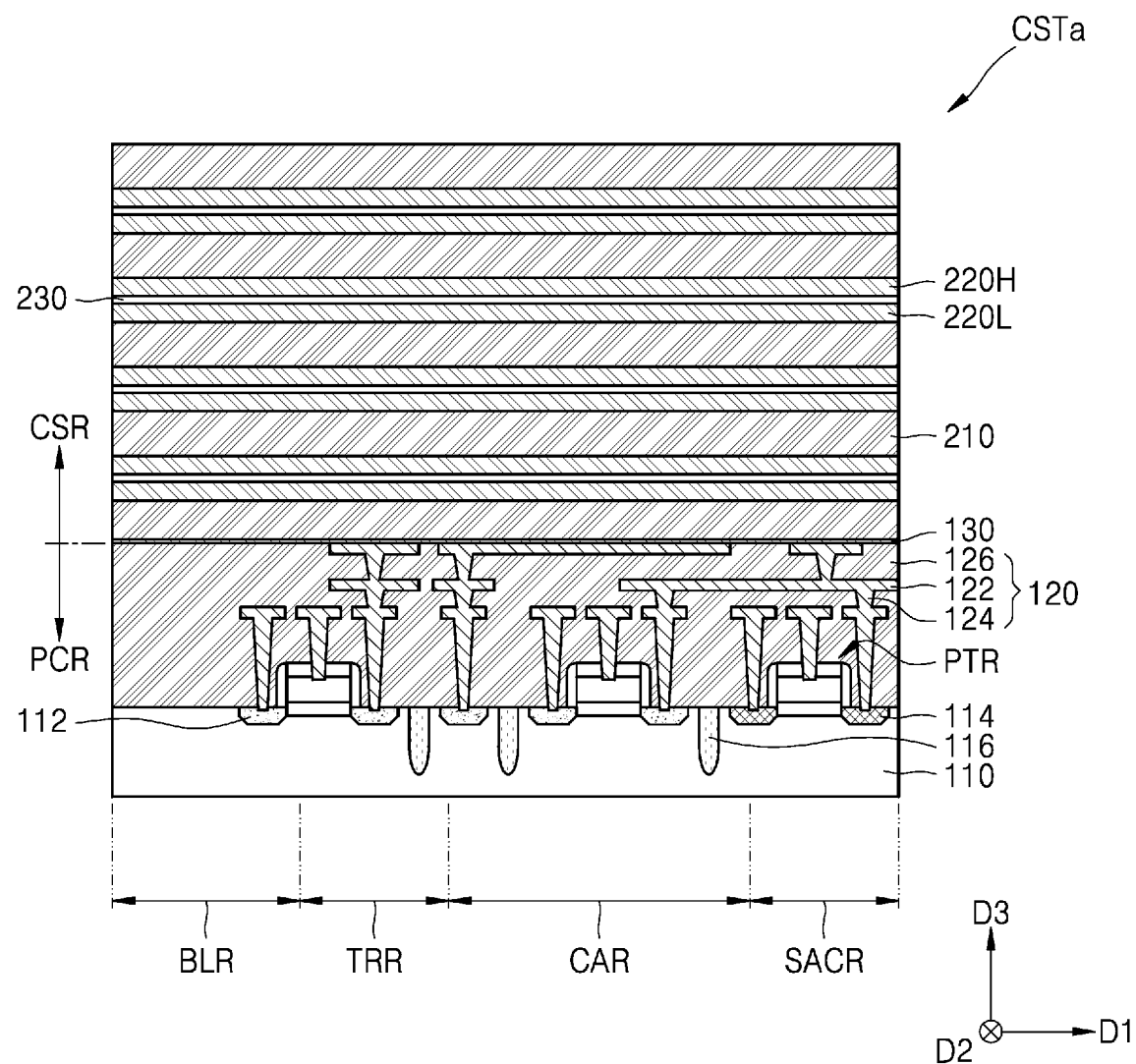
FIG. 27A is a diagram for describing a method of manufacturing a semiconductor memory device according to an embodiment.
Figure 27B:
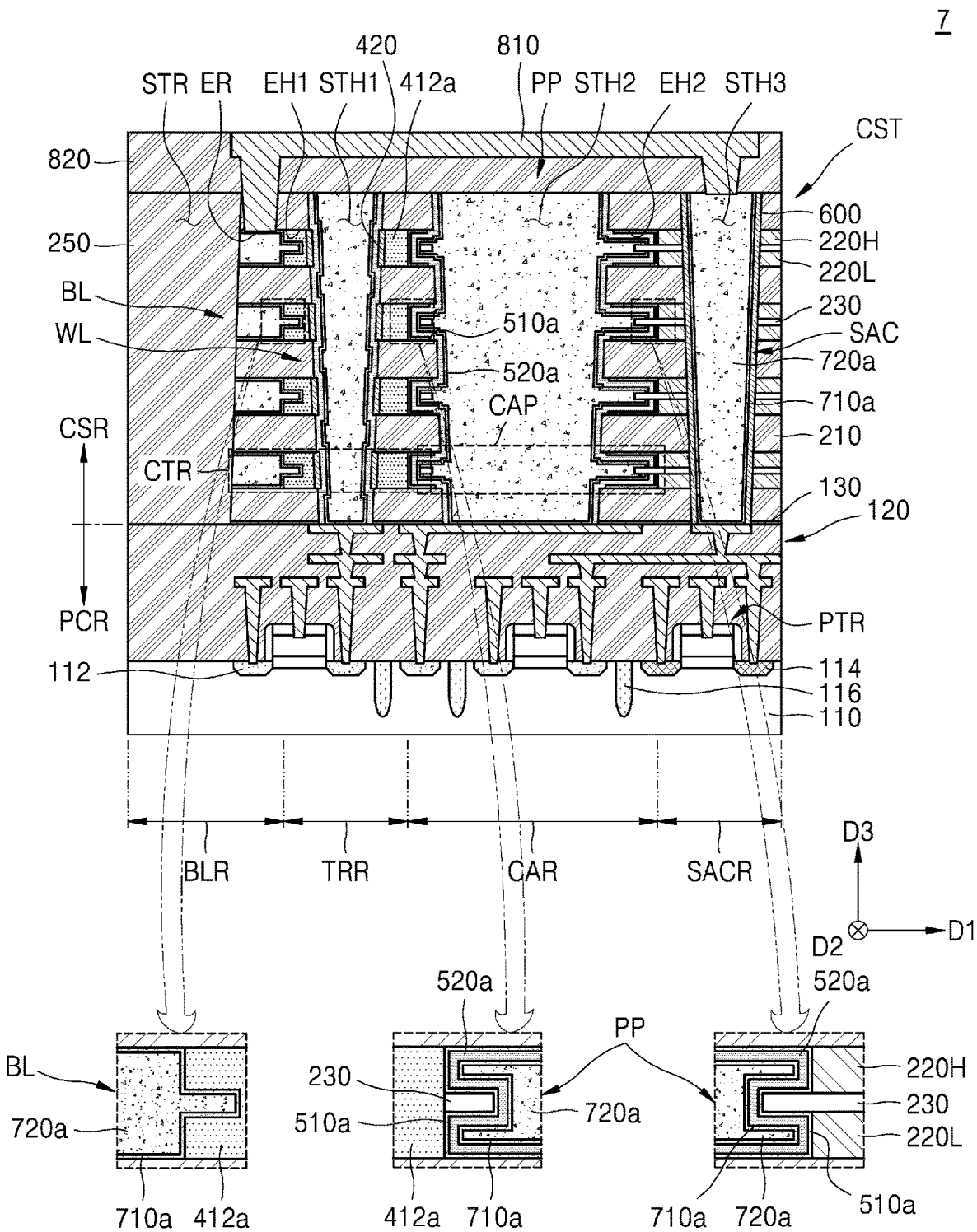
FIG. 27B is a diagram illustrating various parts of a semiconductor memory device according to an embodiment.

FIG. 27A is a diagram for describing a method of manufacturing a semiconductor memory device according to an embodiment; and FIG. 27B is a detailed diagram illustrating a semiconductor memory device 7 according to an embodiment. Specifically, FIG. 27A is a diagram illustrating a cross-sectional surface corresponding to FIG. 1A, and FIG. 27B is a diagram illustrating a cross-sectional surface corresponding to FIG. 21A. In describing FIGS. 27A and 27B, descriptions which are the same as or similar to descriptions given above with reference to FIGS. 25A to 25D may be omitted.

Referring to FIG. 27A, a cell stack structure CSTa including a plurality of cell insulation layers 210, a plurality of first cell sacrificial layers 220L, a plurality of second cell sacrificial layers 230, and a plurality of third cell sacrificial layers 220H alternately stacked one by one may be formed on a substrate 110. The cell stack structure CSTa illustrated in FIG. 27A may be formed by stacking the first cell sacrificial layer 220L, the second cell sacrificial layer 230, and the third cell sacrificial layer 230H, instead of the cell sacrificial layer 220 included in the cell stack structure CST illustrated in FIGS. 1A to 1C.

In some embodiments, the first cell sacrificial layer 220L and the third cell sacrificial layer 220H may include the same material. The second cell sacrificial layer 230 may include a material having an etch selectivity with respect to the first cell sacrificial layer 220L and the third cell sacrificial layer 220H. The second cell sacrificial layer 230 may have a thickness which is relatively thinner than a cell insulation layer 210, the first cell sacrificial layer 220L, and the third cell sacrificial layer 220H. For example, the first cell sacrificial layer 220L and the third cell sacrificial layer 220H may include silicon nitride. For example, the second cell sacrificial layer 230 may include silicon oxynitride or silicon oxide.

Referring to FIG. 27B, the semiconductor memory device 7 may include a plurality of memory cells (MC of FIG. 28) each including a cell transistor CTR and a cell capacitor CAP which are disposed in a first horizontal direction D1 and are connected to each other. The semiconductor memory device 7 may include a lower electrode layer 510a, a second dielectric layer 520a, a conductive barrier layer 710a, and a conductive charge layer 720a, instead of the lower electrode layer 510, the second dielectric layer 520, the conductive barrier layer 710, and the conductive charge layer 720 each included in the semiconductor memory device 6 illustrated in FIGS. 25A to 25D.

A portion of the conductive barrier layer 710a and a portion of the conductive charge layer 720a each filled into a recess extension space ER may configure a bit line BL. The lower electrode layer 510a, the second dielectric layer 520a, and an upper electrode layer PP may configure a cell capacitor CTR.

In a process of forming the first extension space EH1 illustrated in FIGS. 4A to 4C, a speed at which the second cell sacrificial layer 230 is removed may be set to be slower than a speed at which the first cell sacrificial layer 220L and the third cell sacrificial layer 230H are removed, and thus, a portion of the second cell sacrificial layer 230 may remain in the first extension space EH1. Subsequently, in a process of forming the recess extension space ER illustrated in FIGS. 4A to 4C, by removing the remaining portion of the second sacrificial layer 230, the recess extension space ER may extend to an inner portion of the channel layer 410. Also, in a process of forming the second extension space EH2 illustrated in FIGS. 9A to 9C, when a speed at which the second cell sacrificial layer 230 is removed is slower than a speed at which the first cell sacrificial layer 220L and the third cell sacrificial layer 230H are removed, a portion of the second cell sacrificial layer 230 may remain in the second extension space EH2.

The bit line BL may include a protrusion portion which extends to an inner portion of the channel layer 412 contacting the bit line BL. The lower electrode layer 510a, a portion of the second dielectric layer 520a, and the upper electrode layer PP each configuring the cell capacitor CTR may have an M-shape corresponding to a portion of the second sacrificial layer 230 remaining in the second extension space EH2 along an outer surface of the cell capacitor CTR.

Therefore, like FinFETs, the cell transistor CTR included in the semiconductor memory device 7 may be enhanced in operation performance, and a capacity of the cell capacitor CTR may increase.

FIG. 28 is a circuit diagram illustrating a cell array of a semiconductor memory device according to an embodiment.

Referring to FIG. 28, the cell array of the semiconductor memory device according to an embodiment may include a plurality of sub cell arrays SCA. The plurality of sub cell arrays SCA may be arranged in a first horizontal direction D1.

Each of the plurality of sub cell arrays SCA may include a plurality of bit lines BL, a plurality of word lines WL, and a plurality of cell transistors CTR. One cell transistor CTR may be disposed between one word line WL and one bit line BL.

Each of the bit lines BL may include a conductive pattern (for example, a metal line) which is disposed apart from a substrate, on the substrate. The plurality of bit lines BL may extend in a second horizontal direction D2. Bit lines BL of one sub cell array SCA may be apart from one another in a vertical direction D3.

Each of the word lines WL may include a conductive pattern (for example, a metal line) which extends in the vertical direction D3 from the substrate. Word lines WL of one sub cell arrays SCA may be disposed apart from one another in the second horizontal direction D2.

A gate of each of the cell transistors CTR may be connected to a corresponding word line WL, and a source of each cell transistor CTR may be connected to a corresponding bit line BL. Each of the cell transistors CTR may be connected to a cell capacitor CAP. A drain of each cell transistor CTR may be connected to a first electrode of the cell capacitor CAP, and a second electrode of the cell capacitor CAP may be connected to a ground wiring PP.

While the embodiments of the disclosure been particularly shown and described with reference to the accompanying drawings thereof, it will be understood that various changes in form and details may be made therein without departing from the spirit and scope of the following claims.

What is claimed is:

1. A semiconductor memory device comprising:
a word line extending in a vertical direction on a substrate;
a channel layer surrounding the word line to configure a cell transistor and having a horizontal ring shape with a predetermined horizontal width;
a bit line disposed at one end of the channel layer in a first horizontal direction and extending in a second horizontal direction perpendicular to the first horizontal direction; and
a cell capacitor disposed at other end of the channel layer in the first horizontal direction, the cell capacitor including an upper electrode layer extending in the vertical direction, a lower electrode layer surrounding the upper electrode layer, and a capacitor dielectric layer disposed between the upper electrode layer and the lower electrode layer.

2. The semiconductor memory device of claim 1, wherein an inner surface of the lower electrode layer comprises an electrode hole extending along a perimeter of the upper electrode layer and having a concave shape.

3. The semiconductor memory device of claim 1, wherein the lower electrode layer comprises a vertical cross-sectional surface having a U-shape rotated by 90 degrees.

4. The semiconductor memory device of claim 3, wherein a U-shaped open portion of the lower electrode layer faces the upper electrode layer.

5. The semiconductor memory device of claim 1, wherein a horizontal cross-sectional surface of the word line has a circular shape or an oval shape, and the channel layer has a donut shape.

6. The semiconductor memory device of claim 1, wherein the cell transistor comprises a plurality of cell transistors, and the plurality of cell transistors are disposed apart from one another in the vertical direction.

7. The semiconductor memory device of claim 6, wherein the bit line comprises a plurality of bit lines, and the plurality of bit lines are disposed apart from one another in the vertical direction to correspond to the plurality of cell transistors.

8. The semiconductor memory device of claim 6, wherein the upper electrode layer comprises a first portion having an oval shape having a major axis extending in the first horizontal direction or a pillar shape including a horizontal cross-sectional surface having a corner-rounded rectangular shape and extending in the vertical direction, and a plurality of second portions disposed apart from one another in the vertical direction to have a ring shape surrounding the first portion of the upper electrode layer, and
wherein the cell capacitor comprises a plurality of cell capacitors, and the plurality of cell capacitors are disposed apart from one another to correspond to the plurality of second portions of the upper electrode layer.

9. The semiconductor memory device of claim 1, wherein the channel layer comprises a Group IV semiconductor material, a Group III-V compound semiconductor material, an epitaxial semiconductor material, or a semiconductor two-dimensional (2D) material, and
the semiconductor memory device further comprises a first cell impurity region disposed at the one end of the channel layer contacting the bit line and a second cell impurity region disposed at the other end of the channel layer contacting the lower electrode layer.

10. The semiconductor memory device of claim 1, wherein the channel layer comprises an oxide semiconductor material, and the one end and the other end of the channel layer directly contacting the bit line and the lower electrode layer.

11. A semiconductor memory device comprising:
a plurality of word lines disposed apart from one another in a first horizontal direction on a substrate and extending in a vertical direction, each of the plurality of word lines including a horizontal cross-sectional surface having a circular shape or an oval shape;
a plurality of channel layers disposed apart from one another in the vertical direction to respectively surround the plurality of word lines and having a donut shape, the plurality of channel layers configuring a plurality of cell transistors;
a plurality of bit lines respectively disposed at one end of each of the plurality of channel layers in a second horizontal direction perpendicular to the first horizontal direction to form the plurality of cell transistors, and disposed apart from one another in the vertical direction and extending in the first horizontal direction; and
a plurality of cell capacitors respectively disposed at the other ends of the plurality of channel layers in the second horizontal direction, each of the plurality of cell capacitors including an upper electrode layer extending in the vertical direction, a lower electrode layer surrounding the upper electrode layer, and a capacitor dielectric layer disposed between the upper electrode layer and the lower electrode layer.

12. The semiconductor memory device of claim 11, further comprising an isolation layer extending in the second horizontal direction and passing through a plurality of upper electrode layers configuring the plurality of word lines and the plurality of cell capacitors to equally divide each of the plurality of upper electrode layers.

13. The semiconductor memory device of claim 11, further comprising a shielding layer extending in the second horizontal direction along a region between two cell transistors adjacent to each other in the first horizontal direction among the plurality of cell transistors and two cell capacitors adjacent to each other in the first horizontal direction among the plurality of cell capacitors.

14. The semiconductor memory device of claim 11, further comprising an air gap disposed between two cell transistors adjacent to each other in the first horizontal direction among the plurality of cell transistors and two cell capacitors adjacent to each other in the first horizontal direction among the plurality of cell capacitors.

15. The semiconductor memory device of claim 11, wherein the lower electrode layer configuring each of the plurality of cell capacitors has an M-shape along an outer surface of a corresponding cell capacitor.

16. The semiconductor memory device of claim 11, wherein an open portion of the lower electrode layer configuring each of the plurality of cell capacitors comprises a U-shaped vertical cross-sectional surface facing the upper electrode layer and extending to surround the upper electrode layer.

17. The semiconductor memory device of claim 11, wherein the lower electrode layer configuring each of the plurality of cell capacitors comprises a concave portion corresponding to a corresponding channel layer of the plurality of channel layers, and having a shape which is concaving away from a center of the lower electrode layer.

18. The semiconductor memory device of claim 11, further comprising a first dielectric layer and a second dielectric layer disposed sequentially between each of the plurality of channel layers and a corresponding word line of the plurality of word lines to configure a gate dielectric layer of a corresponding cell transistor of the plurality of cell transistors,
wherein a material of the capacitor dielectric layer of each of the plurality of cell capacitors is same as a material of the second dielectric layer.

19. A semiconductor memory device comprising:
a plurality of word lines disposed apart from one another in a first horizontal direction on a substrate and extending in a vertical direction, each of the plurality of word lines including a horizontal cross-sectional surface having a circular shape or an oval shape;
a plurality of channel layers disposed apart from one another in the vertical direction to respectively surround the plurality of word lines and having a horizontal ring shape having a predetermined horizontal width, the plurality of channel layers configuring a plurality of cell transistors and including an oxide semiconductor material;

a plurality of bit lines disposed apart from one another in the vertical direction and extending in the first horizontal direction, and respectively contacting one end of each of the plurality of channel layers in a second horizontal direction perpendicular to the first horizontal direction to configure the plurality of cell transistors; and a plurality of cell capacitors, each including an upper electrode layer extending in the vertical direction, a lower electrode layer surrounding the upper electrode layer and contacting the other ends of the plurality of channel layers in the second horizontal direction, and a capacitor dielectric layer disposed between the upper electrode layer and the lower electrode layer, the lower electrode layer including a U-shaped vertical cross-sectional surface facing the upper electrode layer.

20. The semiconductor memory device of claim 19, wherein the lower electrode layer has a closed ring shape including a first segment and a second segment, each extending in the second horizontal direction, and a third segment configured to connect one end of the first segment to one end of the second segment, and a fourth segment configured to connect another end of the first segment to another end of the second segment, and wherein the third segment comprises a concave portion corresponding to each of the plurality of channel layers and having a shape which is concaving away from a center of the lower electrode layer, and the fourth segment has a convex shape.

* * * * *